(12) United States Patent
Lynch

(10) Patent No.: US 11,857,044 B1
(45) Date of Patent: Jan. 2, 2024

(54) PORTABLE ELECTRONIC DEVICE CASE

(71) Applicant: Pioneer Square Brands, Inc., Seattle, WA (US)

(72) Inventor: Riley Edwin Lynch, Greensboro, NC (US)

(73) Assignee: Pioneer Square Brands, Inc., High Point, NC (US)

(*) Notice: Subject to any disclaimer, the term of this patent is extended or adjusted under 35 U.S.C. 154(b) by 0 days.

(21) Appl. No.: 18/219,051

(22) Filed: Jul. 6, 2023

Related U.S. Application Data

(63) Continuation-in-part of application No. 18/211,743, filed on Jun. 20, 2023.

(51) Int. Cl.
| | | |
|---|---|---|
| *H05K 5/02* | (2006.01) | |
| *A45C 11/00* | (2006.01) | |
| *A45F 5/10* | (2006.01) | |
| *H05K 5/00* | (2006.01) | |

(52) U.S. Cl.
CPC .............. *A45C 11/00* (2013.01); *A45F 5/10* (2013.01); *H05K 5/0013* (2013.01)

(58) Field of Classification Search
CPC .......... A45C 13/1092; A45C 2011/002; A45C 11/00; A45C 2011/001; A45C 13/002; H04B 1/3888; A45F 200/0516; A45F 2200/0525; F16B 21/06; F16B 21/08
See application file for complete search history.

(56) References Cited

U.S. PATENT DOCUMENTS

| | | | | |
|---|---|---|---|---|
| 4,844,645 A | * | 7/1989 | Rasmussen ........... | H05K 5/0013 403/14 |
| 5,048,161 A | * | 9/1991 | Watanabe .............. | H01R 13/73 24/669 |
| 5,708,707 A | * | 1/1998 | Halttunen ........... | B60R 11/0241 379/446 |
| 7,069,063 B2 | * | 6/2006 | Halkosaari .......... | H04M 1/0283 455/575.8 |
| 7,612,997 B1 | * | 11/2009 | Diebel ................ | H04M 1/0262 361/679.41 |
| 8,167,127 B2 | * | 5/2012 | Martin ................... | G11B 31/00 206/320 |
| 9,185,953 B2 | * | 11/2015 | Whitten ................... | B62J 11/00 |
| 9,319,501 B2 | * | 4/2016 | Huang ................ | H04M 1/0283 |
| 9,356,267 B1 | * | 5/2016 | To ......................... | H01M 50/24 |
| 2012/0309475 A1 | * | 12/2012 | Johnson ................. | H04M 1/17 455/575.8 |

* cited by examiner

Primary Examiner — Adam J Waggenspack
(74) Attorney, Agent, or Firm — Grandview Law

(57) ABSTRACT

Systems involve implementations such as a first case assembly including a first side wall, a second side wall extending perpendicular to the first side wall, a third side wall extending perpendicular to the first side wall, and an edge extending parallel to the first side wall; and a second case assembly including a first side wall, a second side wall extending perpendicular to the first side wall, a third side wall extending perpendicular to the first side wall, and an edge extending parallel to the first side wall; wherein the first case assembly is couplable with the second case assembly, and wherein the edge of the first case assembly being adjacent to the edge of the second case assembly when the first case assembly is coupled with the second case assembly. Other aspects are described in the claims, drawings, and text forming a part of the present disclosure.

20 Claims, 71 Drawing Sheets

1

PORTABLE ELECTRONIC DEVICE CASE

SUMMARY

In one or more aspects a system for a portable electronic computing device including (I) a first case assembly including (A) a first side wall, (B) a second side wall extending perpendicular to the first side wall, (C) a third side wall extending perpendicular to the first side wall, and (D) an edge extending parallel to the first side wall; and (II) a second case assembly including (A) a first side wall, (B) a second side wall extending perpendicular to the first side wall, (C) a third side wall extending perpendicular to the first side wall, and (D) an edge extending parallel to the first side wall; wherein the first case assembly is couplable with the second case assembly, and wherein the edge of the first case assembly being adjacent to the edge of the second case assembly when the first case assembly is coupled with the second case assembly. Wherein the first case assembly being a main assembly, and wherein the second case assembly being a cap assembly. Wherein the edge of the first case assembly being spaced from the first side wall along at least a portion of the second side wall, and wherein the edge of the first case assembly being spaced from the first side wall along at least a portion of the third side wall. Wherein the second case assembly further includes a tab member, the tab member extending away from the edge of the second case assembly and extending away from the first side wall of the second case assembly. Wherein the first case assembly further includes an aperture, the aperture being sized, shaped, and positioned to receive at least a portion of the tab member of the second case assembly when the first case assembly and the second case assembly are coupled together. Wherein the tab member of the second case assembly includes a raised portion, and wherein the aperture of the first case assembly being sized shaped and positioned to engage with the raised portion of the tab member of the second case assembly when the first case assembly and the second case assembly are coupled together. Wherein the tab member of the second case assembly includes a depression positioned closer from the edge of the second case assembly than the raised portion of the second case assembly is positioned from the edge of the second case assembly. Wherein a first portion of the raised portion of the tab member of the second case assembly that is closer to the depression is more raised than a second portion of the raised portion farther from the depression. Wherein the raised portion of the tab assembly includes a tapered surface. Wherein the tab member of the second case assembly includes a tab body and at least one semi-flexible protrusion extending from the tab body, and wherein the aperture of the first case assembly being sized shaped and positioned to engage with the at least one semi-flexible protrusion of the second case assembly when the first case assembly and the second case assembly are coupled together. Wherein the edge of the second case assembly includes at least one aperture, wherein the edge of the first case assembly includes at least one protrusion, and wherein the at least one aperture of the edge of the second case assembly being engaged with the at least one protrusion of the edge of the first case assembly when the first case assembly is coupled with the second case assembly. Wherein the second side wall of the first case assembly includes at least one groove, wherein the third side wall of the first case assembly includes at least one groove, wherein the second side wall of the second case assembly includes at least one protrusion, wherein the third side wall of the second case assembly includes at least one protrusion, and wherein the at least one groove of the second side wall of the first case assembly engages with the at least one protrusion of the second side wall of the second case assembly when the first case assembly is coupled with the second case assembly, and wherein the at least one groove of the third side wall of the first case assembly engages with the at least one protrusion of the third side wall of the second case assembly when the first case assembly is coupled with the second case assembly. Wherein the second side wall of the first case assembly includes at least one elongated groove extending along the second side wall to receive at least a portion of the portable electronic device, wherein the third side wall of the first case assembly includes at least one elongated groove extending along the third side wall to receive at least a portion of the portable electronic device, wherein the second side wall of the second case assembly includes at least one elongated groove extending along the second side wall to receive at least a portion of the portable electronic device, and wherein the third side wall of the second case assembly includes at least one elongated groove extending along the third side wall to receive at least a portion of the portable electronic device.

In one or more aspects a system for a portable electronic computing device including (I) a first rectangularly-shaped case assembly including an opening with an edge, an end wall with at least one groove, a first side wall with at least one groove, and a second side wall with at least one groove, wherein the end wall, the first side wall, and the second side wall couplable with the first portion of the rectangularly-shaped portable electronic device; and (II) a first rectangularly-shaped case assembly including an opening with an edge, an end wall with at least one groove, a first side wall with at least one groove, and a second side wall with at least one groove, wherein the end wall, the first side wall, and the second side wall couplable with the first portion of the rectangularly-shaped portable electronic device; wherein the first case assembly is couplable with the second case assembly, and wherein the edge of the first case assembly being adjacent to the edge of the second case assembly when the first case assembly is coupled with the second case assembly. Wherein the second case assembly further includes a tab member, the tab member extending away from the edge of the second case assembly and extending away from the first side wall of the second case assembly, and wherein the first case assembly further includes an aperture, the aperture being sized, shaped, and positioned to receive at least a portion of the tab member of the second case assembly when the first case assembly and the second case assembly are coupled together. Wherein the tab member of the second case assembly includes a raised portion, and wherein the aperture of the first case assembly being sized shaped and positioned to engage with the raised portion of the tab member of the second case assembly when the first case assembly and the second case assembly are coupled together.

In one or more aspects a system for a portable electronic computing device including (I) a first case assembly including an end wall with first and second ends, first and second side walls extending from the first and second ends of the end wall respectively; and (II) a second case assembly including an end wall with first and second ends, first and second side walls extending from the first and second ends of the end wall respectively, wherein the first case assembly being couplable with the second case assembly, and wherein the first side wall of the first case assembly being coupled with the first side wall of the second case assembly and the second side wall of the first case assembly being coupled with the second side wall of the second case assembly is coupled with the second case assembly. Wherein the second case assembly further includes a tab member, the tab member extending away from the edge of the second case assembly and extending away from the first side wall of the second case assembly; and wherein the first case assembly further includes an aperture, the aperture being sized, shaped, and positioned to receive at least a portion of the tab member of the second case assembly when the first case assembly and the second case assembly are coupled together. Wherein the tab member of the second case assembly includes a tab body and at least one semi-flexible protrusion extending from the tab body, and wherein the aperture of the first case assembly being sized shaped and positioned to engage with the at least one semi-flexible protrusion of the second case assembly when the first case assembly and the second case assembly are coupled together.

In addition to the foregoing, other aspects are described in the claims, drawings, and text forming a part of the disclosure set forth herein. Various other aspects are set forth and described in the teachings such as text (e.g., claims and/or detailed description) and/or drawings of the present disclosure. The foregoing is a summary and thus may contain simplifications, generalizations, inclusions, or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

For a more complete understanding of implementations, reference now is made to the following descriptions taken in connection with the accompanying drawings. The use of the same symbols in different drawings typically indicates similar or identical items, unless context dictates otherwise.

With reference now to the figures, shown are one or more examples of Handle System for Portable Electronic Device Case, articles of manufacture, compositions of matter for same that may provide context, for instance, in introducing one or more processes and/or devices described herein.

DETAILED DESCRIPTION

Figure 1:
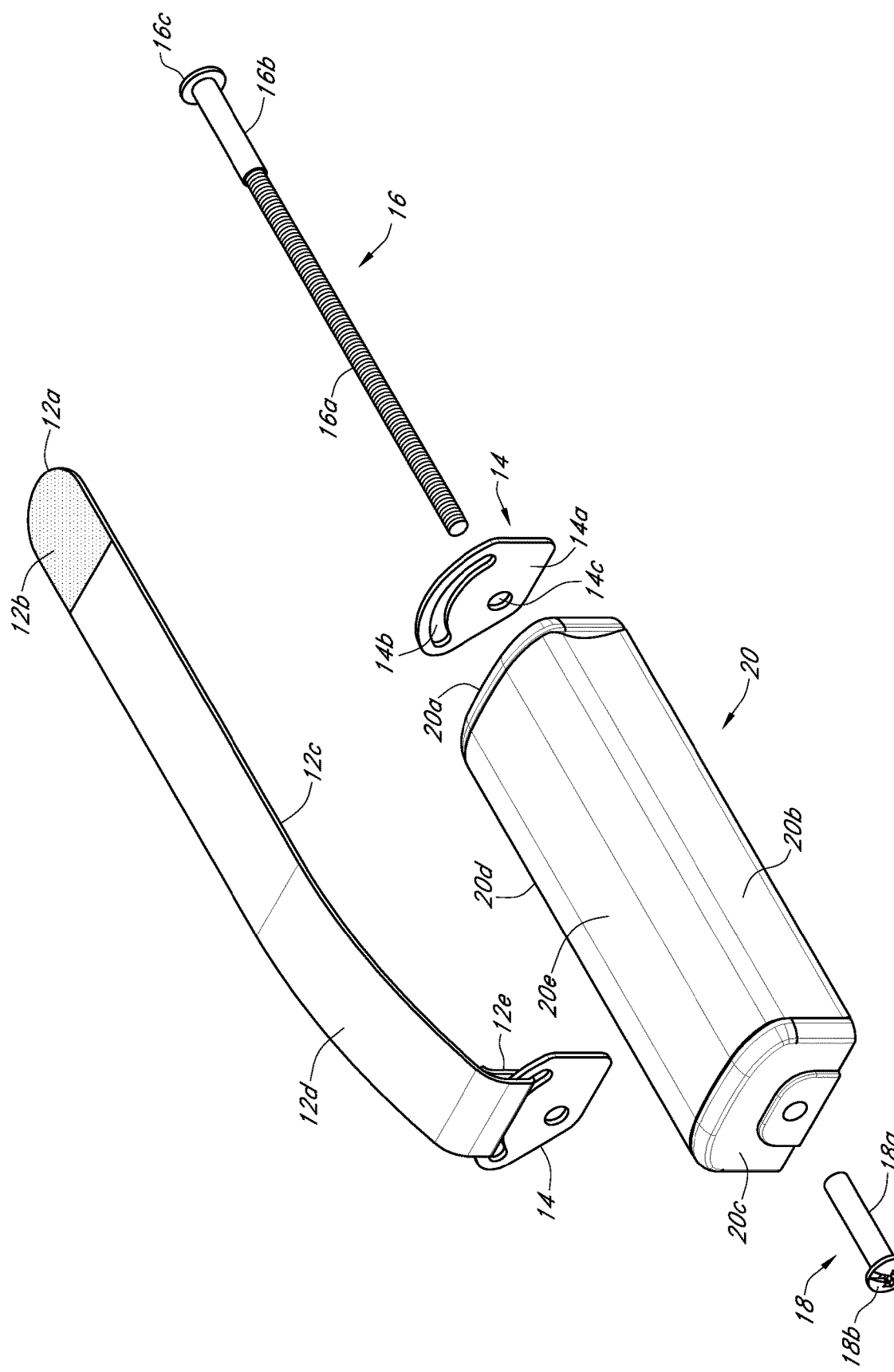
FIG. 1 is an exploded perspective view of a handle assembly.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here.

Turning to FIG. 1, depicted therein is an exploded perspective view of handle assembly 10. Depicted implementation of handle assembly 10 is shown to include elongated strap assembly 12, bracket assembly 14, pin member 16, pin member 18, and bar member 20.

Depicted implementation of elongated strap assembly 12 is shown to include tip end portion 12a, first material portion 12b, second material portion 12c, edge portion 12d, and stitched end portion 12e. In implementations first material portion 12b and second material portion 12c are made from hook and loop material couplable with each other, respectively, or loop and hook material couplable with each other, respectively.

Depicted implementation of bracket assembly 14 is shown to include main portion 14a, curvilinear slot 14b, and aperture 14c. Depicted implementation of pin member 16 is shown to include rod portion 16a, collar portion 16b, and head portion 16c.

Depicted implementation of pin member 18 is shown to include rod portion 18a, and head portion 18b. In implementations pin member 16 is couplable with pin member 18. In implementations aperture 14c of bracket assembly 14 is shaped and sized to receive pin member 16 and pin member 18.

Depicted implementation of bar member 20 is shown to include end portion 20a, elongated side portion 20b, end portion 20c, elongated side portion 20d, and elongated top portion 20e. In implementations end portion 20a and end portion 20c can be positioned at least two inches from one another. In implementations elongated side portion 20b and elongated side portion 20d can be positioned at least one inch from one another.

Figure 2:
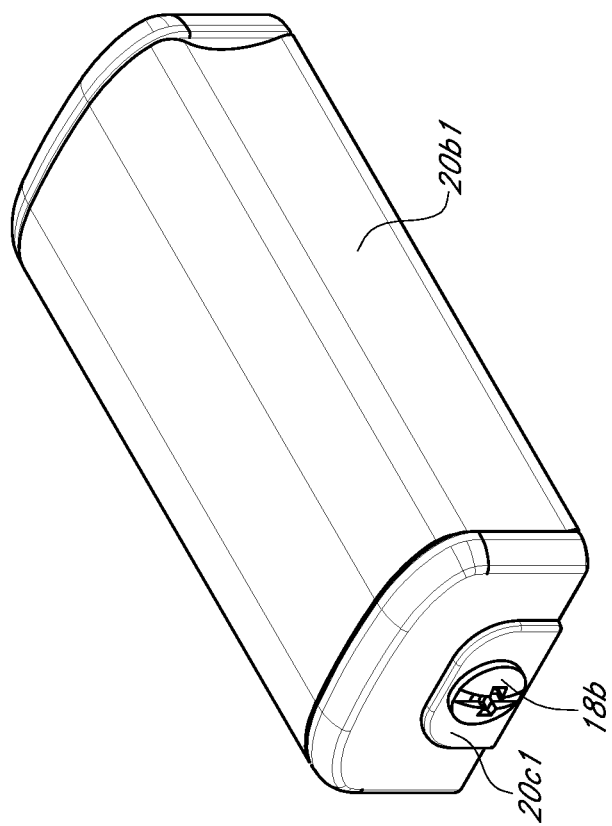
FIG. 2 is a top-perspective view of a handle member of the handle assembly of FIG. 1.

Turning to FIG. 2, depicted therein is a top-perspective view of bar member 20 of handle assembly 10. Depicted implementation of bar member 20 is shown to include elongated groove portion 20b1, and raised portion 20c1.

Figure 3:
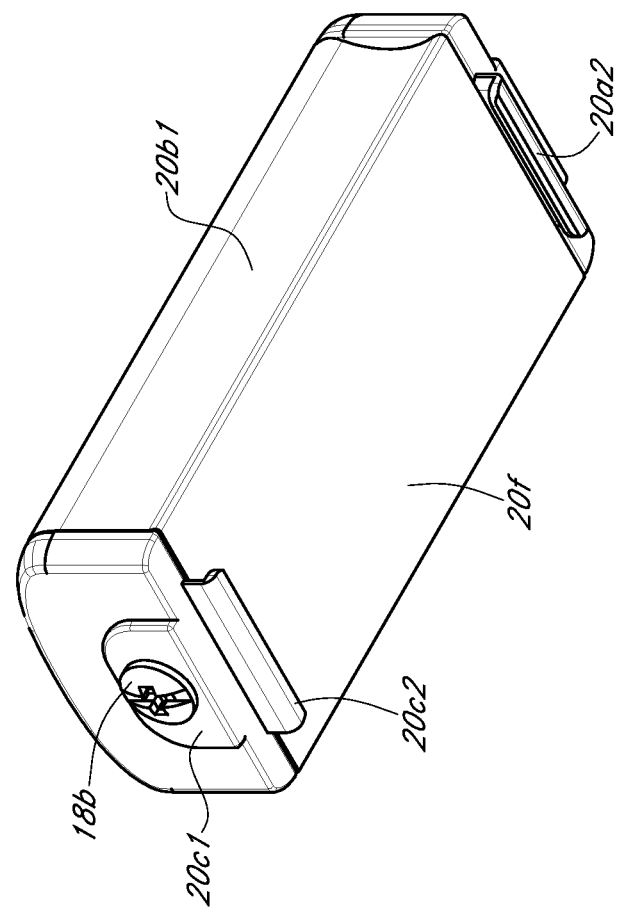
FIG. 3 is a bottom-perspective view of the handle member of FIG. 2.

Turning to FIG. 3, depicted therein is a bottom-perspective view of bar member 20. Depicted implementation of bar member 20 is shown to include clip portion 20a2, clip portion 20c2, and elongated bottom portion 20f. As shown, elongated side portion 20b, and elongated side portion 20d extend between elongated top portion 20e and elongated bottom portion 20f. As shown, clip portion 20a2 and clip portion 20c2 extend away from elongated bottom portion 20f.

Figure 4:
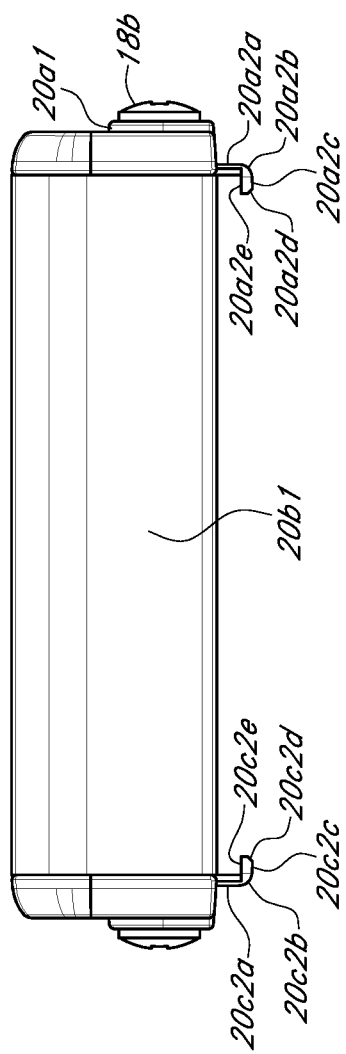
FIG. 4 is a side-elevational view of the handle member of FIG. 2.

Turning to FIG. 4, depicted therein is a side-elevational view of bar member 20. Depicted implementation of bar member 20 is shown to include raised portion 20a1, and clip portion 20a2 includes leg portion 20a2a, corner 20a2b, lower surface 20a2c, and tapered portion 20a2d, and inner portion 20a2e that are shown to be in an L-shape. Depicted implementation of clip portion 20c2 of bar member 20 is shown to include leg portion 20c2a, corner 20c2b, lower surface 20c2c, tapered portion 20c2d, and inner portion 20c2e.

Figure 5:
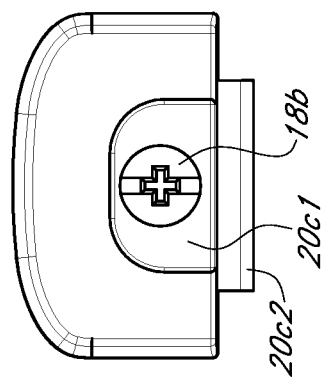
FIG. 5 is an end-elevational view of the handle member of FIG. 2.

Turning to FIG. 5, depicted therein is an end-elevational view of bar member 20.

Figure 6:
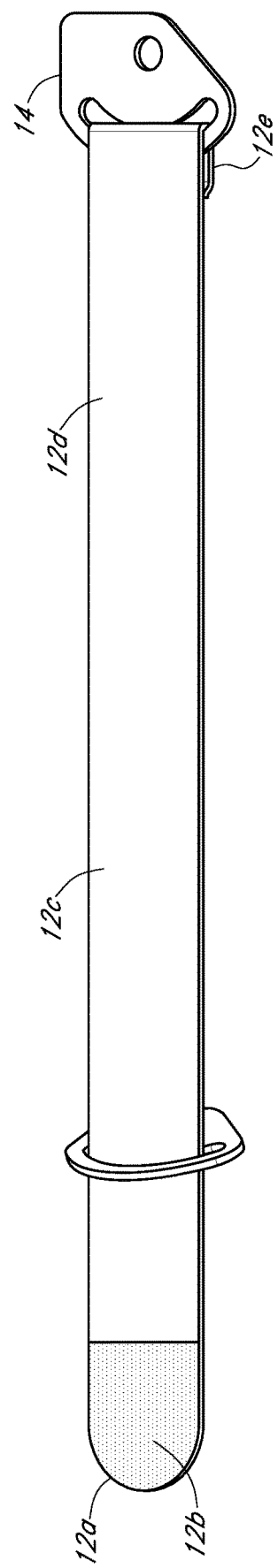
FIG. 6 is a perspective view of a portion of the strap assembly being coupled with a bracket assembly of the handle assembly of FIG. 1.

Turning to FIG. 6, depicted therein is a perspective view of a portion of elongated strap assembly 12 coupled with bracket assembly 14.

Figure 7:
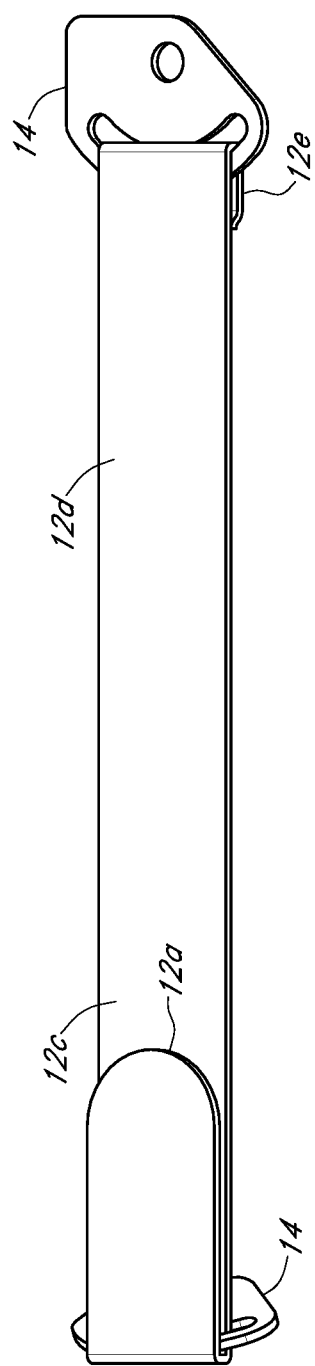
FIG. 7 is a plan view of a portion of the strap assembly of FIG. 6 coupled with the bracket assembly of FIG. 6.

Turning to FIG. 7, depicted therein is a plan view of a portion of elongated strap assembly 12 coupled with bracket assembly 14.

Figure 8:
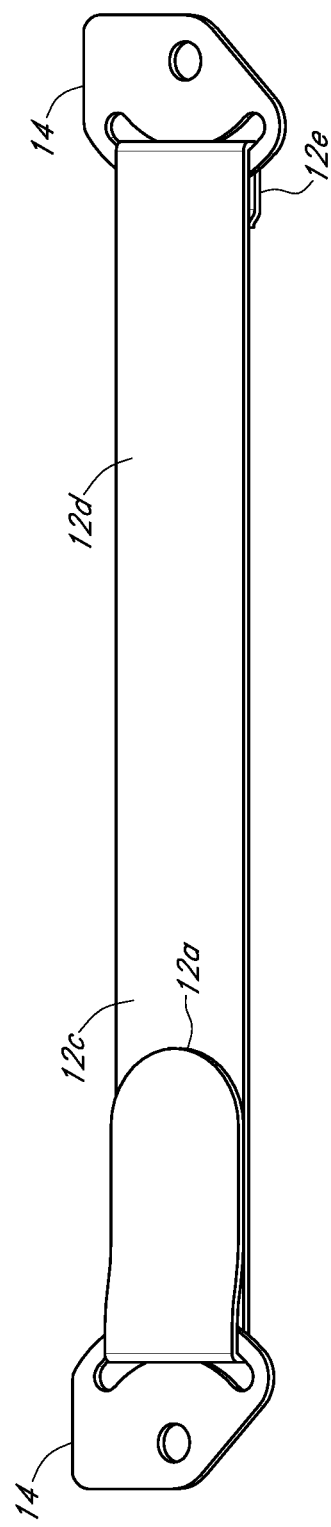
FIG. 8 is a plan view of the strap assembly coupled with the bracket assembly of FIG. 6.

Turning to FIG. 8, depicted therein is a plan view of elongated strap assembly 12 coupled with bracket assembly 14.

Figure 9:
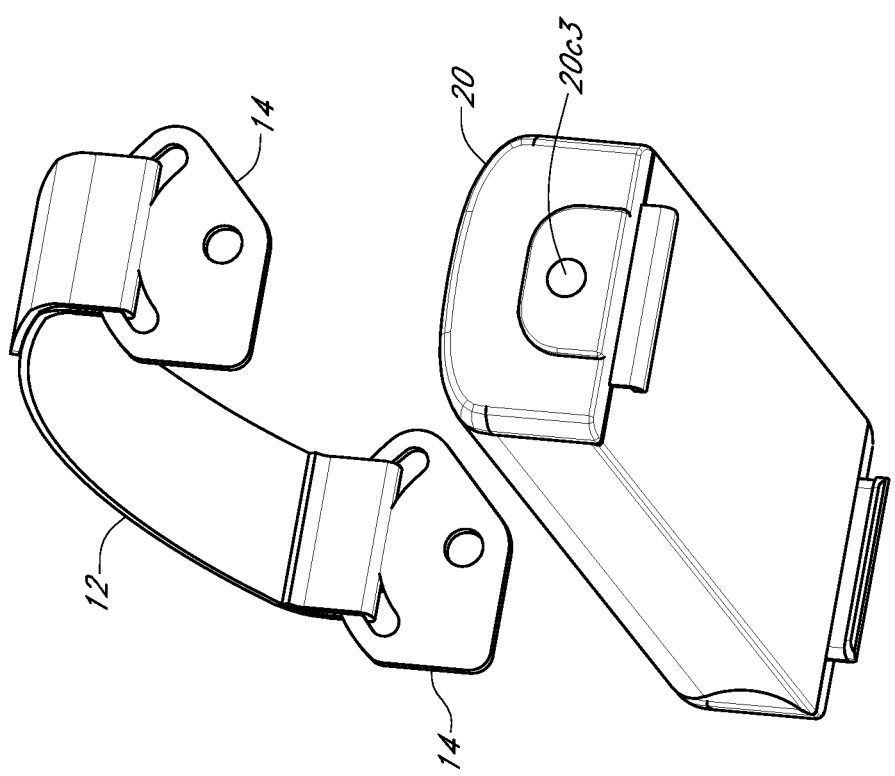
FIG. 9 is a perspective view of portions of the handle member of FIG. 2 and the strap assembly coupled with the bracket assembly of FIG. 6.

Turning to FIG. 9, depicted therein is a perspective view of portions of bar member 20 and elongated strap assembly 12 coupled with bracket assembly 14. Depicted implementation of bar member 20 is shown to include aperture 20c3.

Figure 10:
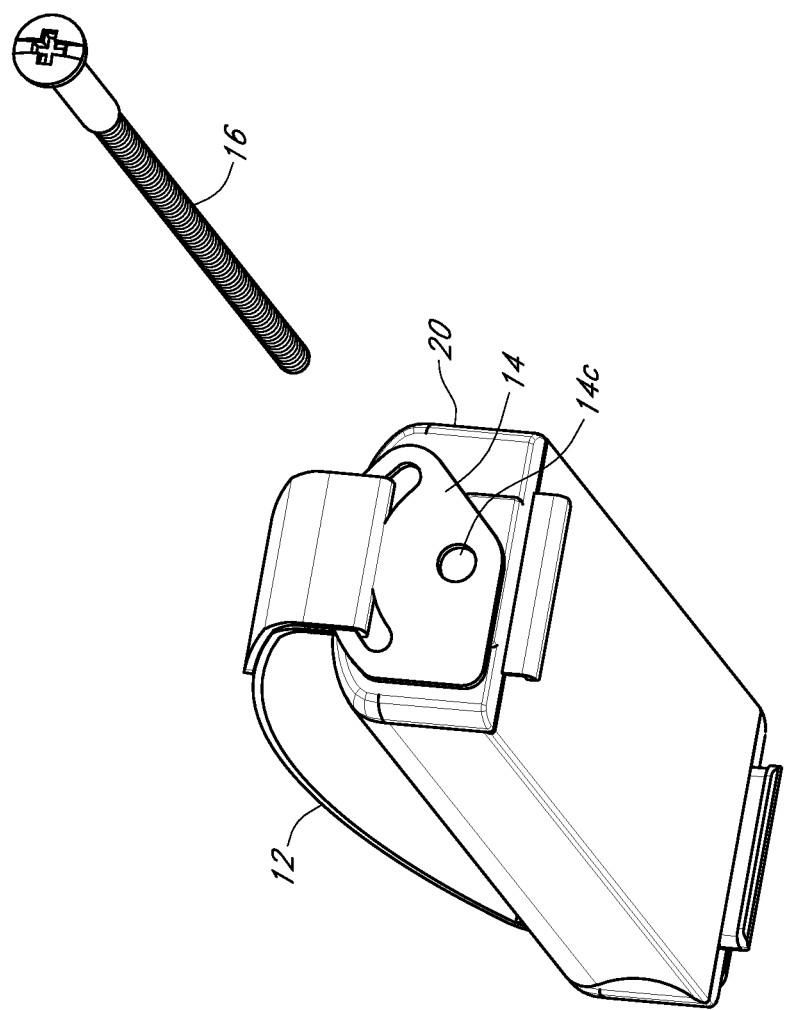
FIG. 10 is a perspective view of portions of the handle member of FIG. 2, the strap assembly coupled with the bracket assembly of FIG. 6, and a pin member of FIG. 1.

Turning to FIG. 10, depicted therein is a perspective view of portions of bar member 20, elongated strap assembly 12 coupled with bracket assembly 14, and pin member 16.

Figure 11:
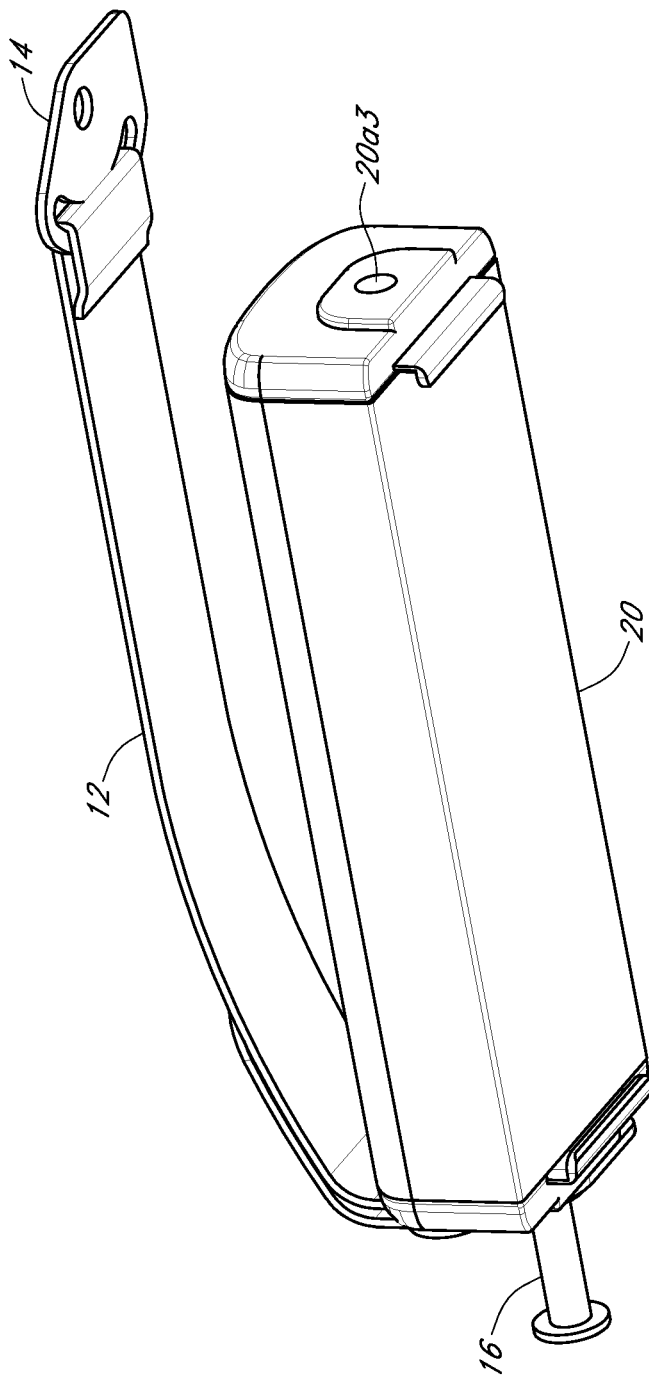
FIG. 11 is a perspective view of portions of the handle member of FIG. 2, the strap assembly coupled with the bracket assembly of FIG. 6, and the pin member of FIG. 1.

Turning to FIG. 11, depicted therein is a perspective view of portions of bar member 20, elongated strap assembly 12 coupled with bracket assembly 14, and pin member 16. Depicted implementation of bar member 20 is shown to include aperture 20a3.

Figure 12:
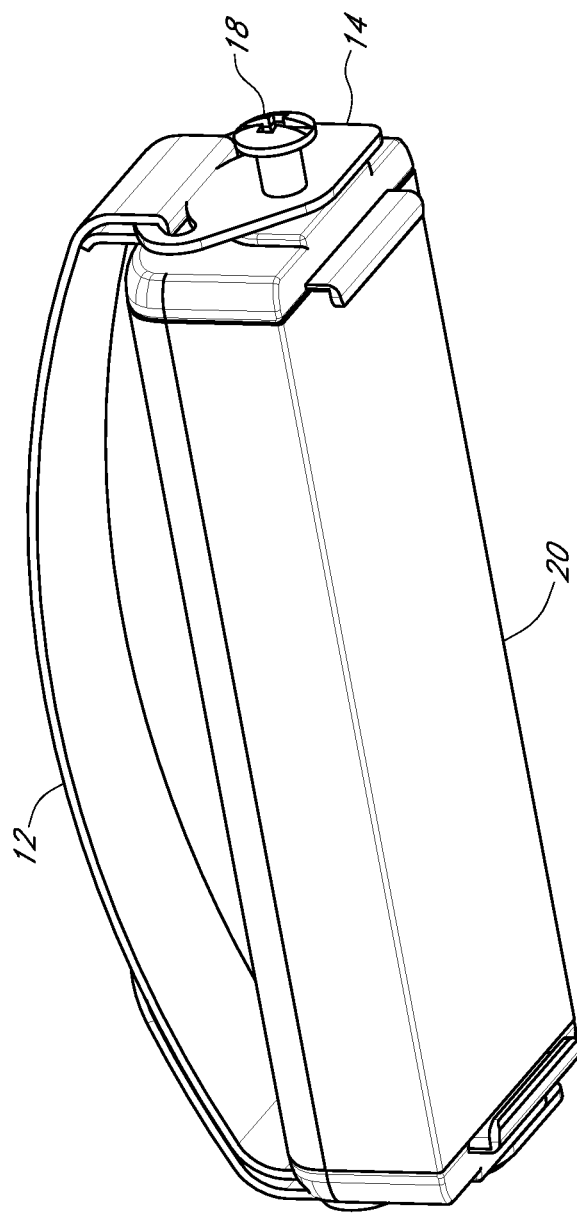
FIG. 12 is a side-perspective view of portions of the handle member of FIG. 2, the strap assembly coupled with the bracket assembly of FIG. 6, and the pin member of FIG. 1.

Turning to FIG. 12, depicted therein is a side-perspective view of portions of bar member 20, elongated strap assembly 12 coupled with bracket assembly 14, and pin member 16.

Figure 13:
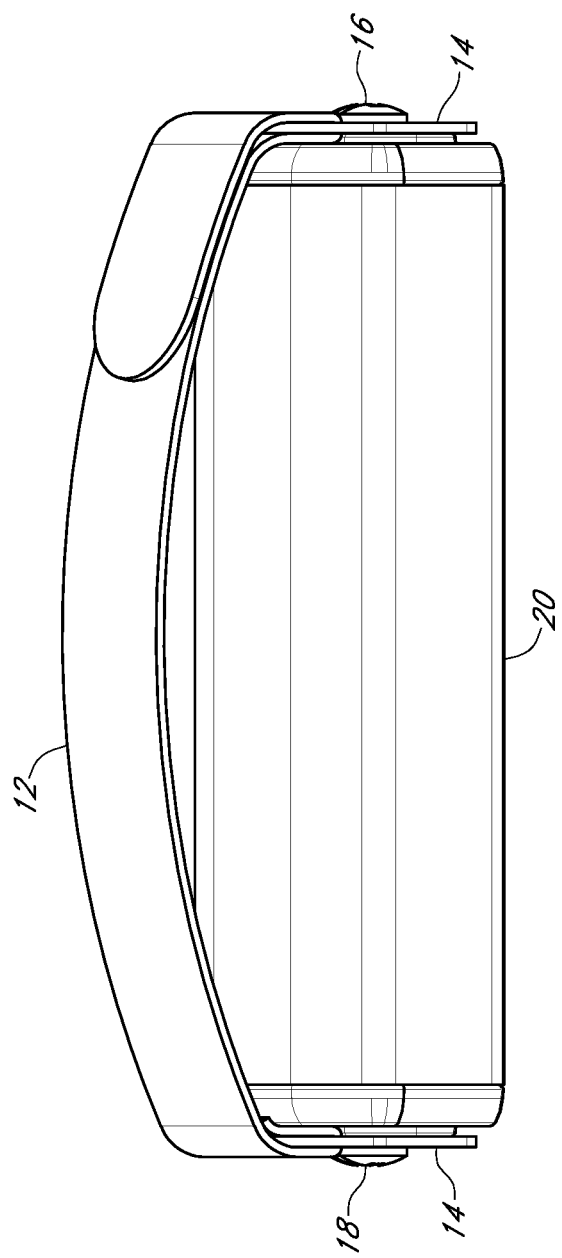
FIG. 13 is a top-perspective view of portions of the handle member of FIG. 2, the strap assembly coupled with the bracket assembly of FIG. 6, and the pin member of FIG. 1.

Turning to FIG. 13, depicted therein is a top-perspective view of portions of bar member 20, elongated strap assembly 12 coupled with bracket assembly 14, and pin member 16.

Figure 14:
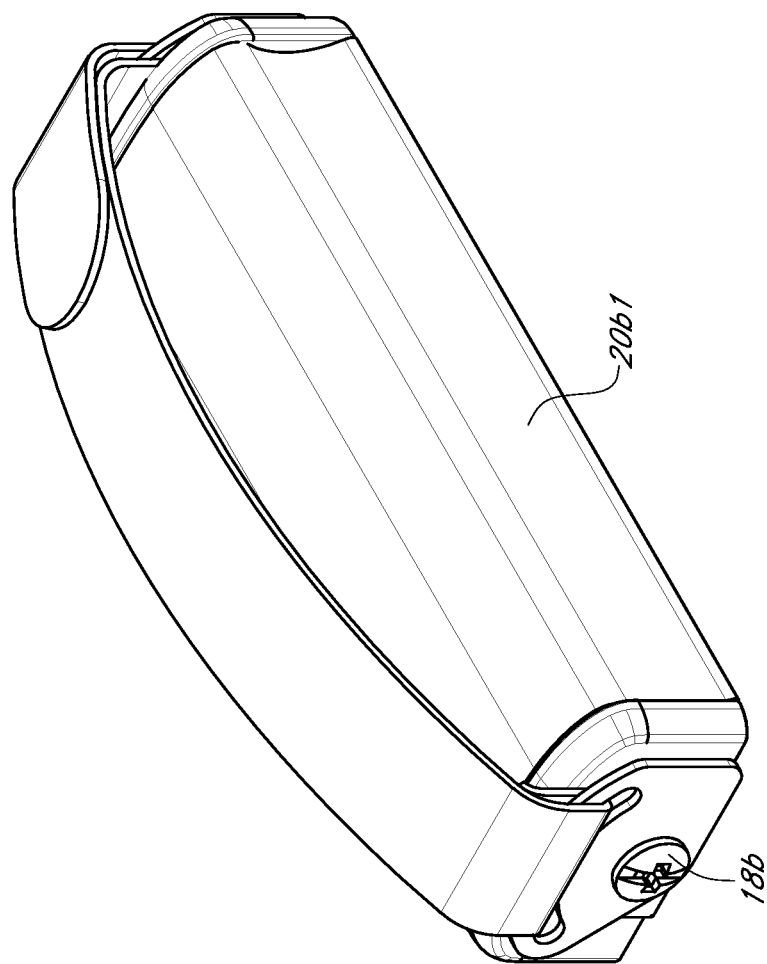
FIG. 14 is a top-perspective view of the handle assembly of FIG. 1.

Turning to FIG. 14, depicted therein is a top-perspective view of handle assembly 10.

Figure 15:
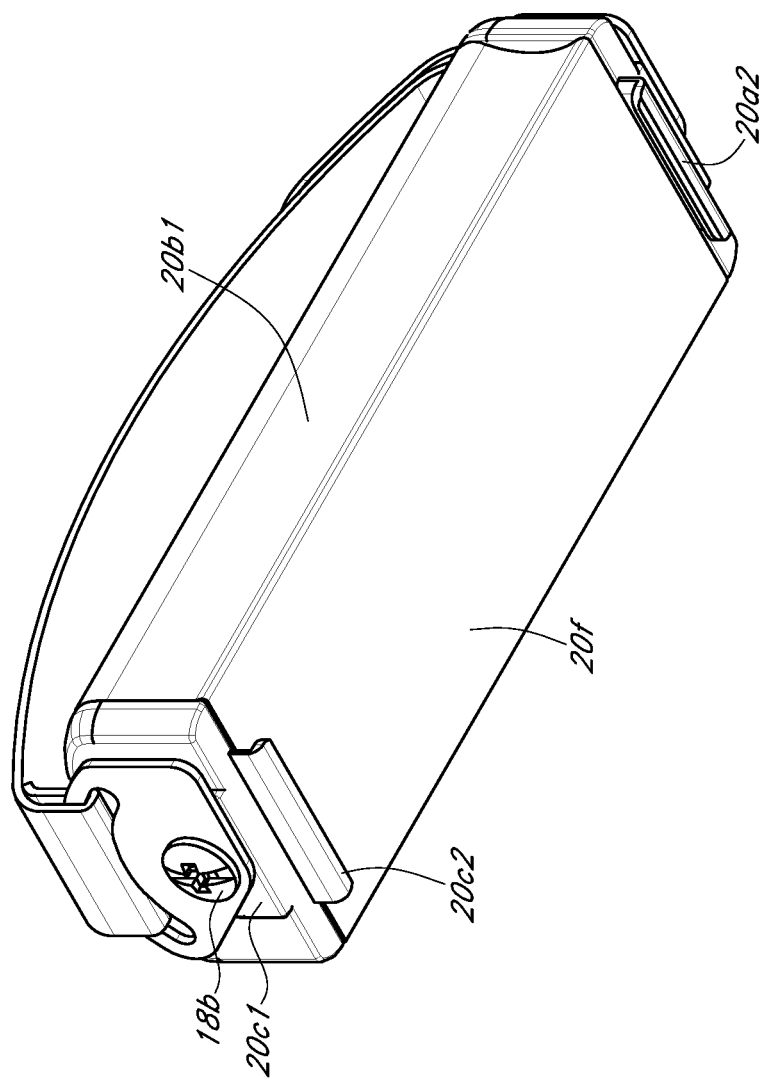
FIG. 15 is a bottom-perspective view of the handle assembly of FIG. 1.

Turning to FIG. 15, depicted therein is a bottom-perspective view of handle assembly 10.

Figure 16:
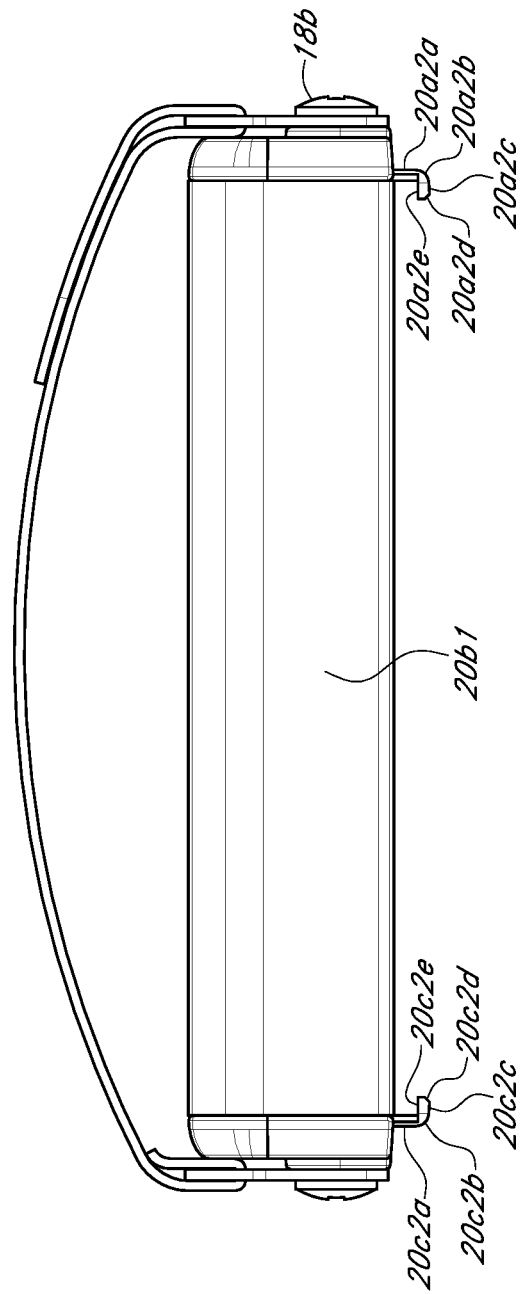
FIG. 16 is a side-elevational view of the handle assembly of FIG. 1.

Turning to FIG. 16, depicted therein is a side-elevational view of handle assembly 10.

Figure 17:
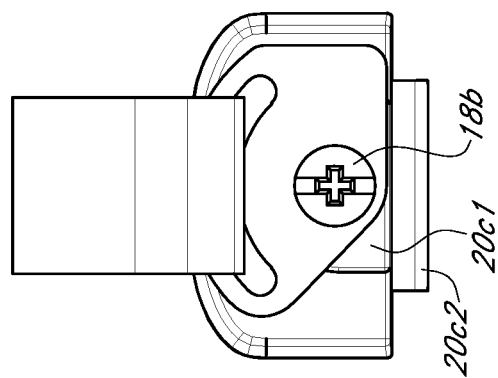
FIG. 17 is a end-elevational view of the handle assembly of FIG. 1.

Turning to FIG. 17, depicted therein is a end-elevational view of handle assembly 10.

Figure 18:
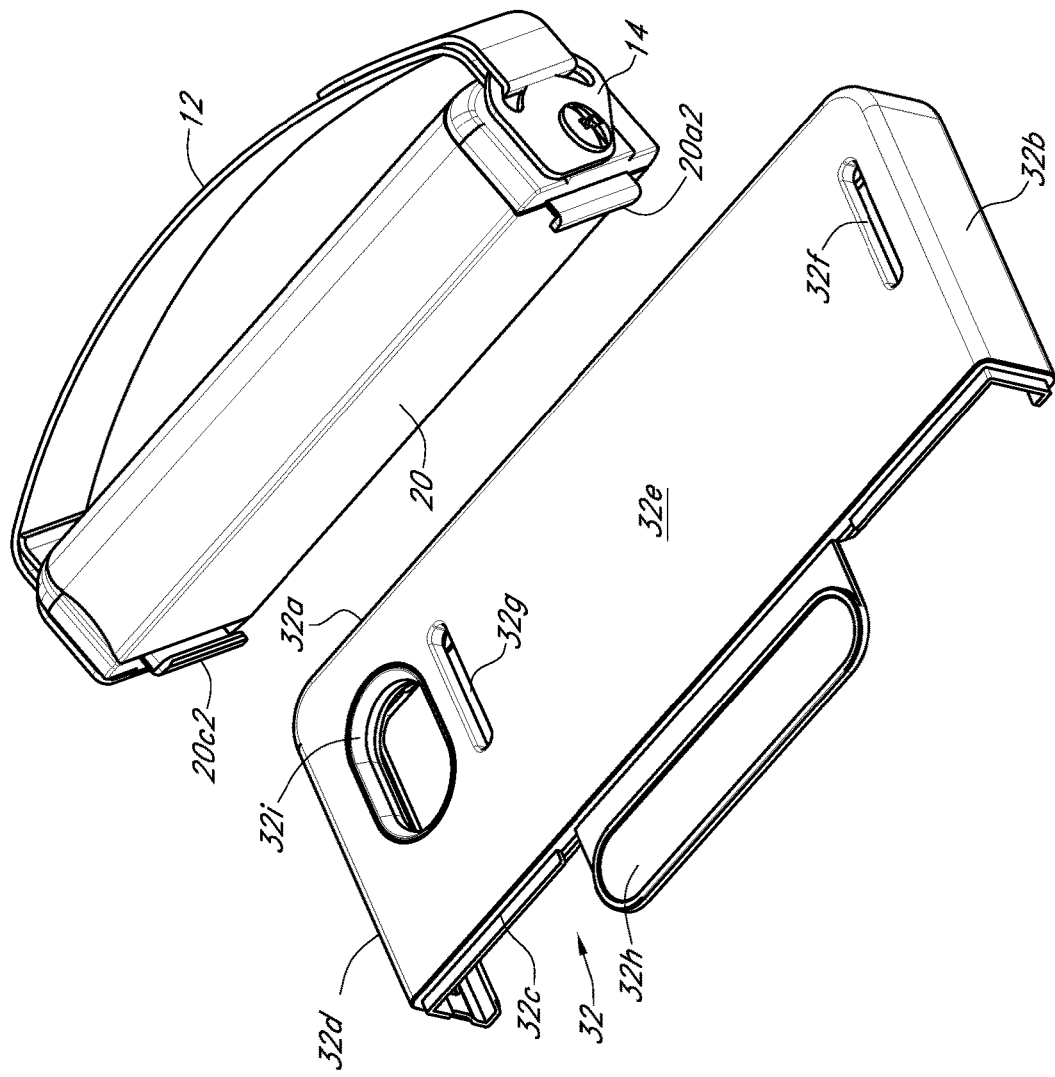
FIG. 18 is a perspective view of a cap assembly and the handle assembly of FIG. 1.

Turning to FIG. 18, depicted therein is a perspective view of cap assembly 32 and handle assembly 10. Depicted implementation of cap assembly 32 is shown to include side wall 32a, side wall 32b, side edge 32c, side wall 32d, base 32e, elongated aperture 32f (shaped, sized, and positioned to couple with clip portion 20c2), elongated aperture 32g (shaped, sized, and positioned to couple with clip portion 20a2), tab member 32h, and lens portion 32i. As depicted, tab member 32h extends away from side edge 32c and extends away from side wall 32a as well.

Figure 19:
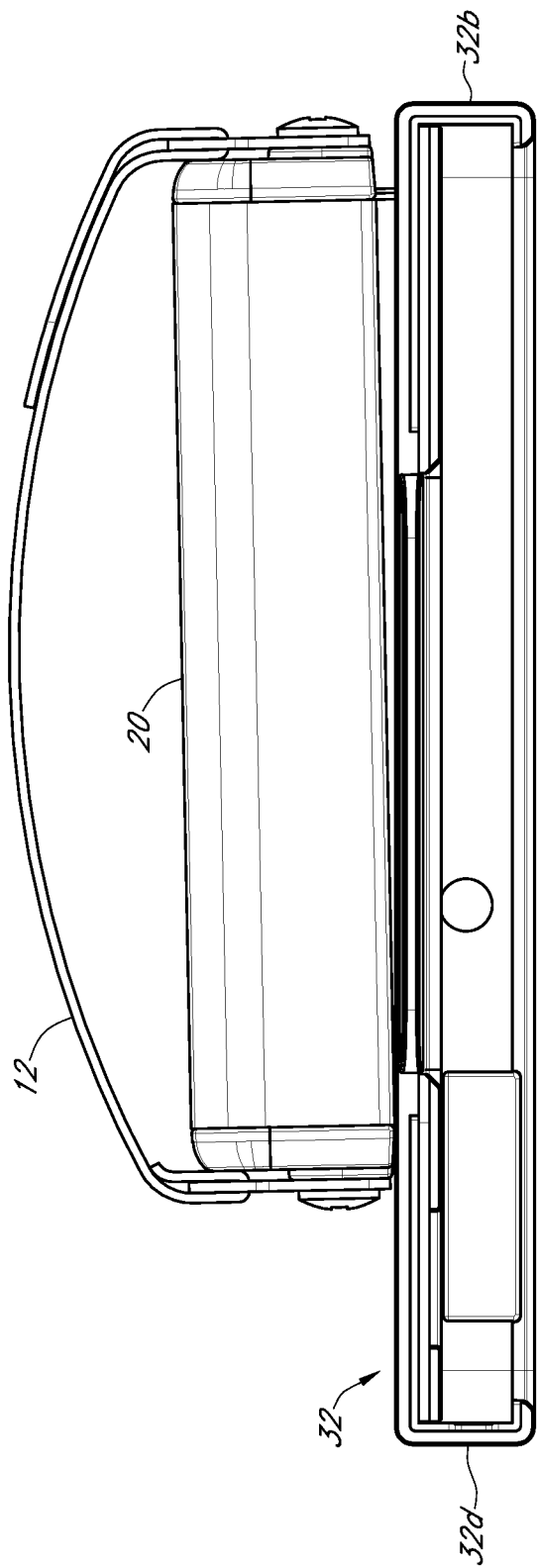
FIG. 19 is a perspective view of the cap assembly of FIG. 18 and the handle assembly of FIG. 1.

Turning to FIG. 19, depicted therein is a perspective view of cap assembly 32 and the handle assembly of FIG. 1.

Figure 20:
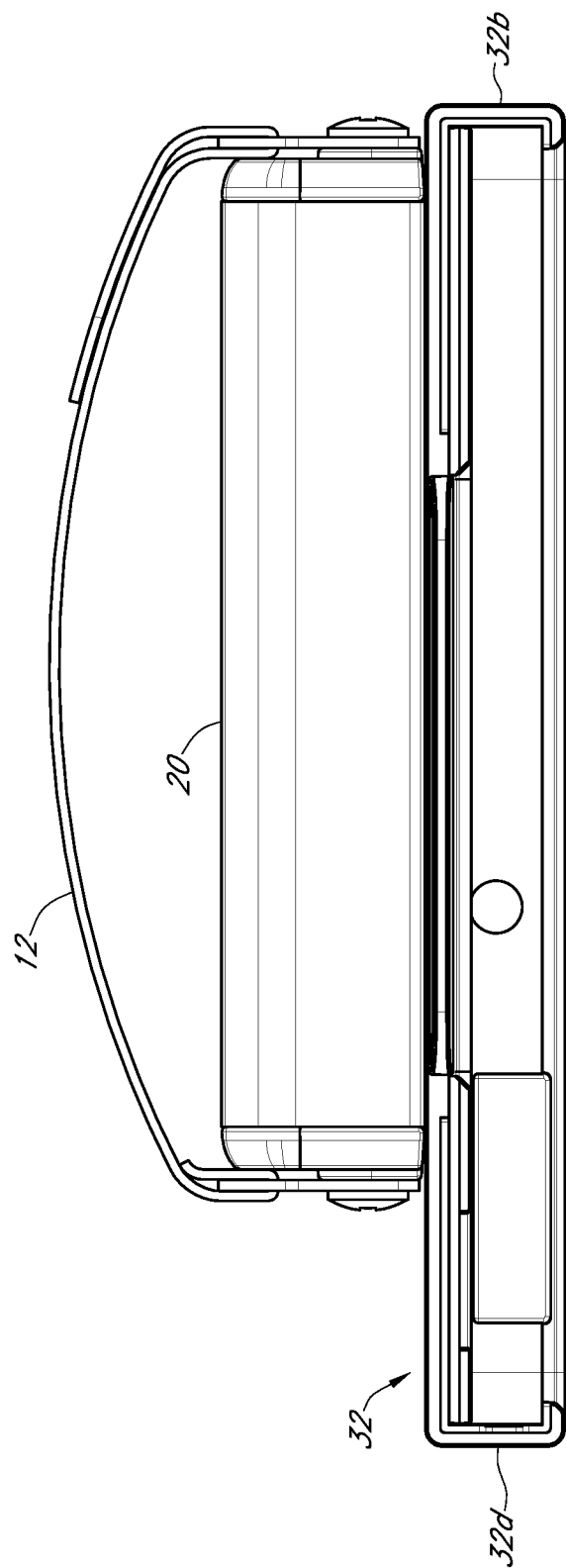
FIG. 20 is a perspective view of the cap assembly of FIG. 18 and the handle assembly of FIG. 1 coupled together.

Turning to FIG. 20, depicted therein is a perspective view of bar member 20 and the handle assembly 10 coupled together. In implementations, wherein elongated top portion 20 is positioned at least one half inch from the cap assembly 32 when bar member 20 is coupled with the device case assembly.

Figure 21:
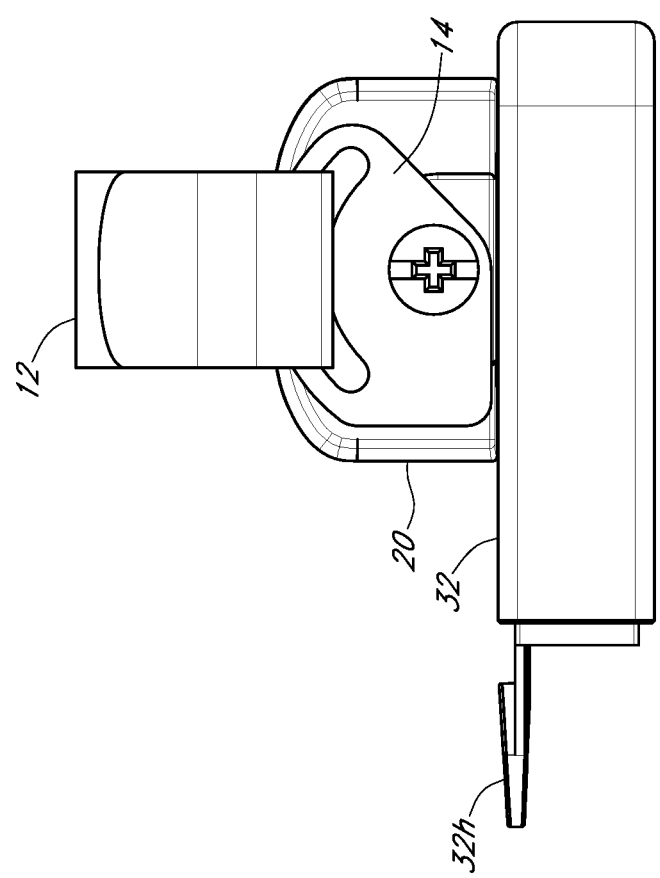
FIG. 21 is an end view of the cap assembly of FIG. 18 and the handle assembly of FIG. 1 coupled together.

Turning to FIG. 21, depicted therein is an end view of cap assembly 32 and handle assembly 10.

Figure 22:
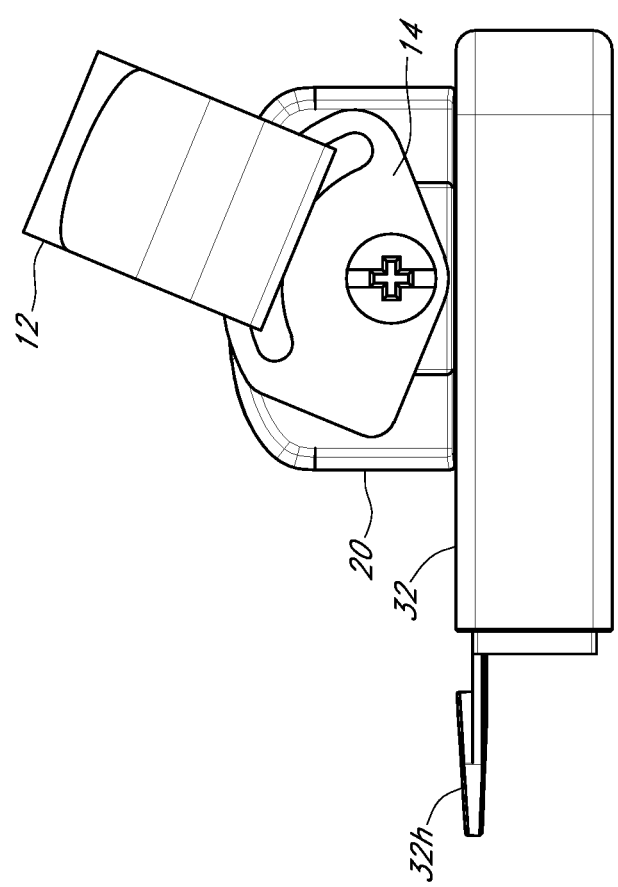
FIG. 22 is an end view of the cap assembly of FIG. 18 and the handle assembly of FIG. 1 coupled together.

Turning to FIG. 22, depicted therein is an end view of cap assembly 32 and handle assembly 10 coupled together.

Figure 23:
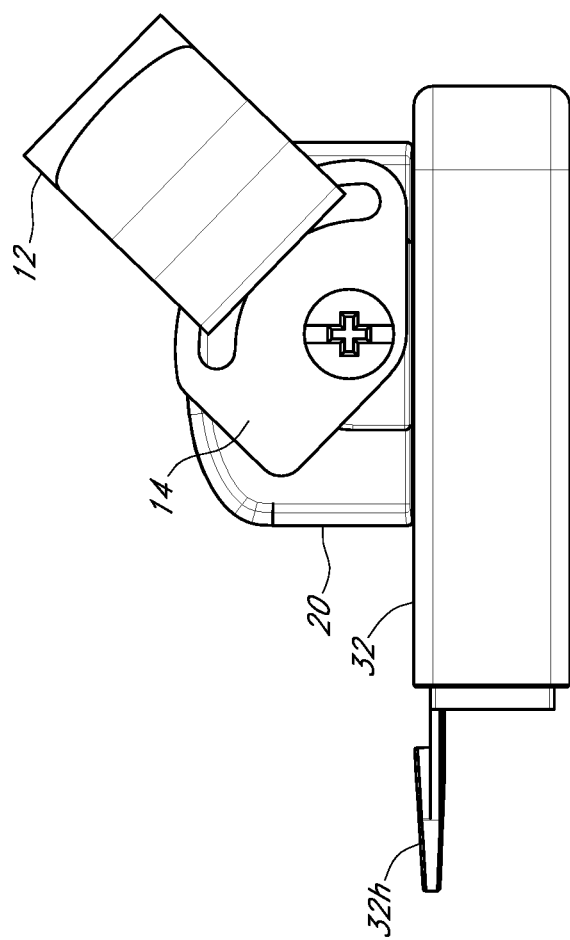
FIG. 23 is an end view of the cap assembly of FIG. 18 and the handle assembly of FIG. 1 coupled together.

Turning to FIG. 23, depicted therein is an end view of cap assembly 32 and handle assembly 10 coupled together.

Figure 24:
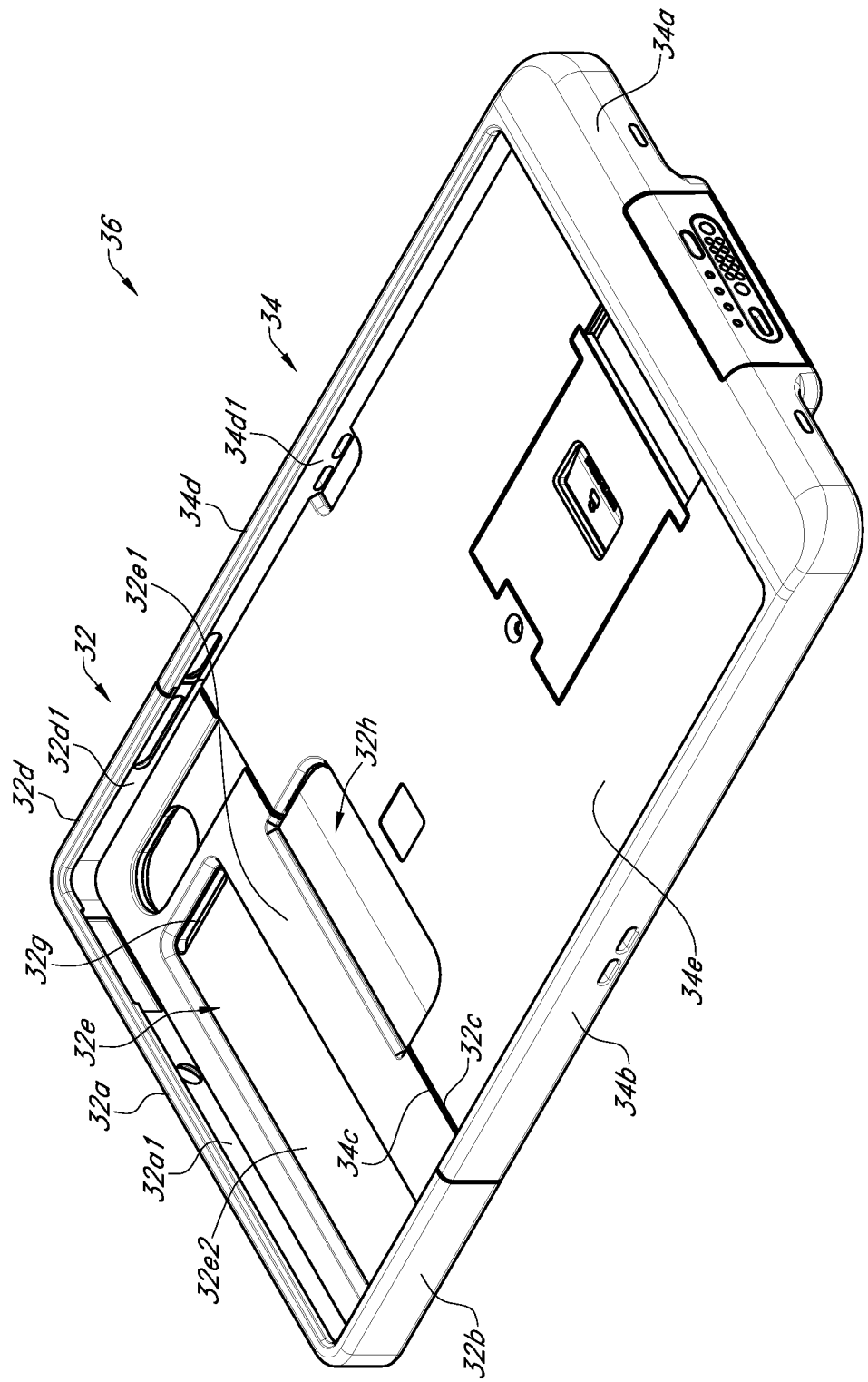
FIG. 24 is a rear-top-perspective view of the cap assembly of FIG. 18 and a main assembly coupled together to form a case assembly.

Turning to FIG. 24, depicted therein is a rear top perspective view of cap assembly 32 and main assembly 34 coupled together to form device case assembly 30.

Depicted implementation of cap assembly 32 is shown to include elongated groove 32d1, raised portion 32e1, and recessed portion 32e2. As depicted, side wall 32b and side wall 32d extend perpendicular with respect to side wall 32a. As depicted, side edge 32c extends parallel with respect to side wall 32a. As depicted, side edge 32c is spaced from side wall 32a along side wall 32b and side wall 32d.

Depicted implementation of main assembly 34 is shown to include side wall 34a, side wall 34b, side edge 34c, side wall 34d, groove 34d1, and base 34e. As depicted, side wall 34b and side wall 34d extend perpendicular with respect to side wall 34a. As depicted, side edge 34c extends parallel with respect to side wall 34a. As depicted, when cap assembly 32, and cap assembly 32, are coupled together, side wall 32a, side wall 32b, side wall 32d, and base 32e of cap assembly 32, and side wall 34a, side wall 34b, side wall 32d, and base 34e of main assembly 34 form an interior area to couple with portable electronic device 100 (shown in FIG. 30).

Figure 25:
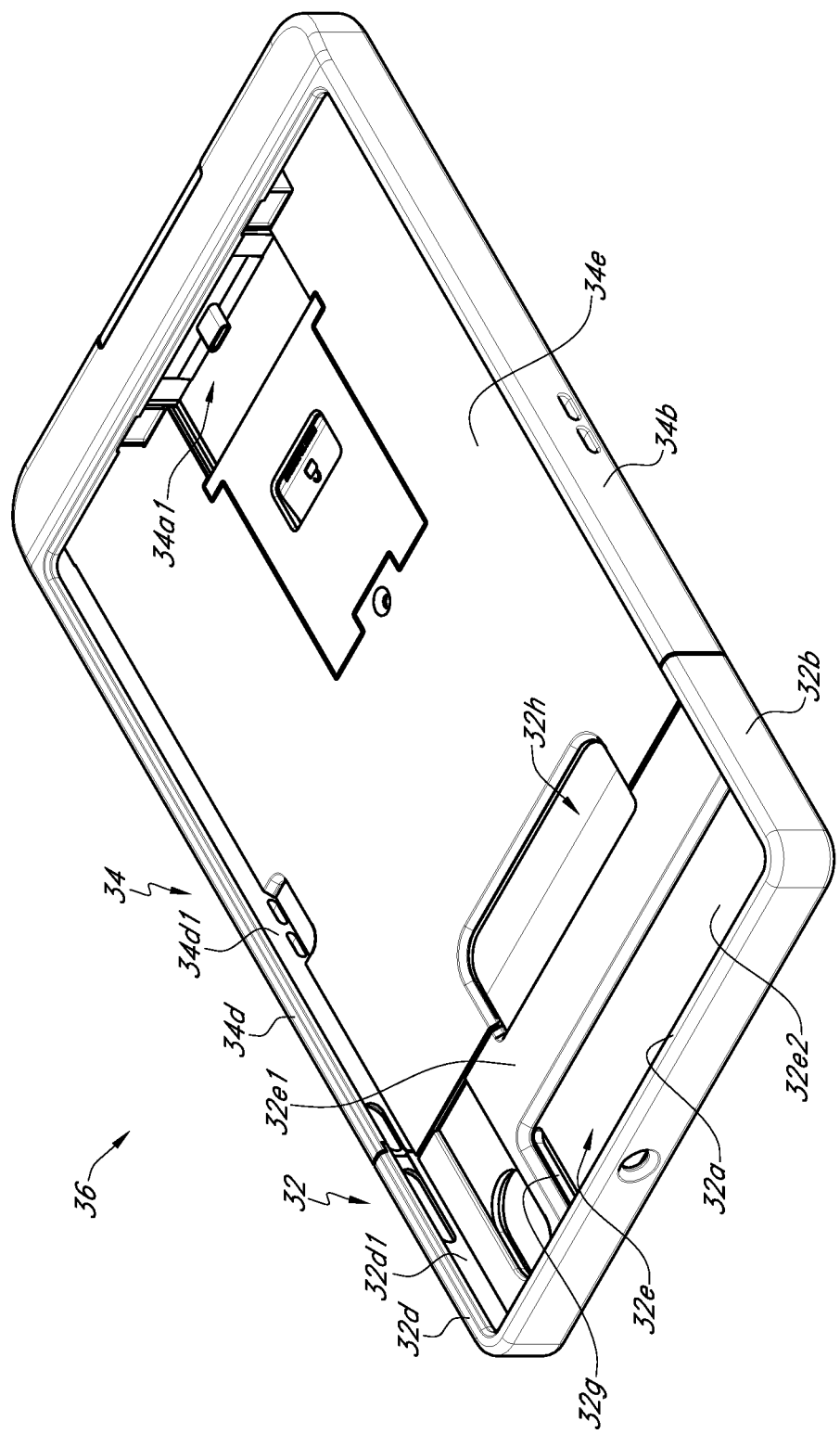
FIG. 25 is a front-top-perspective view of the case assembly of FIG. 24.

Turning to FIG. 25, depicted therein is a front-top-perspective view of device case assembly 30. Depicted implementation of main assembly 34 is shown to include portable electric interface 34al.

Figure 26:
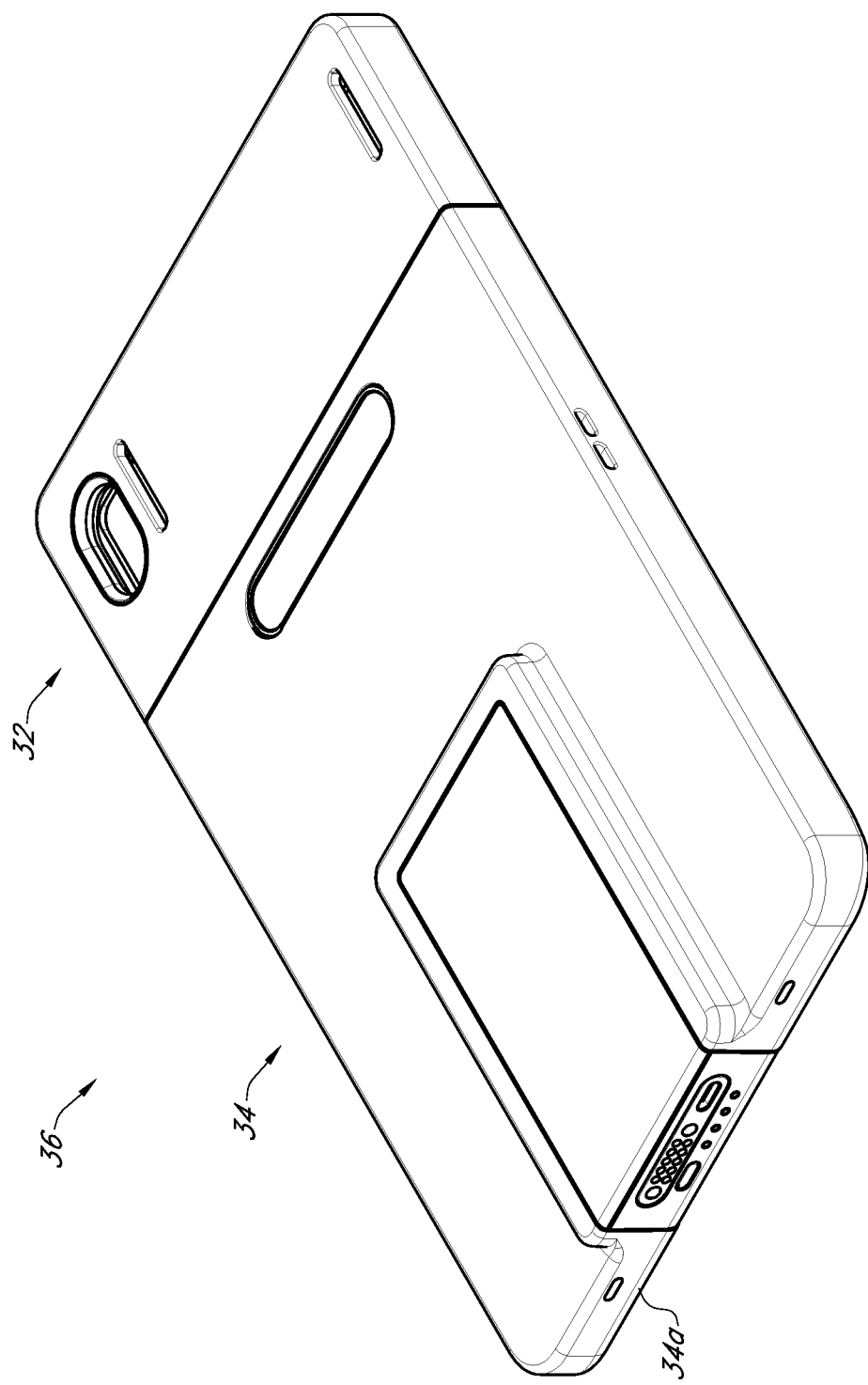
FIG. 26 is a rear-bottom-perspective view of the case assembly of FIG. 24.

Turning to FIG. 26, depicted therein is a rear-bottom-perspective view of device case assembly 30.

Figure 27:
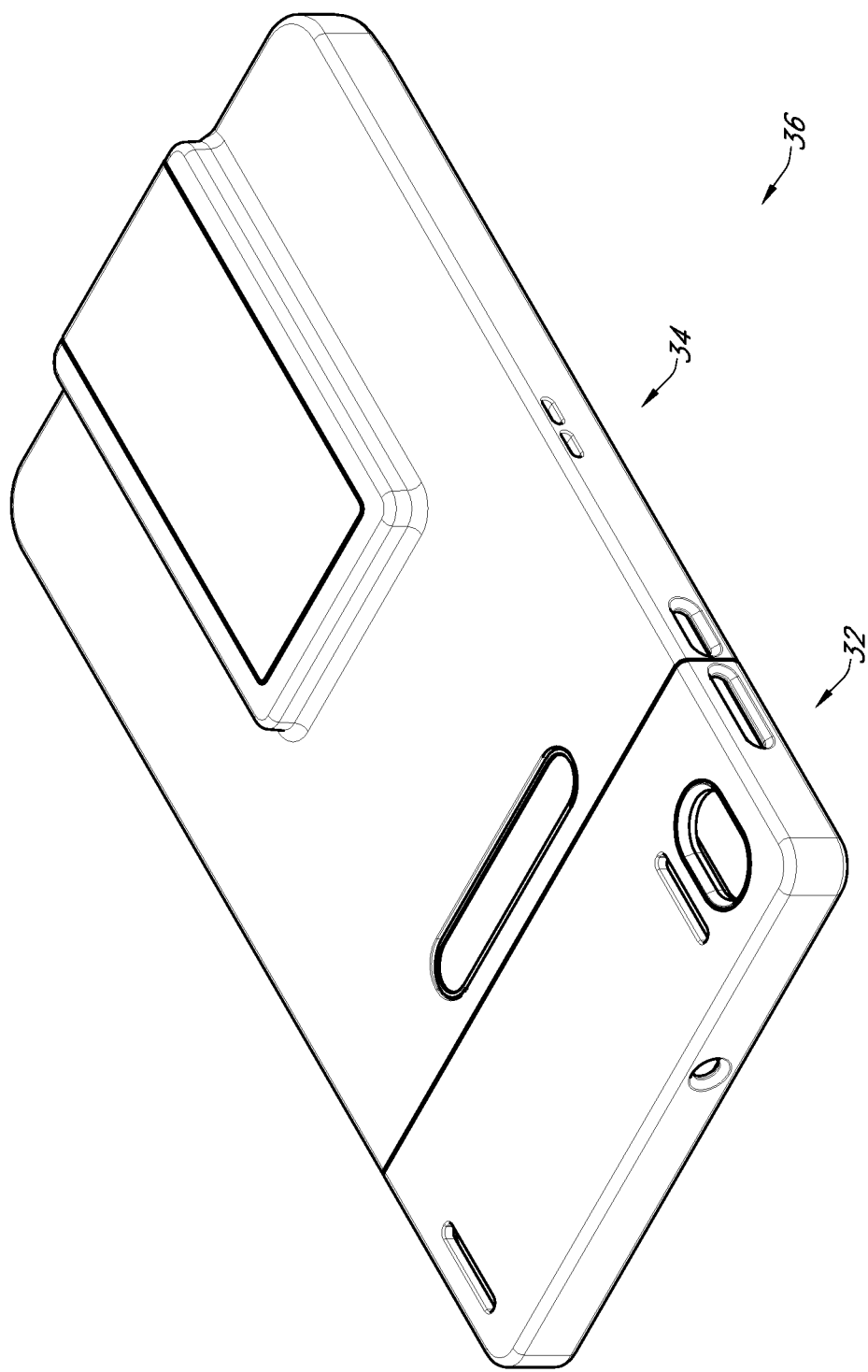
FIG. 27 is a front-bottom-perspective view of the case assembly of FIG. 24.

Turning to FIG. 27, depicted therein is a front-bottom-perspective view of device case assembly 30.

Figure 28:
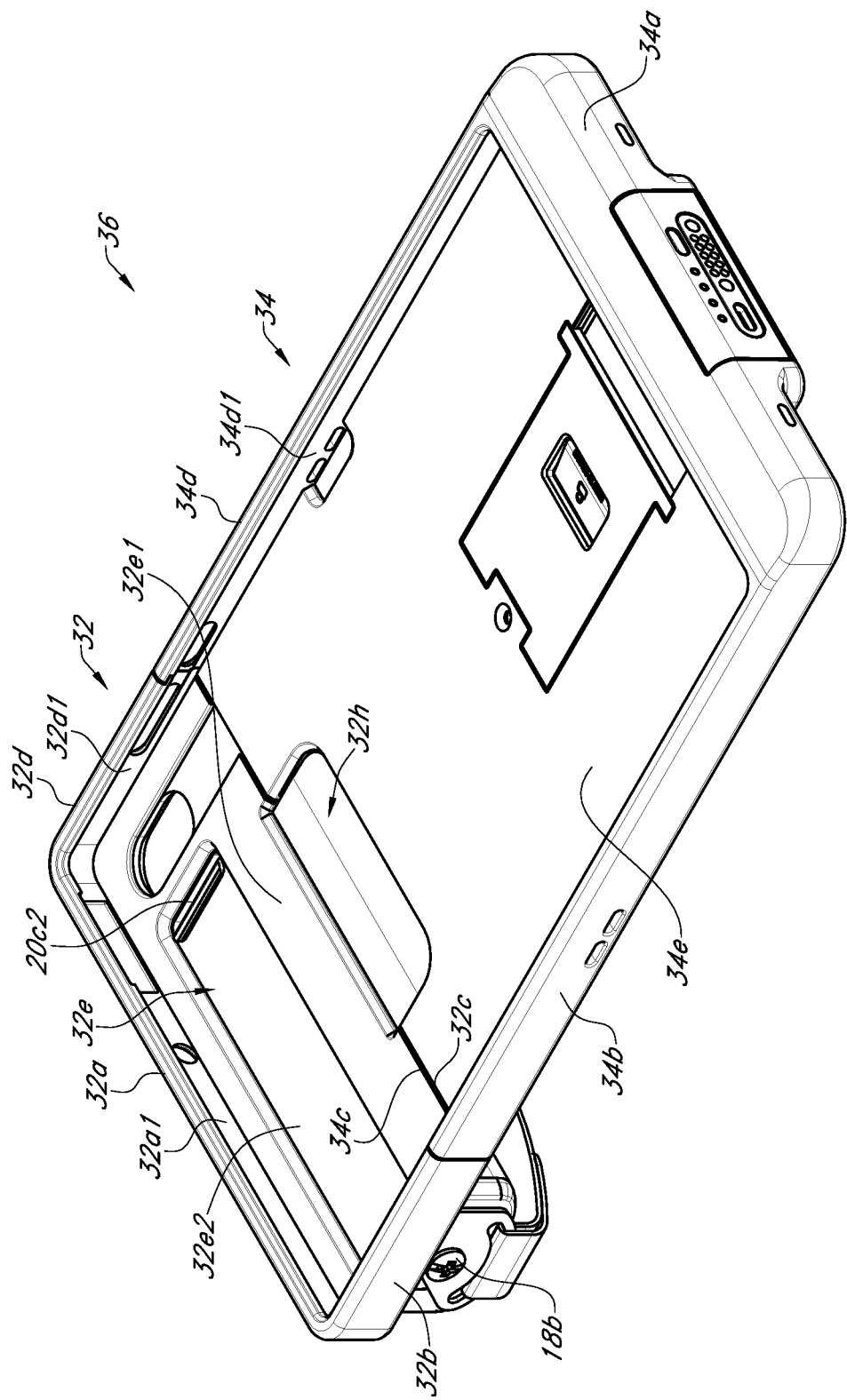
FIG. 28 is a rear-top-perspective view of the case assembly of FIG. 24 coupled with the handle assembly of FIG. 1.
Figure 29:
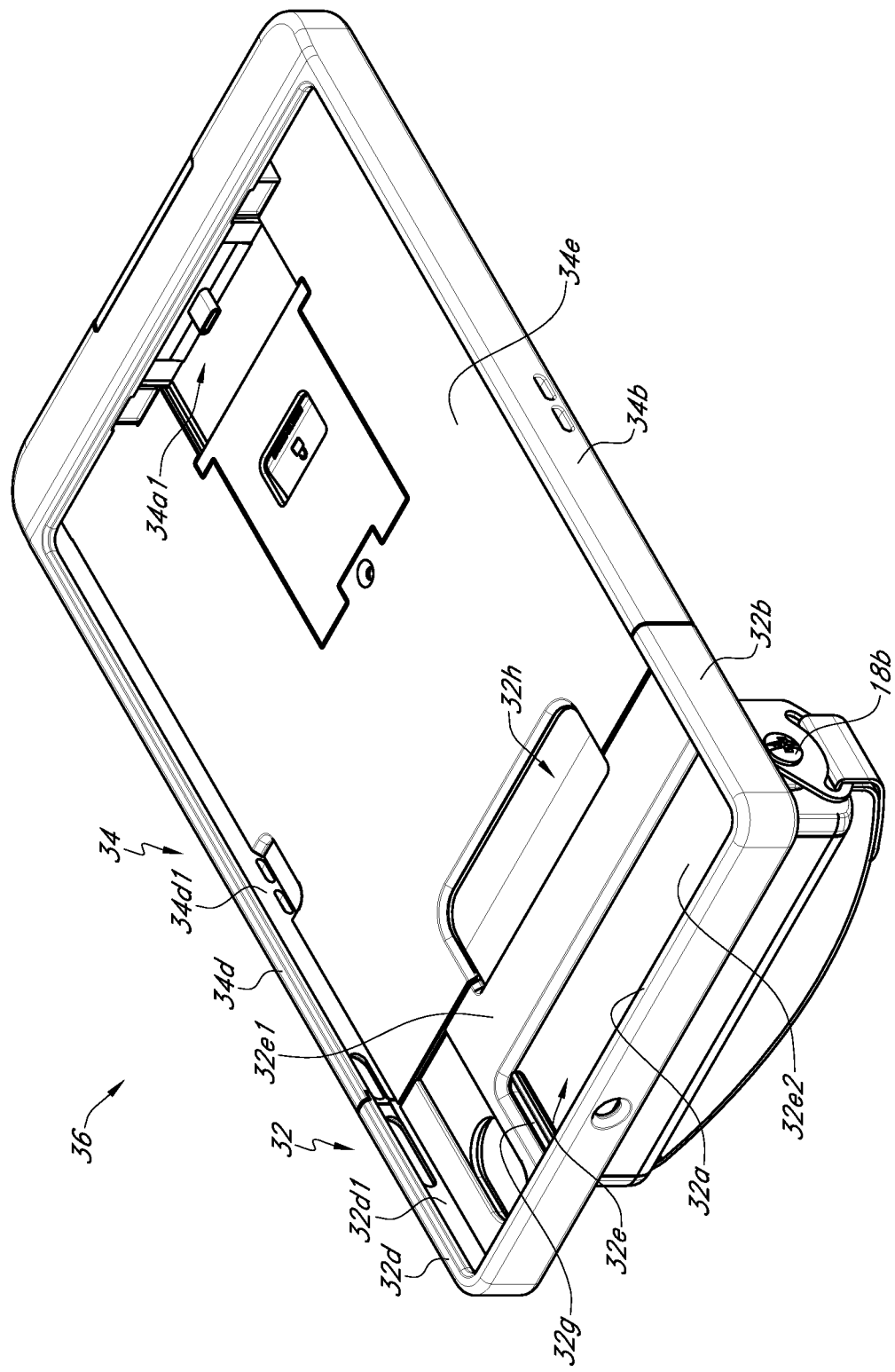
FIG. 29 is a front-top-perspective view of the case assembly of FIG. 24 coupled with the handle assembly of FIG. 1.

Turning to FIG. 28, depicted therein is a rear-top-perspective view of device case assembly 30 coupled with handle assembly 10. As depicted, Turning to FIG. 29, depicted therein is a front-top-perspective view of device case assembly 30 coupled with device case assembly 30.

Figure 30:
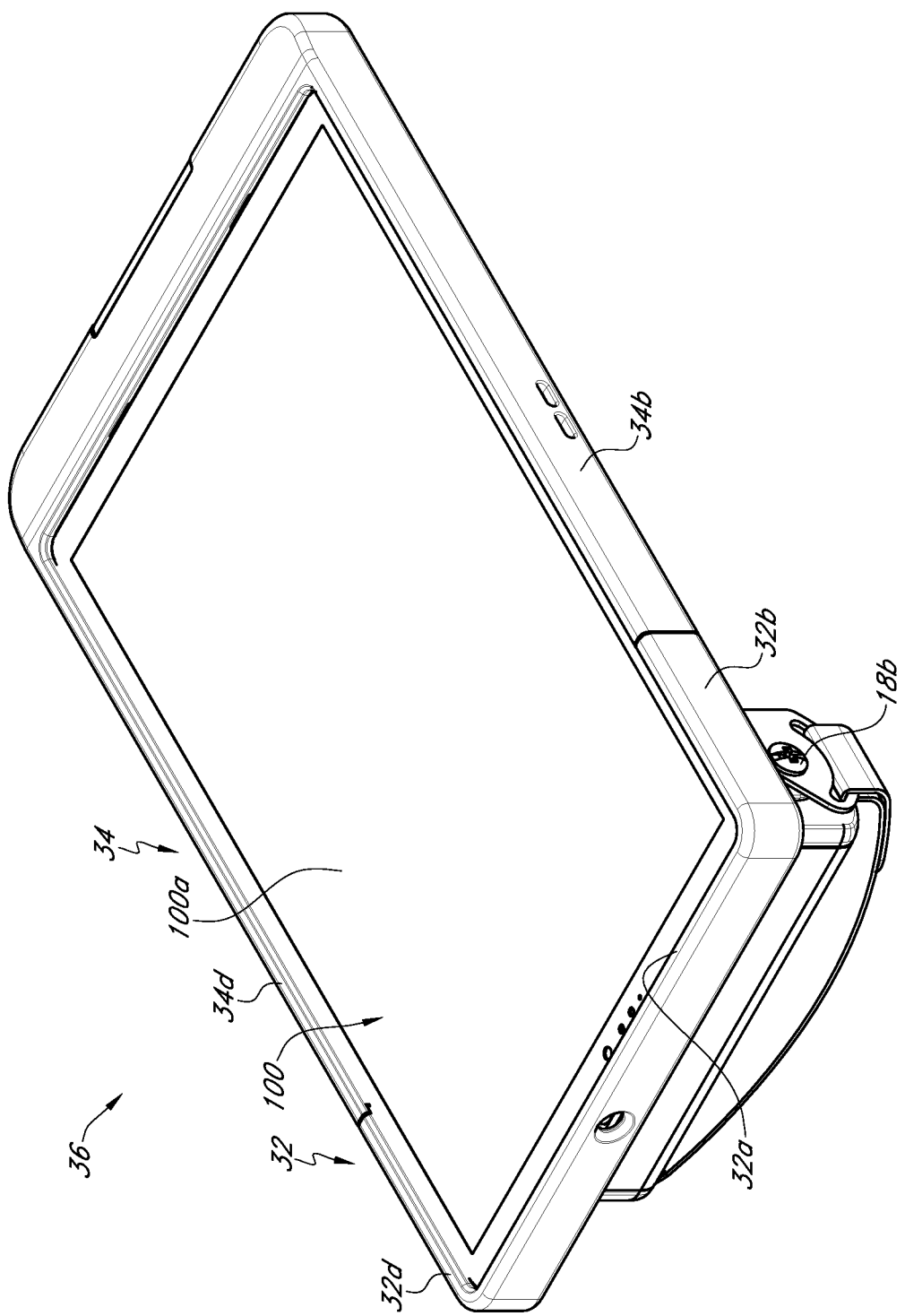
FIG. 30 is a front-top-perspective view of the case assembly of FIG. 24 coupled with the handle assembly of FIG. 1 and coupled with an electronic device.

Turning to FIG. 30, depicted therein is a front-top-perspective view of device case assembly 30 coupled with handle assembly 10 and coupled with portable electronic device 100. Depicted implementation of portable electronic device 100 is shown to include display 100a.

Figure 31:
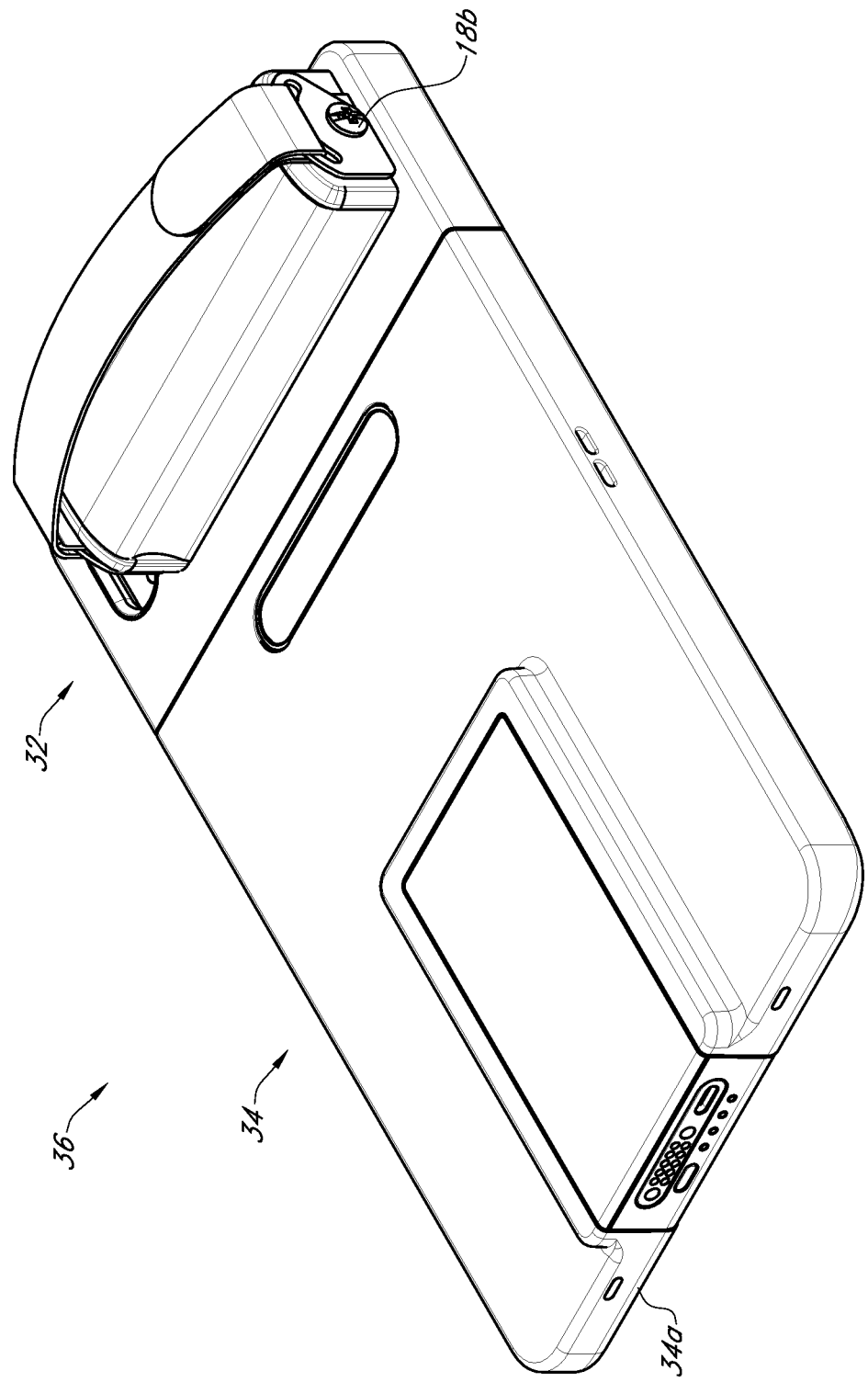
FIG. 31 is a rear-bottom-perspective view of the case assembly of FIG. 24 coupled with the handle assembly of FIG. 1.

Turning to FIG. 31, depicted therein is a rear-bottom-perspective view of device case assembly 30 with handle assembly 10.

Figure 32:
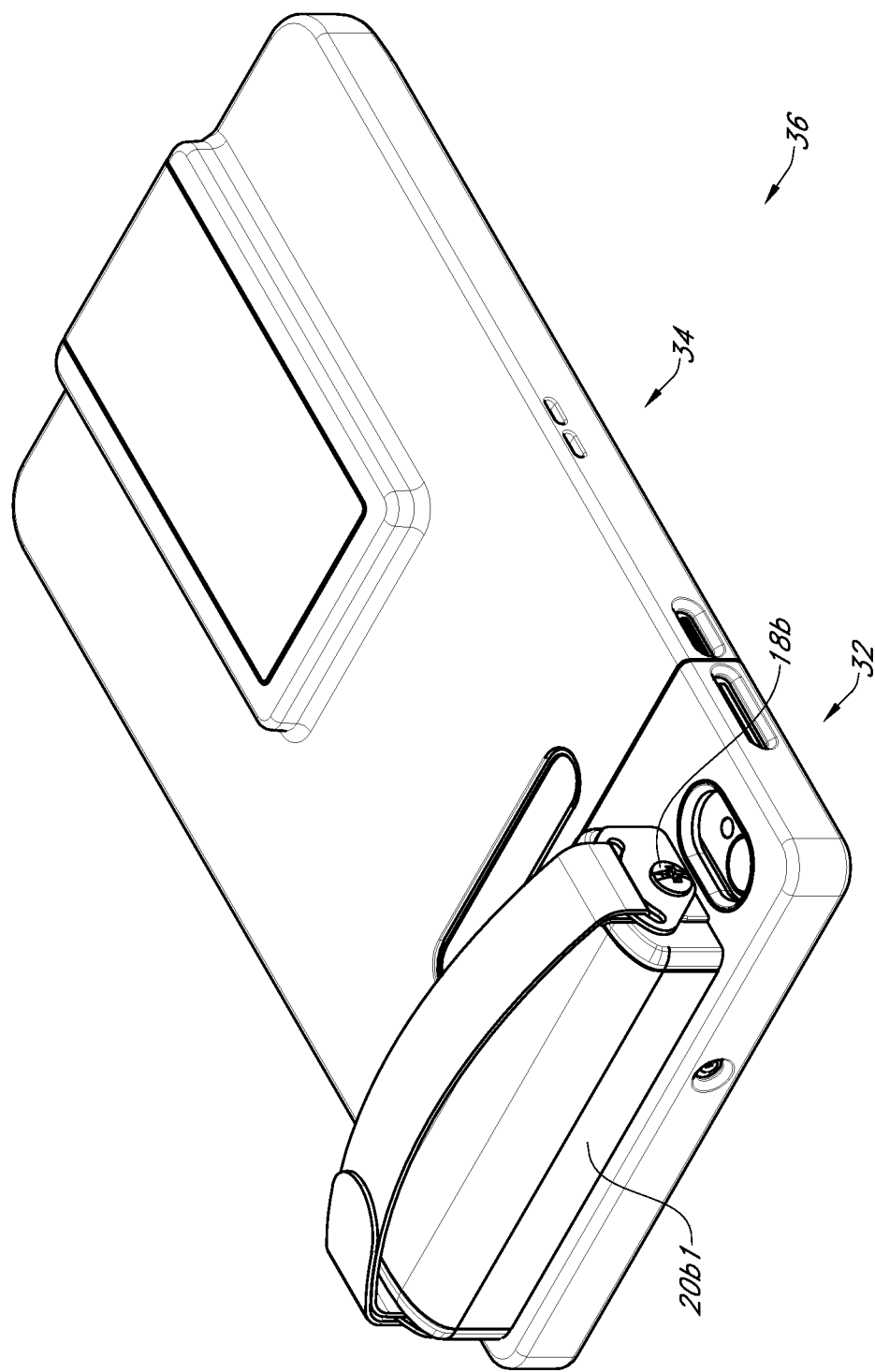
FIG. 32 is a front-bottom-perspective view of the case assembly of FIG. 24 coupled with the handle assembly of FIG. 1.

Turning to FIG. 32, depicted therein is a front-bottom-perspective view of device case assembly 30 coupled with handle assembly 10.

Figure 33:
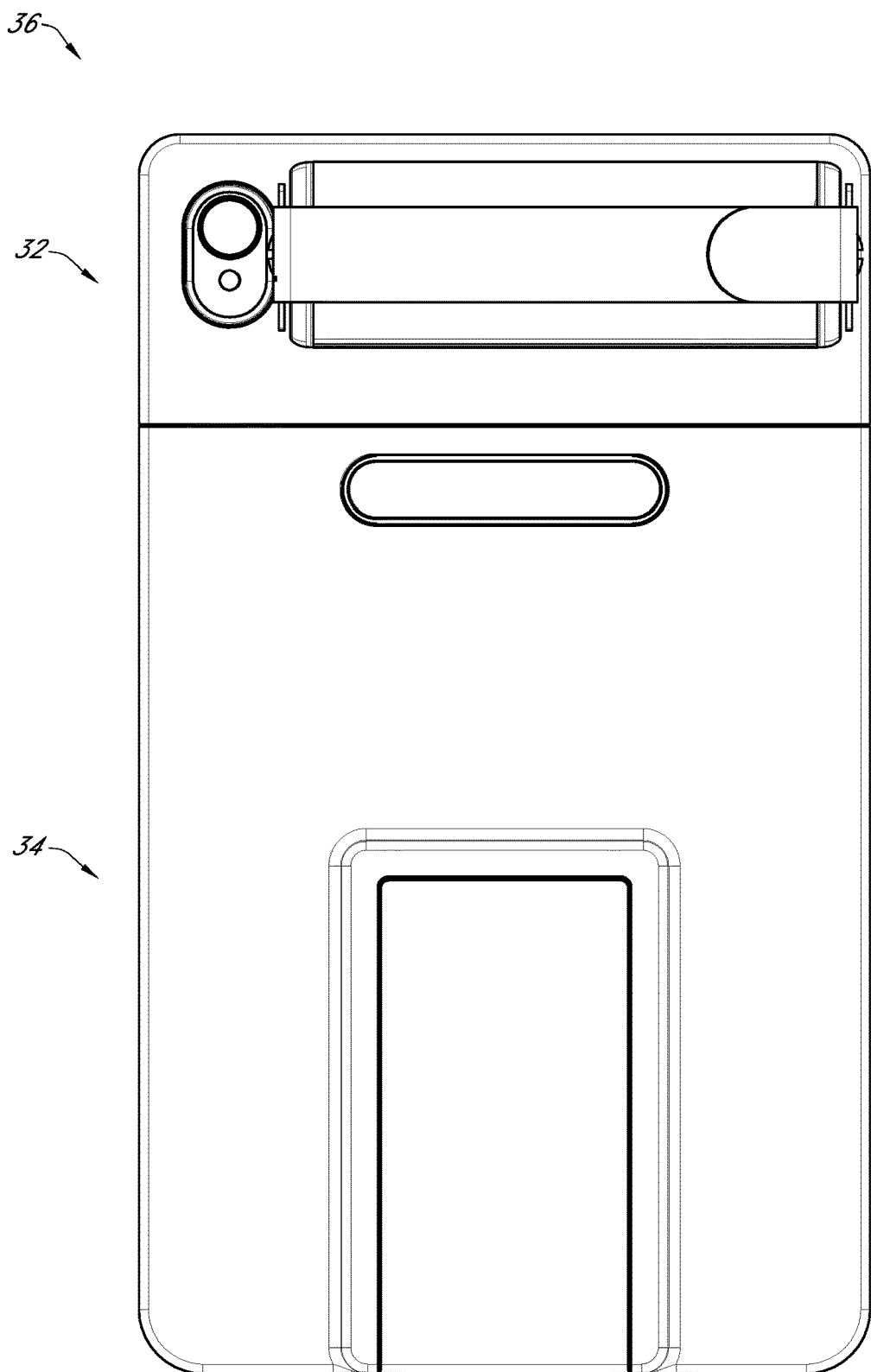
FIG. 33 is a bottom-plan-view of the case assembly of FIG. 24 coupled with the handle assembly of FIG. 1.

Turning to FIG. 33, depicted therein is a bottom-plan-view of device case assembly 30 coupled with handle assembly 10.

Figure 34:
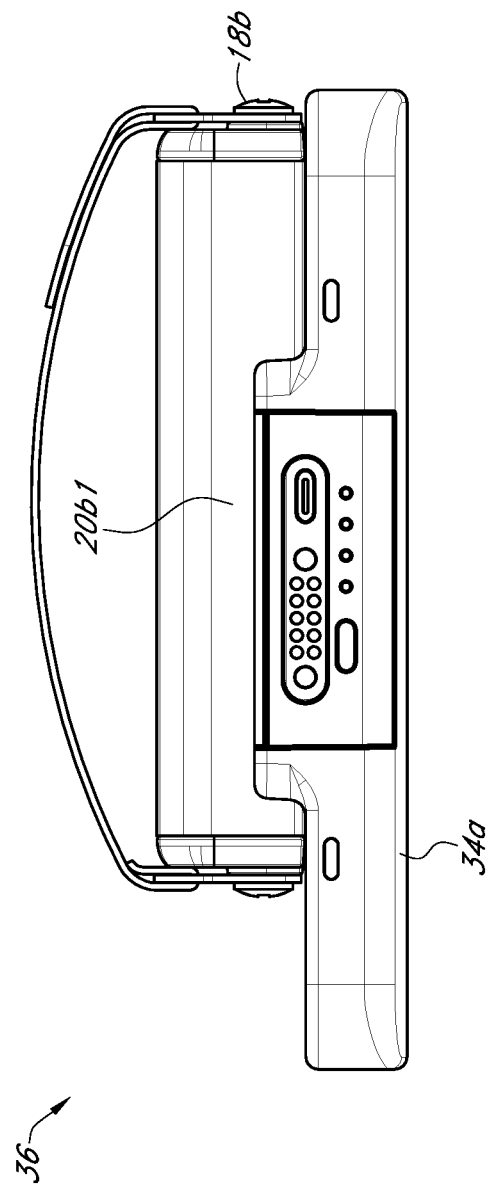
FIG. 34 is a rear-elevational view of the case assembly of FIG. 24 coupled with the handle assembly of FIG. 1.

Turning to FIG. 34, depicted therein is a rear-elevational view of device case assembly 30 coupled with handle assembly 10.

Figure 35:
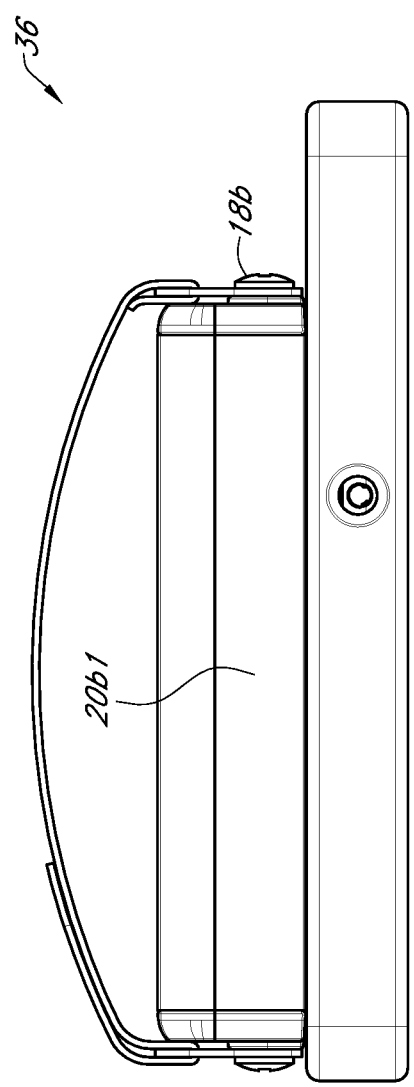
FIG. 35 is a front-elevational view of the case assembly of FIG. 24 coupled with the handle assembly of FIG. 1.

Turning to FIG. 35, depicted therein is a front-elevational view of device case assembly 30 coupled with handle assembly 10.

Figure 36:
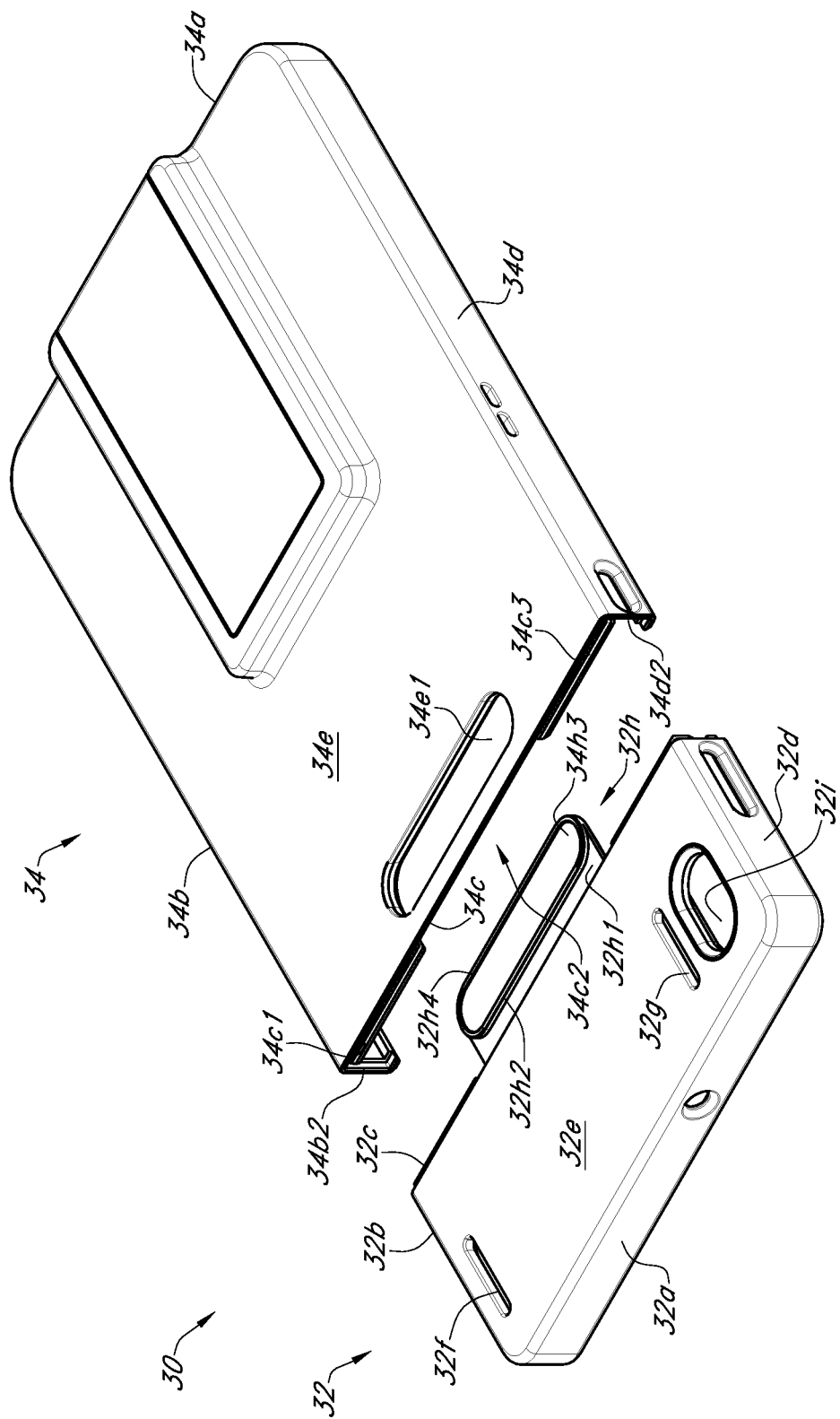
FIG. 36 is a partial-exploded-front-bottom-perspective view of the case assembly of FIG. 24.

Turning to FIG. 36, depicted therein is a partial-exploded-front-bottom-perspective view of device case assembly 30. Depicted implementation of tab member 32h of cap assembly 32 is shown to include recess 32h1, and a raised and tapered portion to include back edge 32h2, middle 32h3, and front edge 32*h*4, which are decreasingly less raised, respectively, with respect to recess 32*h*1 as also further shown in FIG. 52. As also depicted in FIG. 36, recess 32*h*1 is positioned closer to side edge 32*c* than back edge 32*h*2, middle 32*h*3, and front edge 32*h*4 are positioned to side edge 32*c*.

Depicted implementation of main assembly 34 is shown to include groove 34*b*2, groove 34*c*1, gap 34*c*2, groove 34*c*3, groove 34*d*2, and elongated aperture 34*e*1. As depicted, elongated aperture 34*e*1 is sized, shaped and positioned to receive tab member 32*h* (e.g., back edge 32*h*2, middle 32*h*3, and front edge 32*h*4) when cap assembly 32 and main assembly 34 are coupled together.

Figure 37:
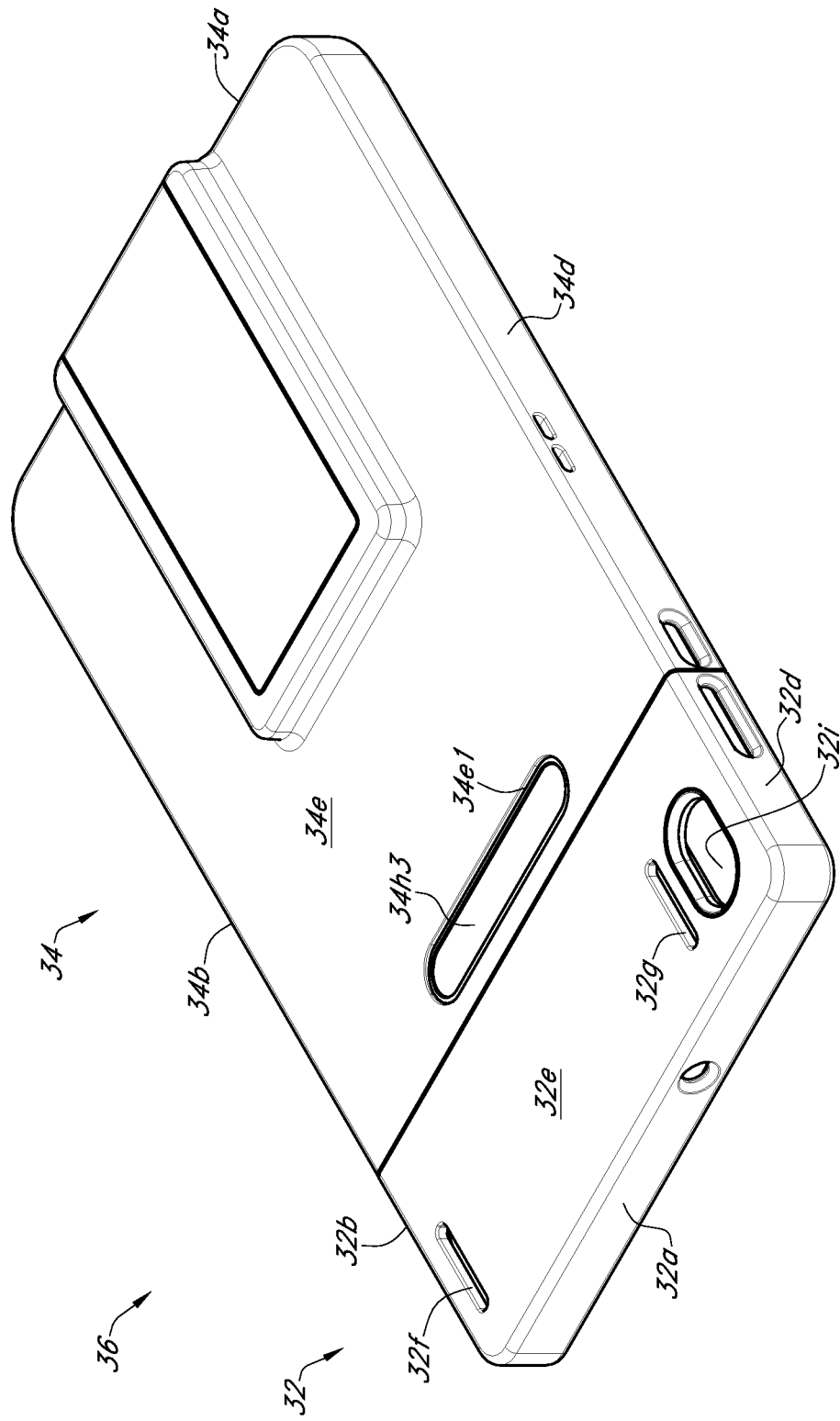
FIG. 37 is a front-bottom-perspective view of the case assembly of FIG. 24.

Turning to FIG. 37, depicted therein is a front-bottom-perspective view of device case assembly 30.

Figure 38:
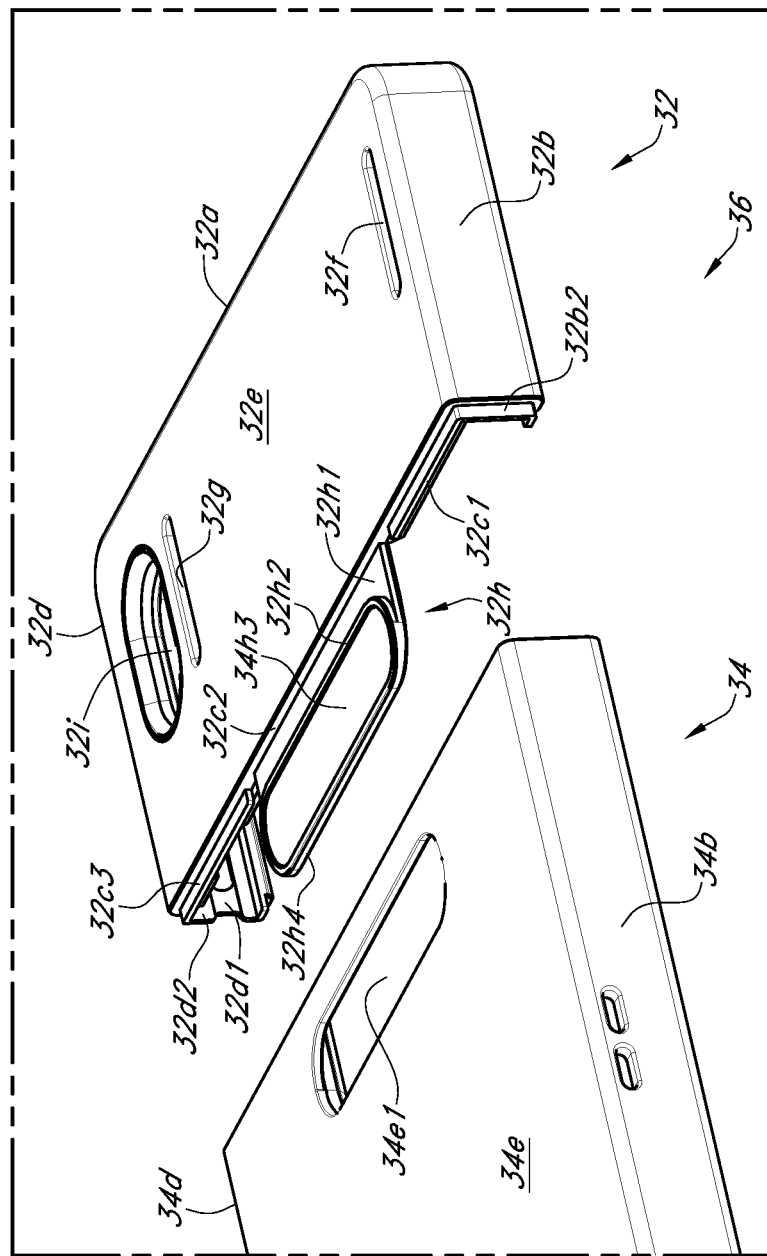
FIG. 38 is a partial-exploded-bottom-perspective view of a portion of the case assembly of FIG. 24.

Turning to FIG. 38, depicted therein is a partial-exploded-bottom-perspective view of a portion of device case assembly 30. Depicted implementation of cap assembly 32 is shown to include protrusion 32*b*2, protrusion 32*c*1, gap 32*c*2, protrusion 32*c*3, and protrusion 32*d*2 with protrusion 32*b*2, protrusion 32*c*1, protrusion 32*c*3, and protrusion 32*d*2 for coupling with groove 34*b*2, groove 34*c*1, groove 34*c*3, and groove 34*d*2, respectively when cap assembly 32 is coupled with main assembly 34.

Depicted implementation of main assembly 34 is shown to include groove 34*b*2, groove 34*c*1, gap 34*c*2, groove 34*c*3, groove 34*d*2, and elongated aperture 34*e*1. As depicted, elongated aperture 34*e*1 is sized, shaped and positioned to receive tab member 32*h* (e.g., back edge 32*h*2, middle 32*h*3, and front edge 32*h*4) when cap assembly 32 and main assembly 34 are coupled together.

Figure 39:
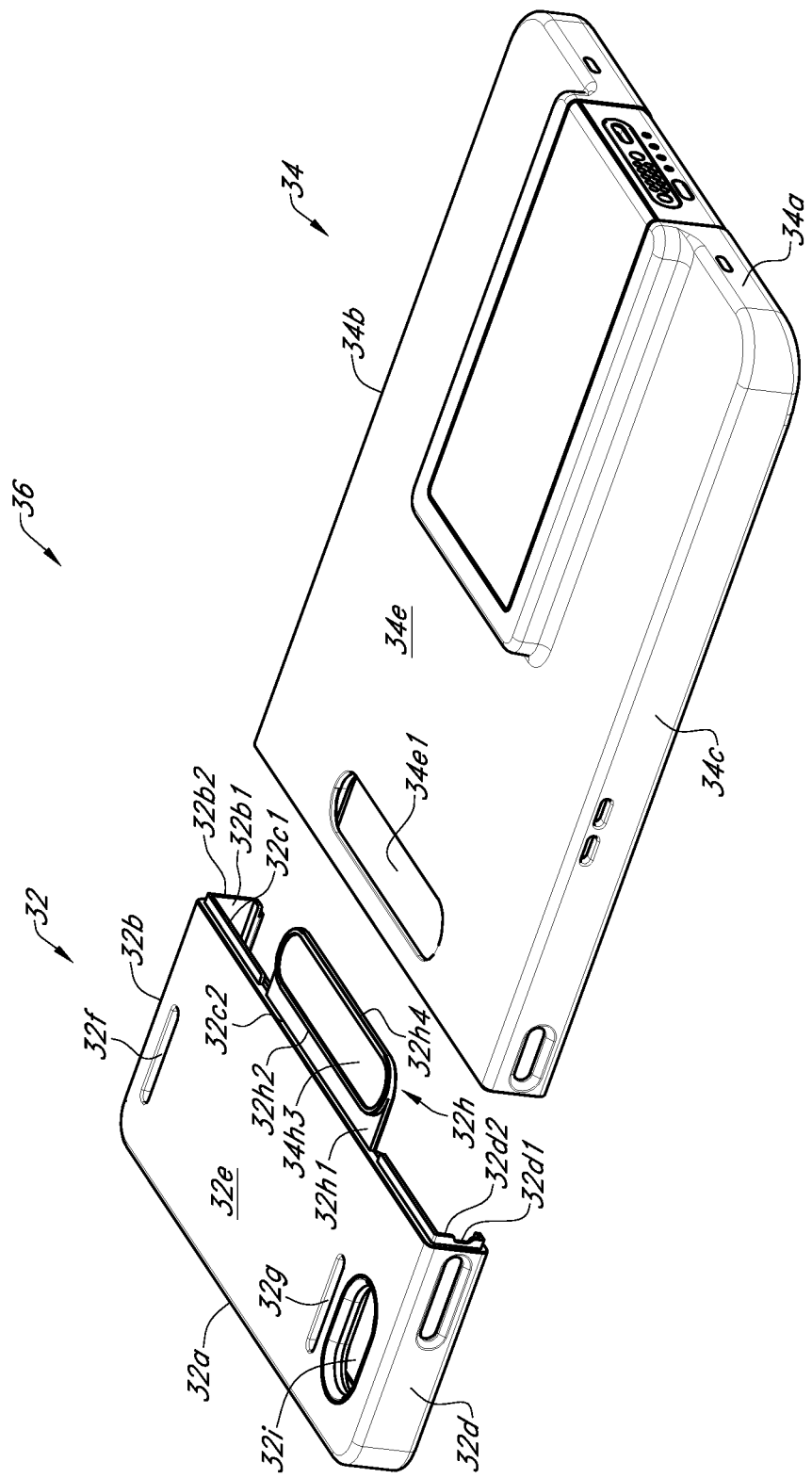
FIG. 39 is a partial-exploded-rear-bottom-perspective view of the case assembly of FIG. 24.

Turning to FIG. 39, depicted therein is a partial-exploded-rear-bottom-perspective view of device case assembly 30. Depicted implementation of cap assembly 32 is shown to include elongated groove 32*b*l.

Figure 40:
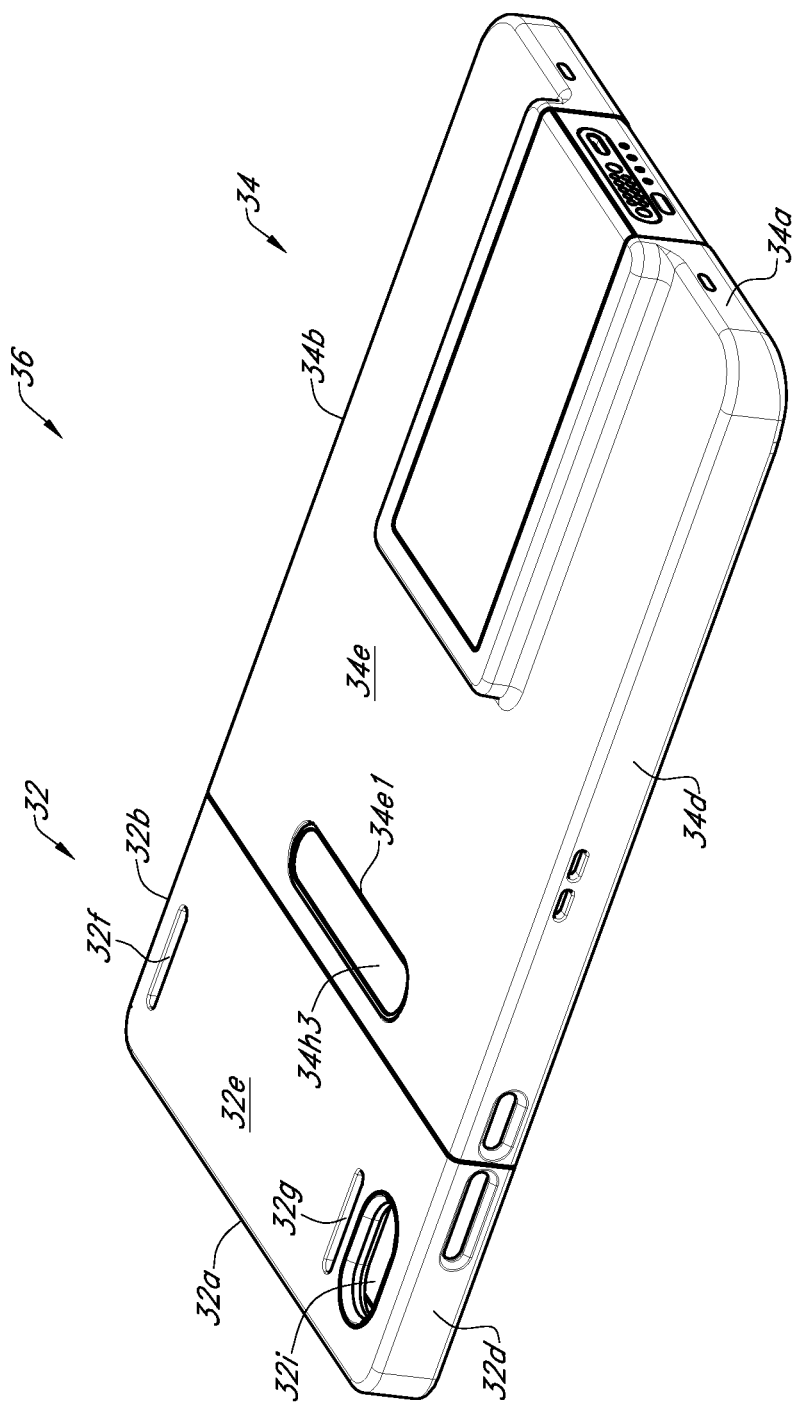
FIG. 40 is a rear-bottom-perspective view of the case assembly of FIG. 24.

Turning to FIG. 40, depicted therein is a rear-bottom-perspective view of device case assembly 30.

Figure 41:
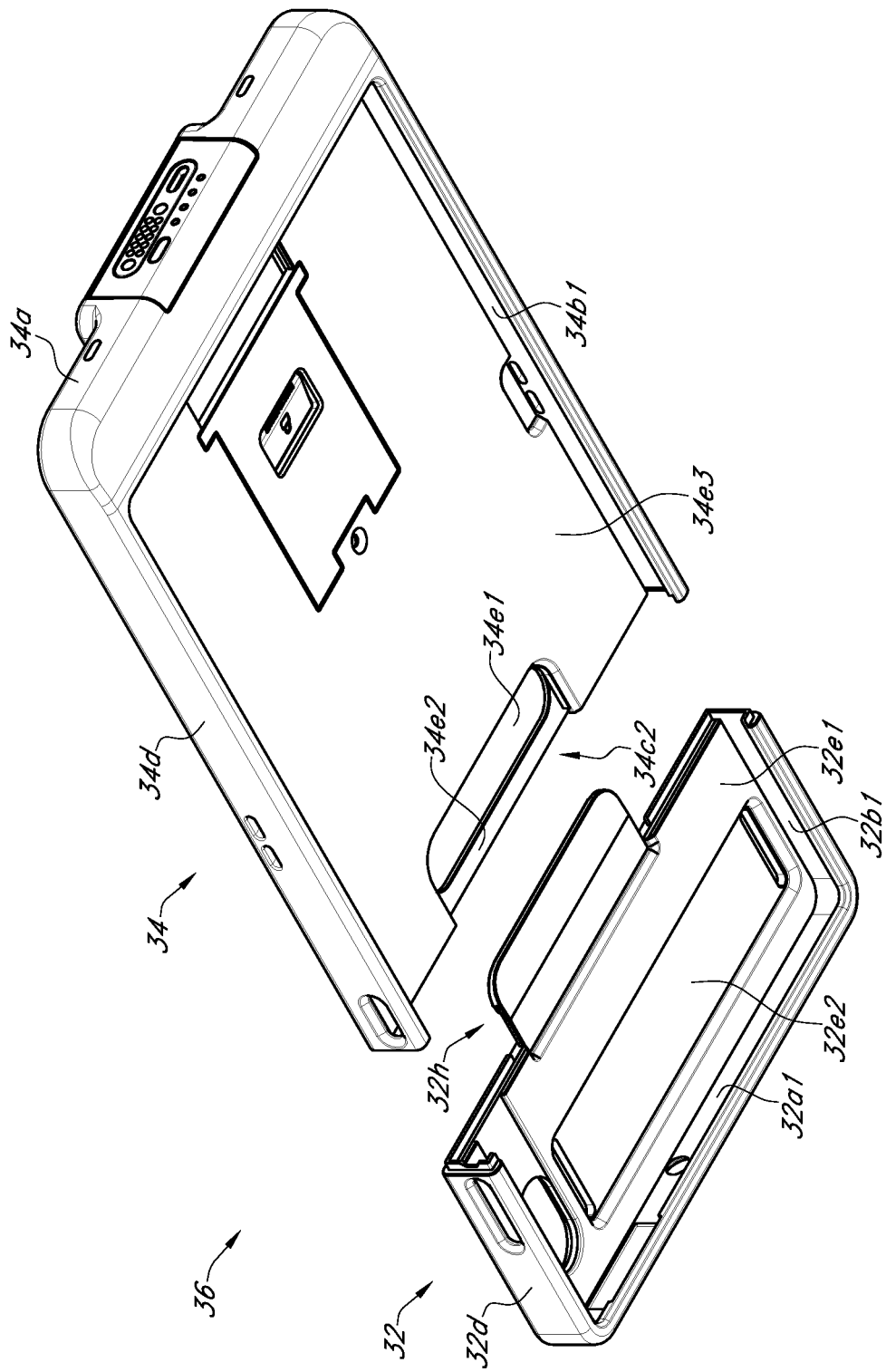
FIG. 41 is a partial-exploded-rear-top-perspective view of a portion of the case assembly of FIG. 24.

Turning to FIG. 41, depicted therein is a partial-exploded-rear-top-perspective view of a portion of device case assembly 30. Depicted implementation of main assembly 34 is shown to include elongated groove 34*b*1, recessed portion 34*e*2, and raised portion 34*e*3.

Figure 42:
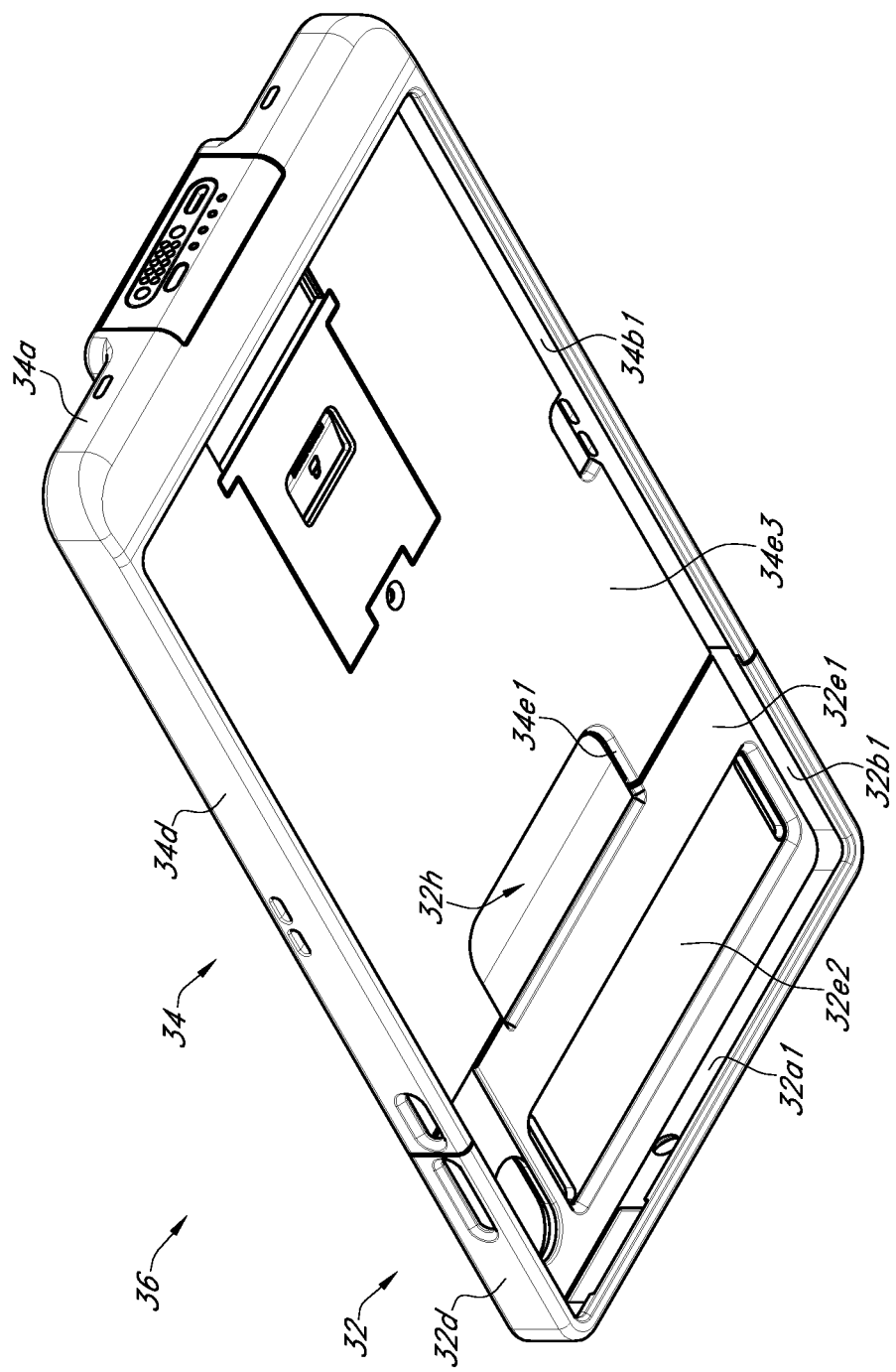
FIG. 42 is a rear-top-perspective view of the case assembly of FIG. 24.

Turning to FIG. 42, depicted therein is a rear-top-perspective view of device case assembly 30.

Figure 43:
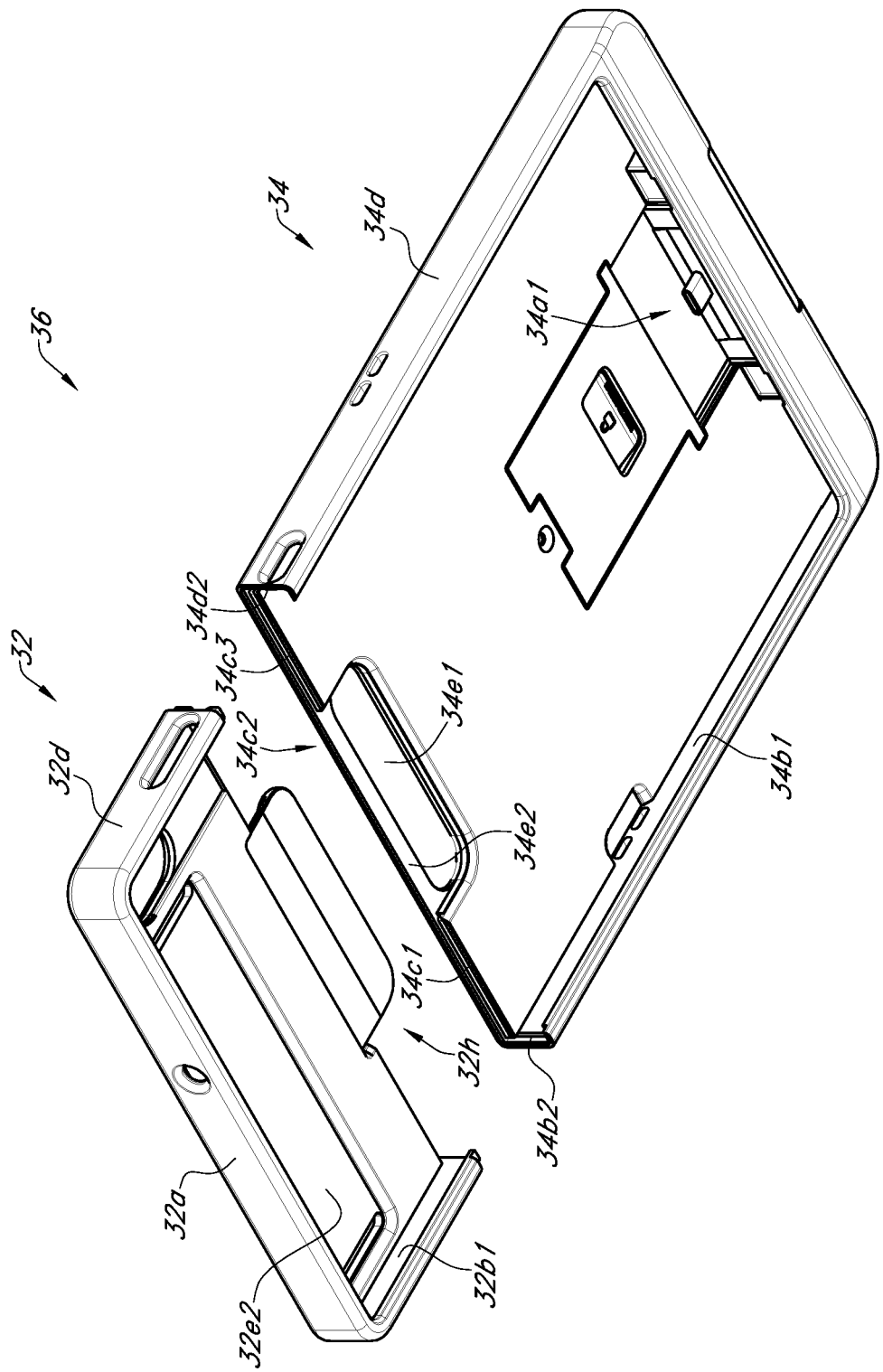
FIG. 43 is a partial-exploded-front-top-perspective view of the case assembly of FIG. 24.

Turning to FIG. 43, depicted therein is a partial-exploded-front-top-perspective view of device case assembly 30.

Figure 44:
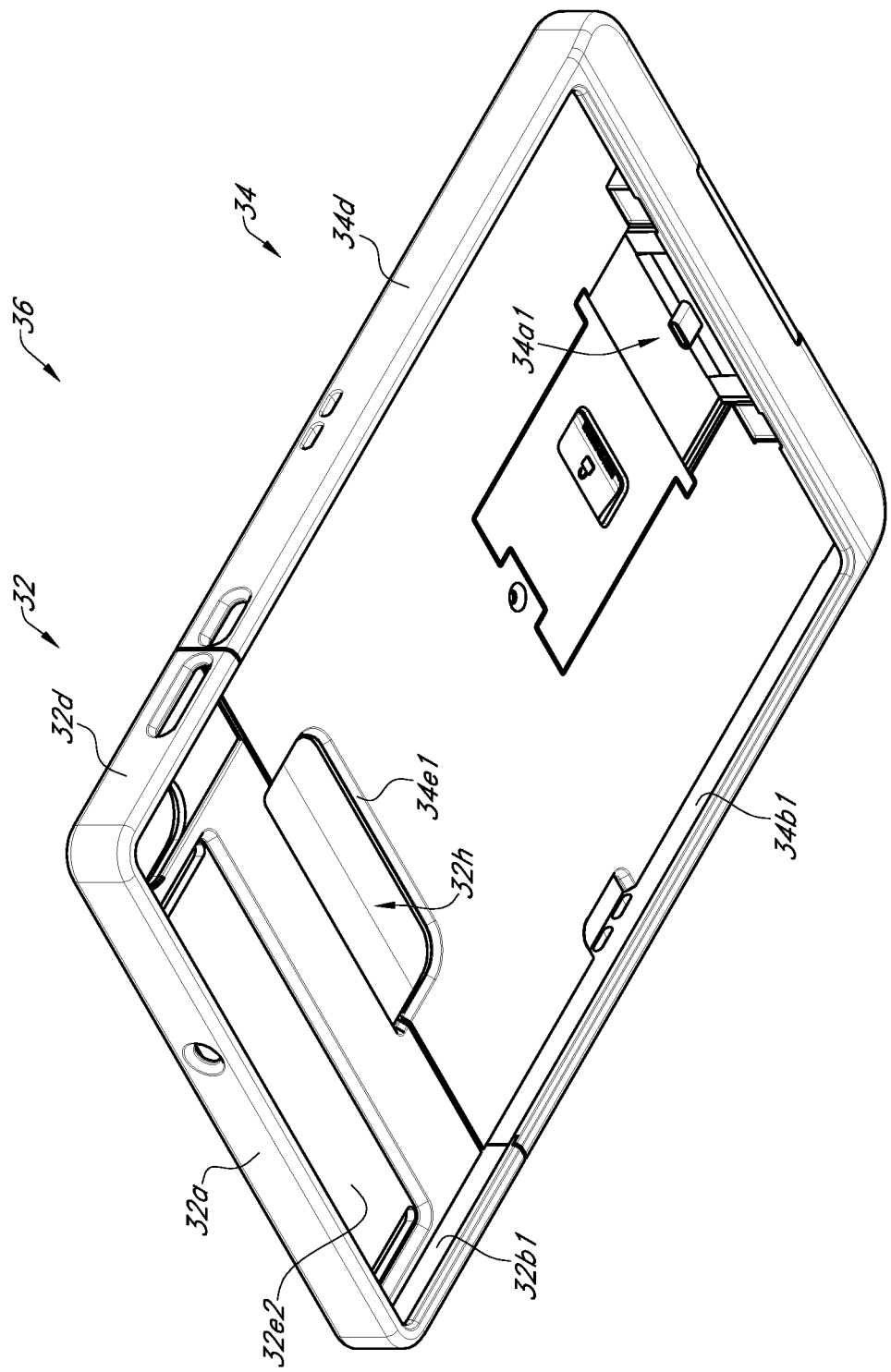
FIG. 44 is a front-top-perspective view of the case assembly of FIG. 24.

Turning to FIG. 44, depicted therein is a front-top-perspective view of device case assembly 30.

Figure 45:
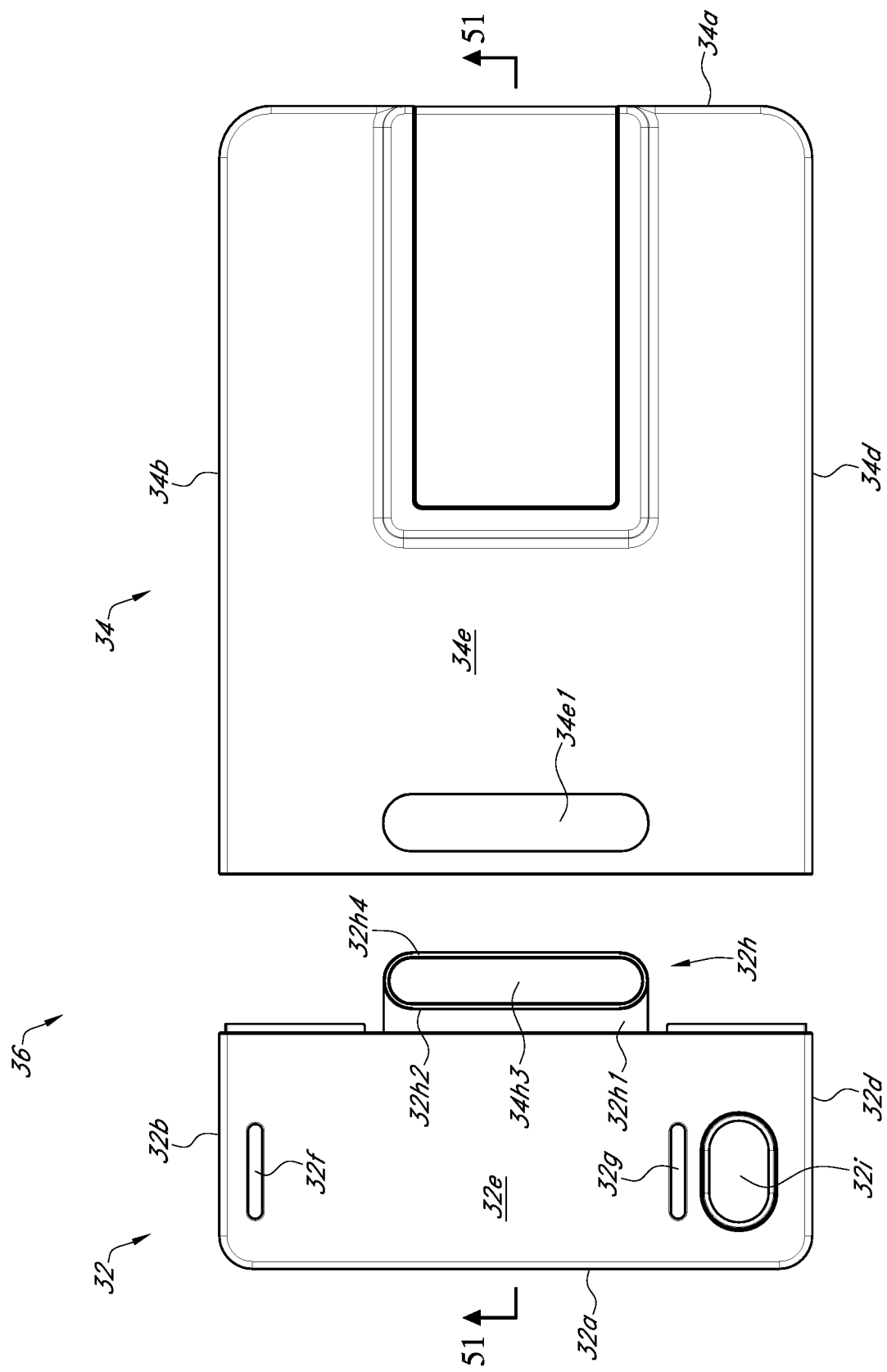
FIG. 45 is a partial-exploded-bottom-plan view of the case assembly of FIG. 24.

Turning to FIG. 45, depicted therein is a partial-exploded-bottom-plan view of device case assembly 30.

Figure 46:
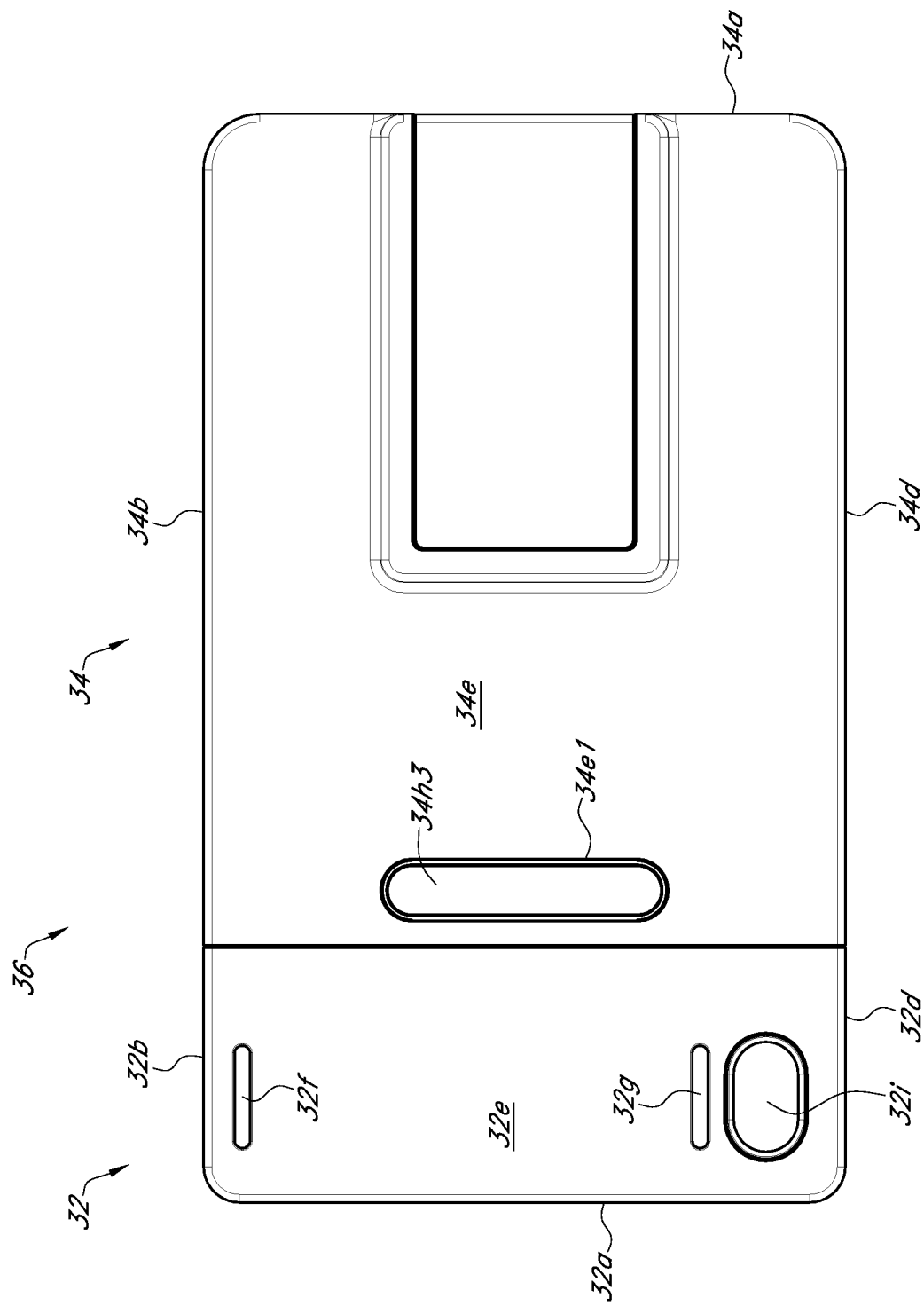
FIG. 46 is a bottom-plan view of the case assembly of FIG. 24.

Turning to FIG. 46, depicted therein is a bottom-plan view of device case assembly 30.

Figure 47:
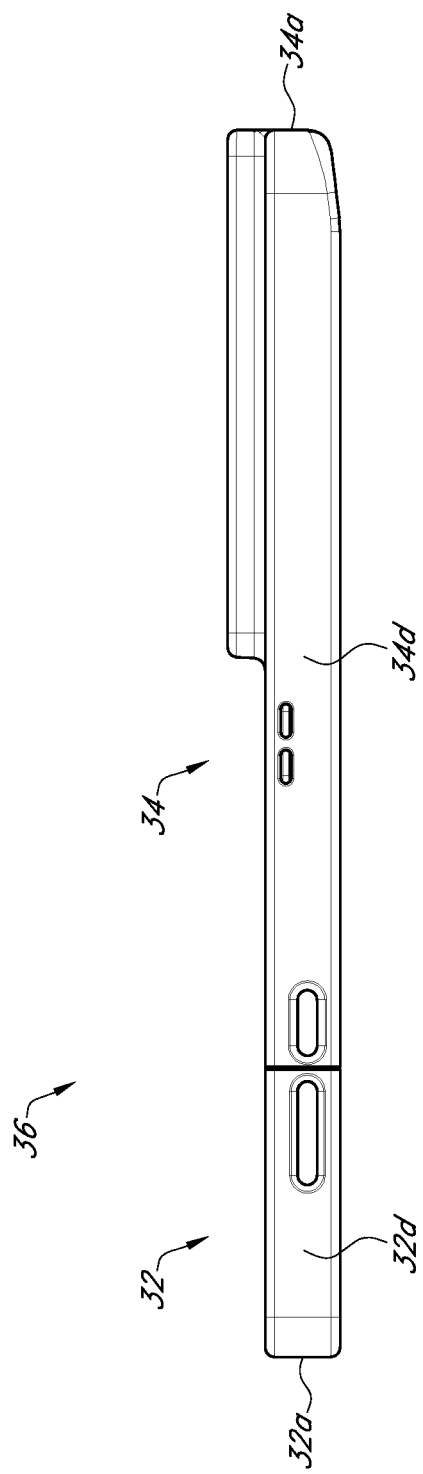
FIG. 47 is a side-elevational view of the case assembly of FIG. 24.

Turning to FIG. 47, depicted therein is a side-elevational view of device case assembly 30.

Figure 48:
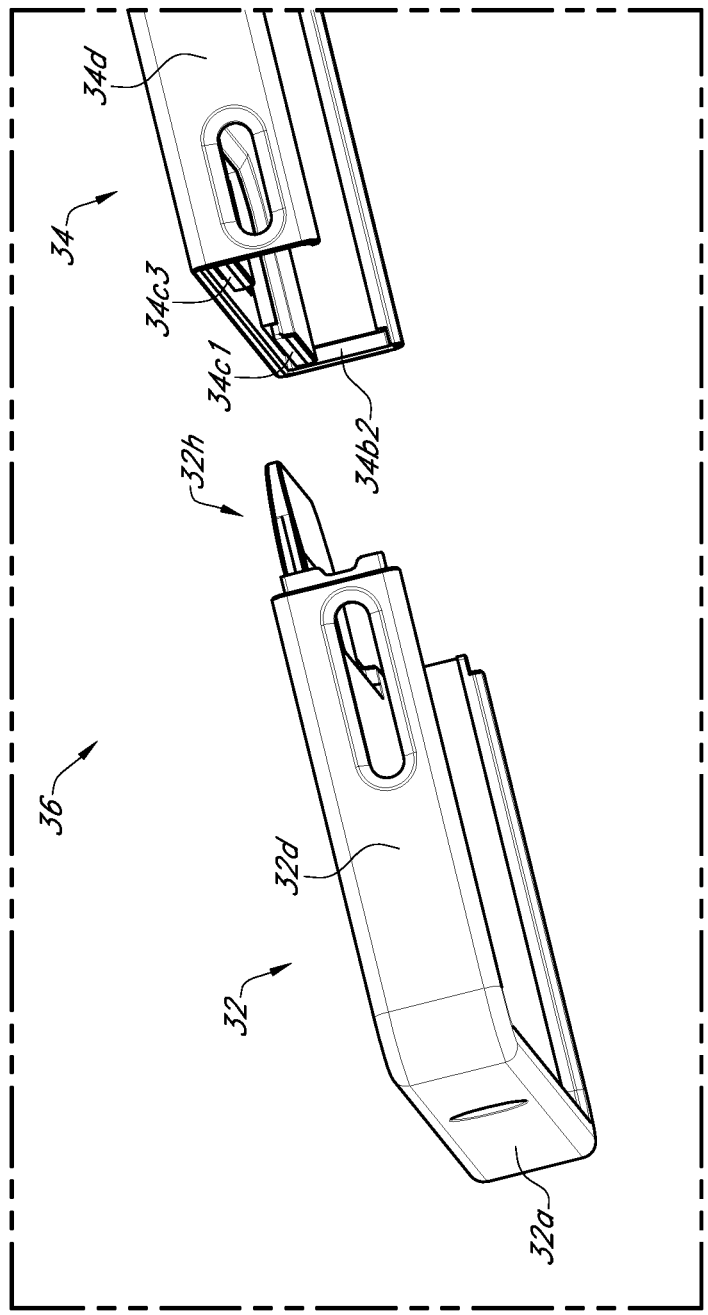
FIG. 48 is a partial-exploded-perspective view of a portion of the case assembly of FIG. 24.

Turning to FIG. 48, depicted therein is a partial-exploded-perspective view of a portion of device case assembly 30.

Figure 49:
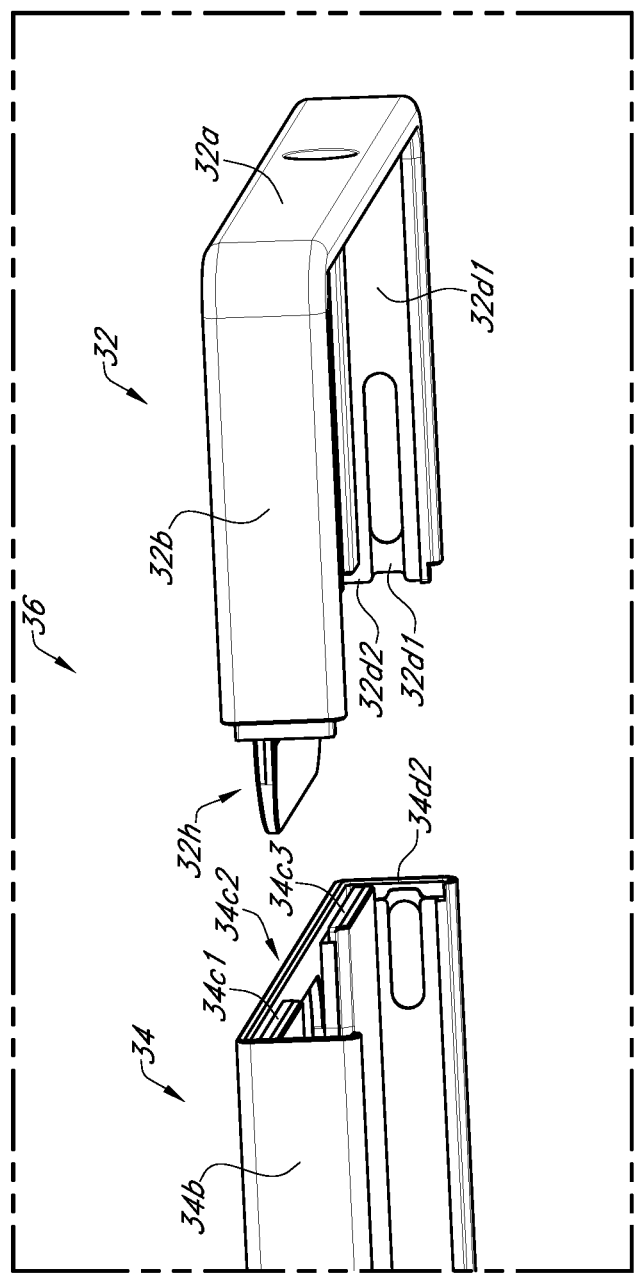
FIG. 49 is a partial-exploded-perspective view of a portion of the case assembly of FIG. 24.

Turning to FIG. 49, depicted therein is a partial-exploded-perspective view of a portion of device case assembly 30.

Figure 50:
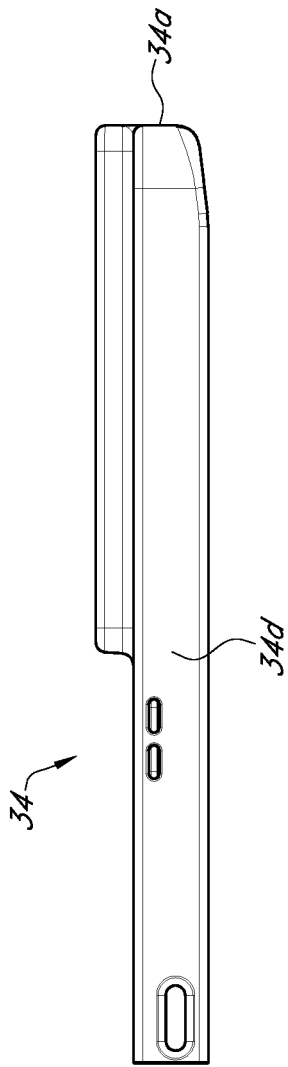
FIG. 50 is a partial-exploded-side-elevational view of the case assembly of FIG. 24.
Figure 50:
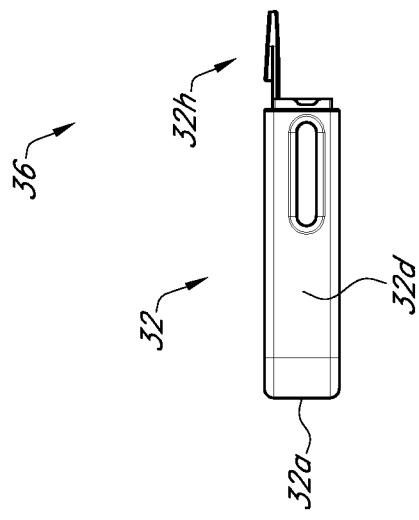

Turning to FIG. 50, depicted therein is a partial-exploded-side-elevational view of device case assembly 30.

Figure 51:
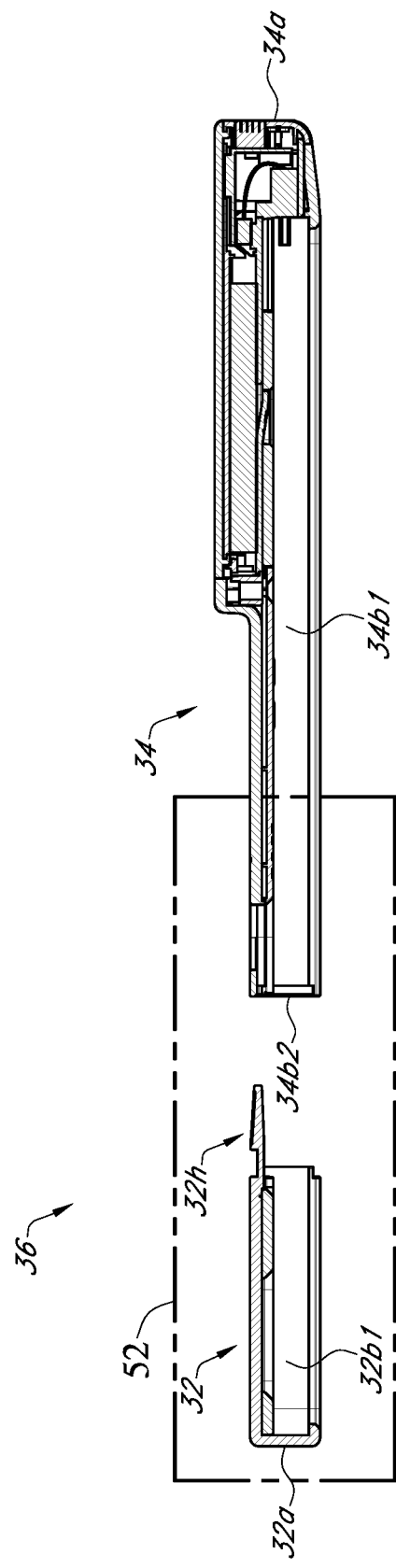
FIG. 51 is a cross-sectional-partial-exploded-side-elevational view of the case assembly of FIG. 24 taken along the 51-51 cutline of FIG. 45.

Turning to FIG. 51, depicted therein is a cross-sectional-partial-exploded-side-elevational view of device case assembly 30 taken along the 51-51 cutline of FIG. 45.

Figure 52:
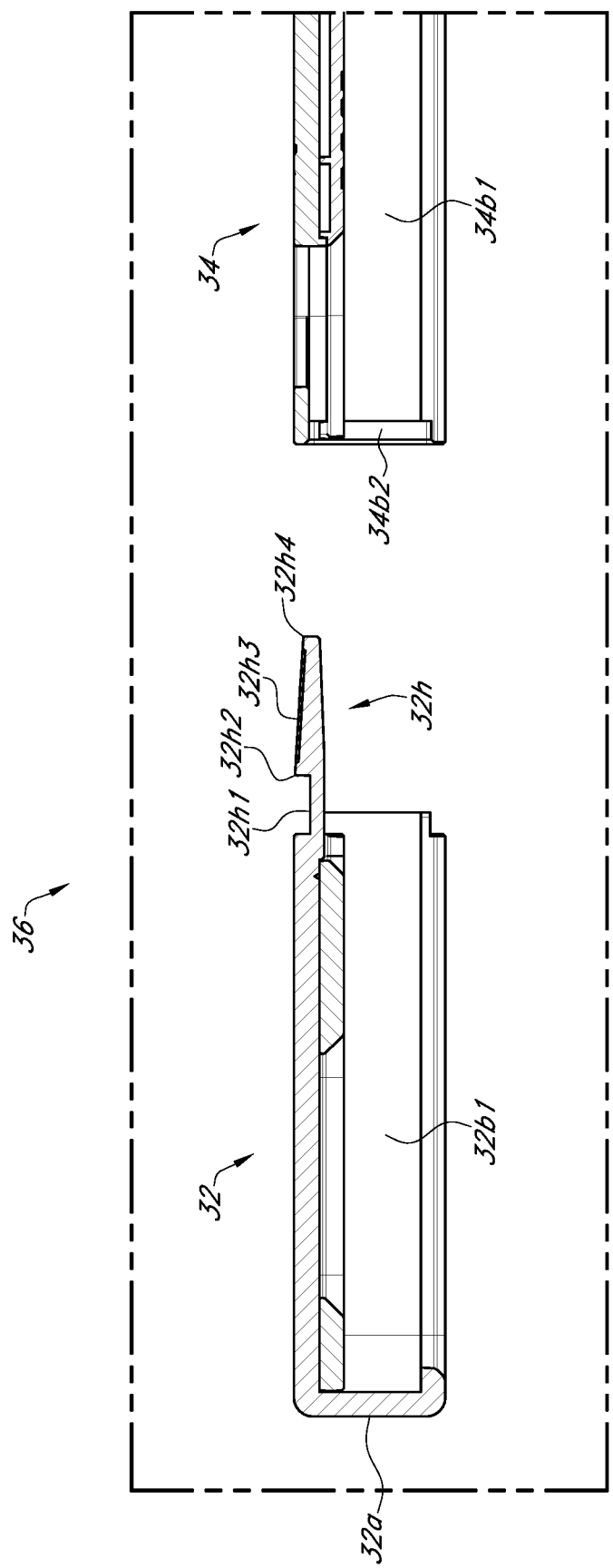
FIG. 52 is an enlarged portion identified by the "52" demarcated area of FIG. 51 of cross-sectional-partial-exploded-side-elevational view of the case assembly of FIG. 24 taken along the 51-51 cutline of FIG. 45.

Turning to FIG. 52, depicted therein is an enlarged portion identified by the "52" demarcated area of FIG. 51 of cross-sectional-partial-exploded-side-elevational view of device case assembly 30 taken along the 51-51 cutline of FIG. 45.

Figure 53:
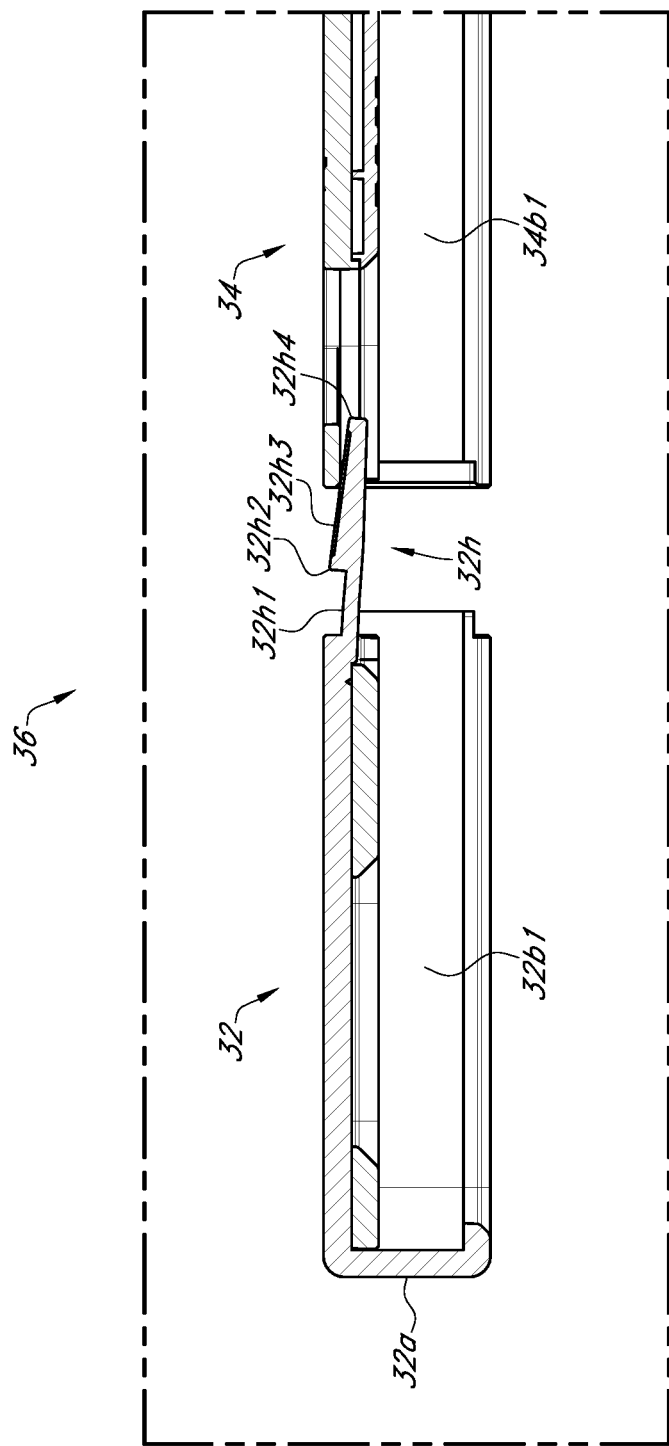
FIG. 53 is an enlarged portion of cross-sectional-partial-engaged-side-elevational view of the case assembly of FIG. 24 taken along the 51-51 cutline of FIG. 45.

Turning to FIG. 53, depicted therein is an enlarged portion of cross-sectional-partial-engaged-side-elevational view of device case assembly 30 taken along the 51-51 cutline of FIG. 45.

Figure 54:
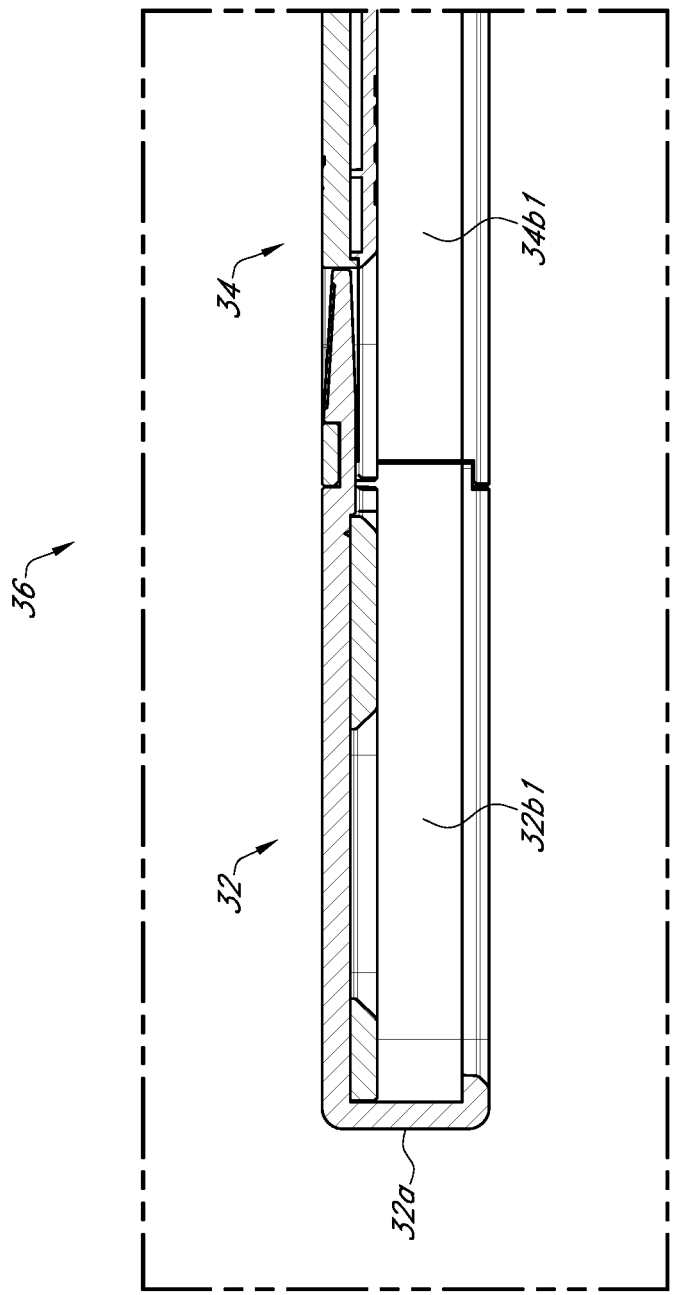
FIG. 54 is an enlarged portion of cross-sectional-engaged-side-elevational view of the case assembly of FIG. 24 taken along the 51-51 cutline of FIG. 45.

Turning to FIG. 54, depicted therein is an enlarged portion of cross-sectional-engaged-side-elevational view of device case assembly 30 taken along the 51-51 cutline of FIG. 45.

Figure 55:
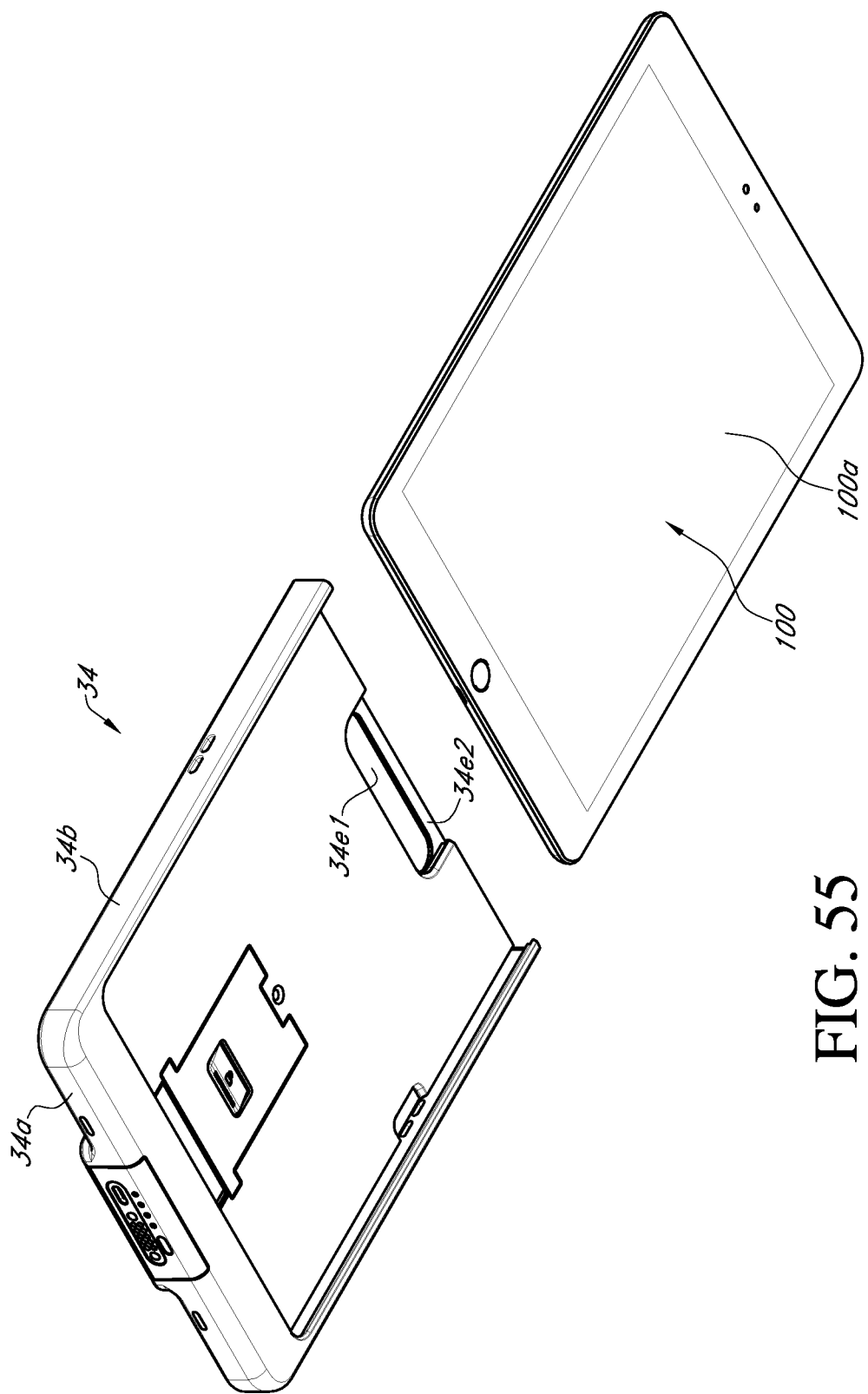
FIG. 55 is a front-rear perspective of a portion of the case assembly of FIG. 24 and the electronic device of FIG. 30.

Turning to FIG. 55, depicted therein is a front-rear-perspective of a portion of device case assembly 30 and portable electronic device 100.

Figure 56:
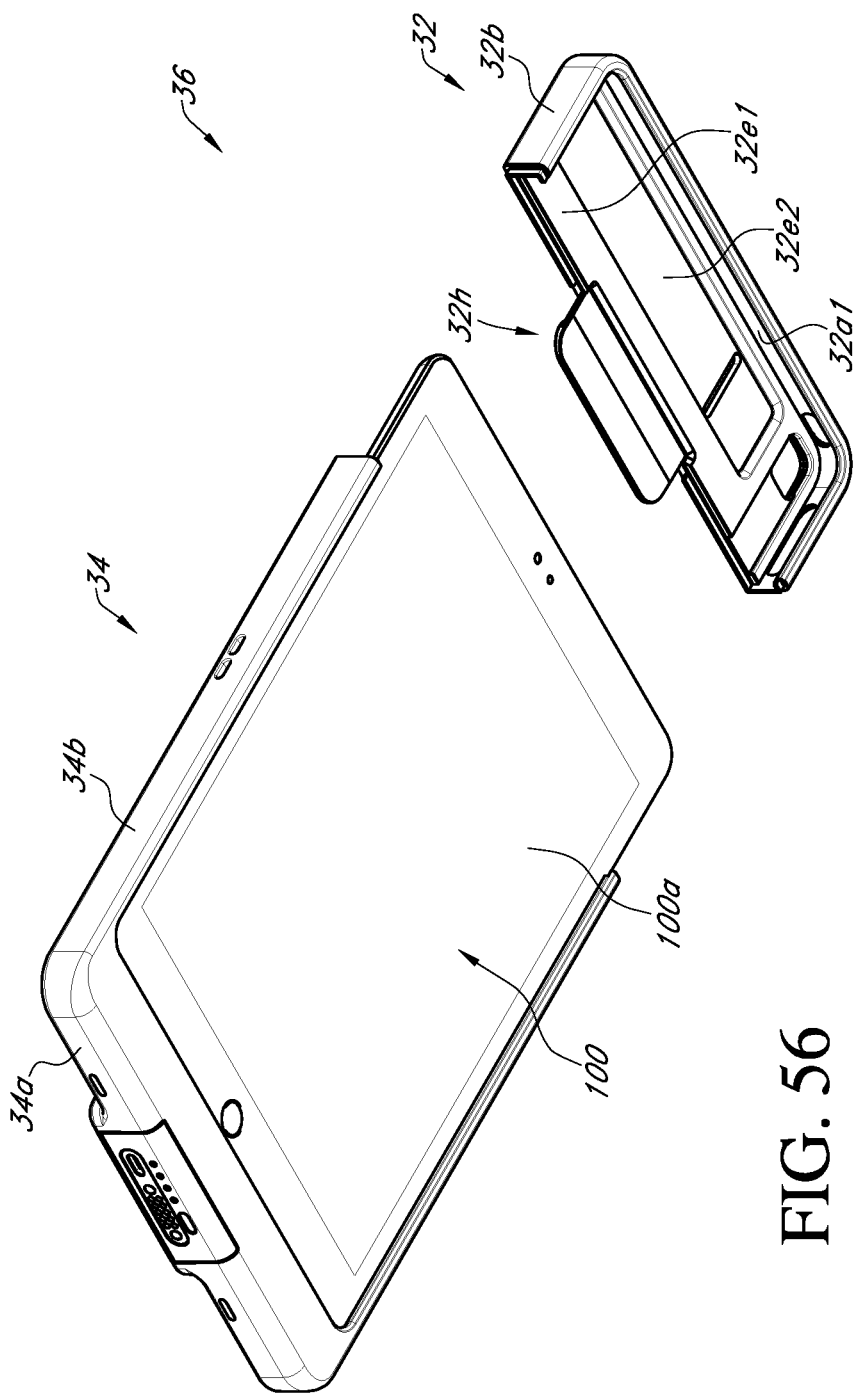
FIG. 56 is a front-rear perspective of a portion of the case assembly of FIG. 24 and the electronic device of FIG. 30.

Turning to FIG. 56, depicted therein is a front-rear-perspective of a portion of device case assembly 30 and portable electronic device 100.

Figure 57:
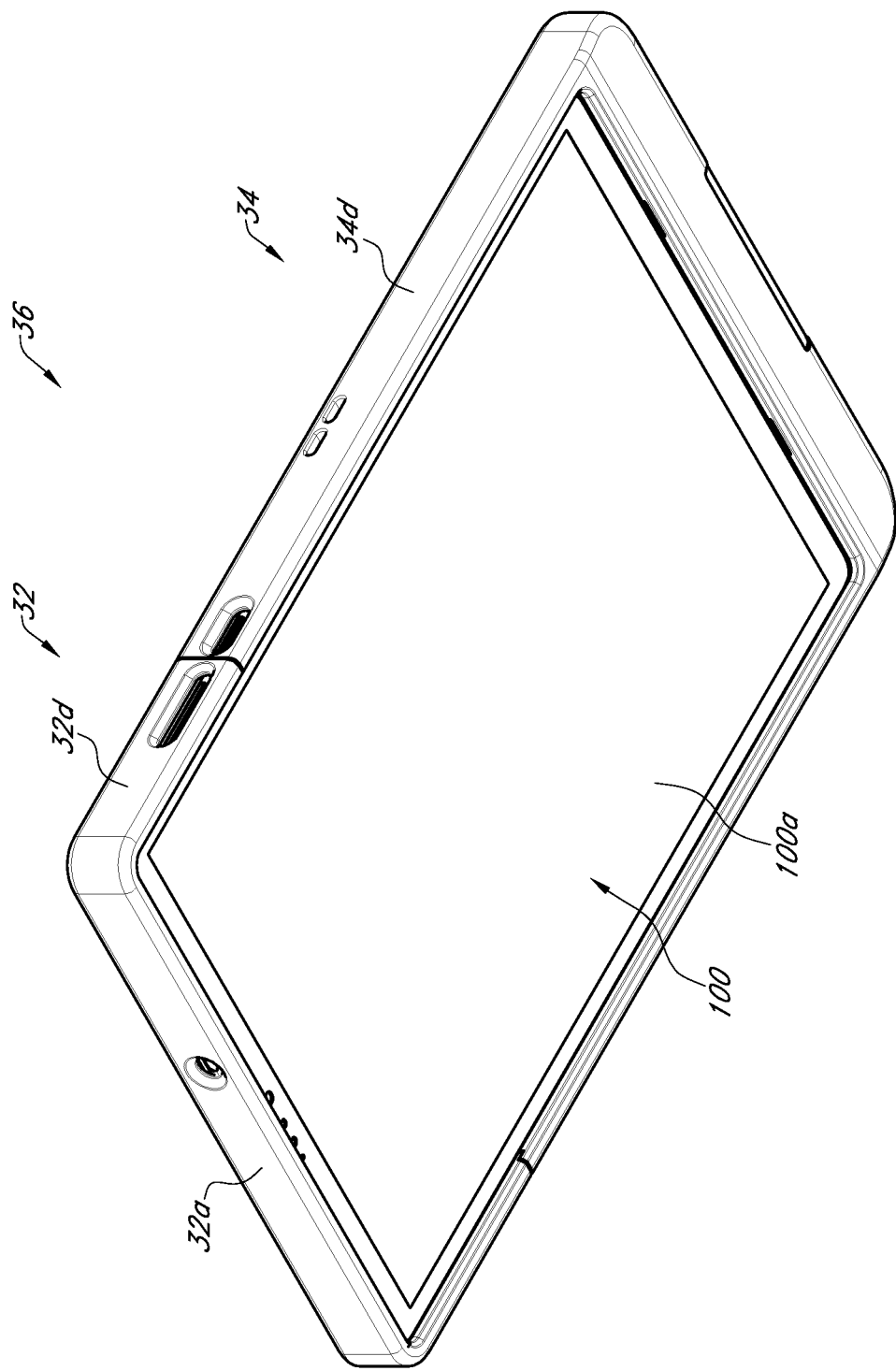
FIG. 57 is a front-rear perspective of a portion of the case assembly of FIG. 24 and the electronic device of FIG. 30.

Turning to FIG. 57, depicted therein is a front-rear-perspective of a portion of device case assembly 30 and portable electronic device 100.

Figure 58:
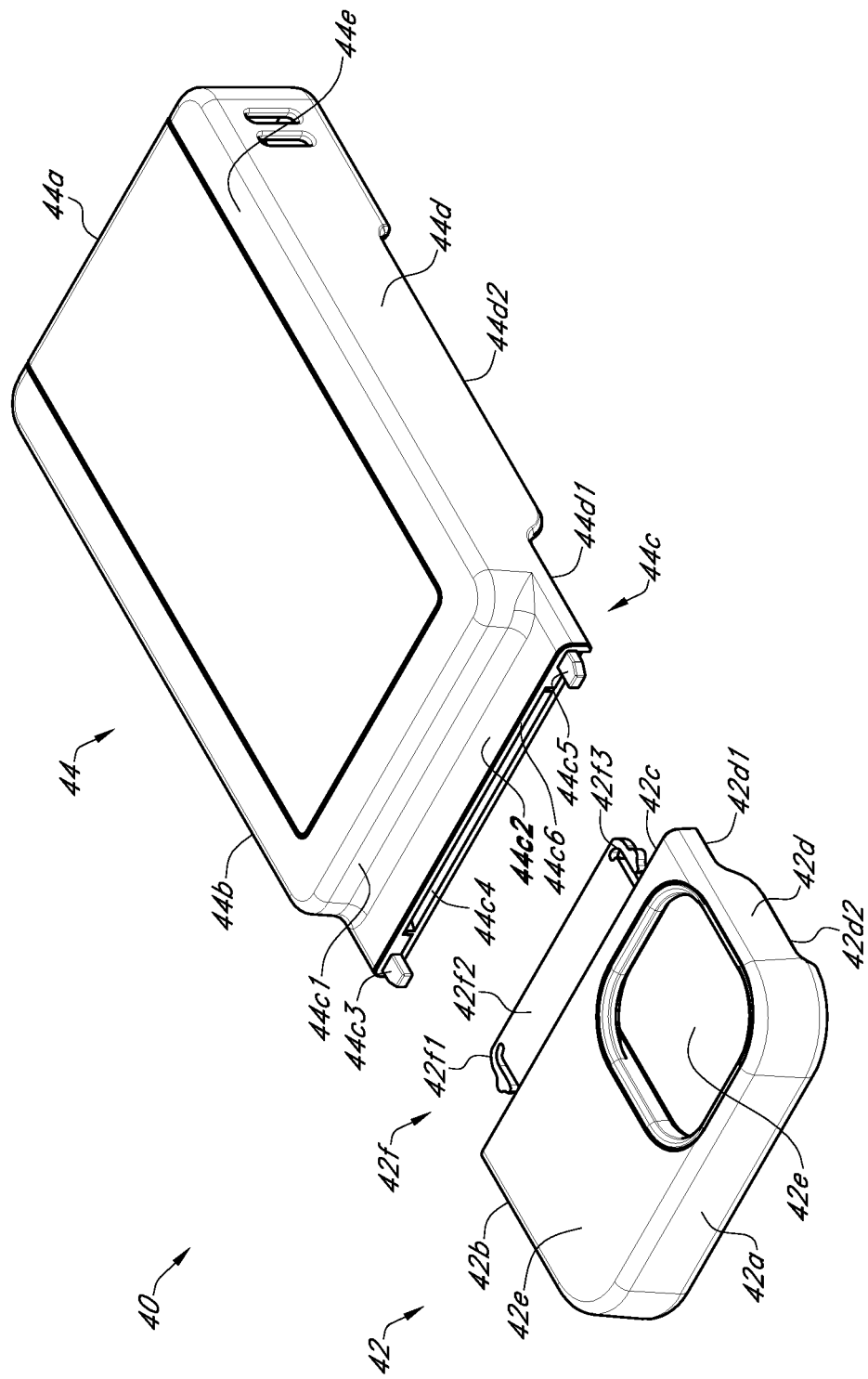
FIG. 58 is a partial-exploded-front-bottom-perspective view of a case assembly.

Turning to FIG. 58, depicted therein is a partial-exploded-front-bottom-perspective view of case assembly 40. Depicted implementation of case assembly 40 is shown to include cap assembly 42, and main assembly 44. Depicted implementation of cap assembly 42 is shown to include side wall 42*a*, side wall 42*b*, edge 42*c*, side wall 42*d*, aperture 42*e*, and tab member 42*f*. Depicted implementation of side wall 42*d* is shown to include recess 42*d*1, and recess 42*d*2. Depicted implementation of tab member 42*f* is shown to include tab body 42*f*2 with semi-flexible protrusion 42*f*1 and semi-flexible protrusion 42*f*3 extending therefrom. Depicted implementation of main assembly 44 is shown to include side wall 44*a*, side wall 44*b*, side assembly 44*c*, side wall 44*d*, and base 44*e*. Depicted implementation of side assembly 44*c* is shown to include side wall portion 44*c*1, extended portion 44*c*2, protrusion 44*c*3, aperture 44*c*4, protrusion 44*c*5, and edge 44*c*6. Depicted implementation of side wall 44*d* is shown to include recess 44*d*1, and recess 44*d*2.

Figure 59:
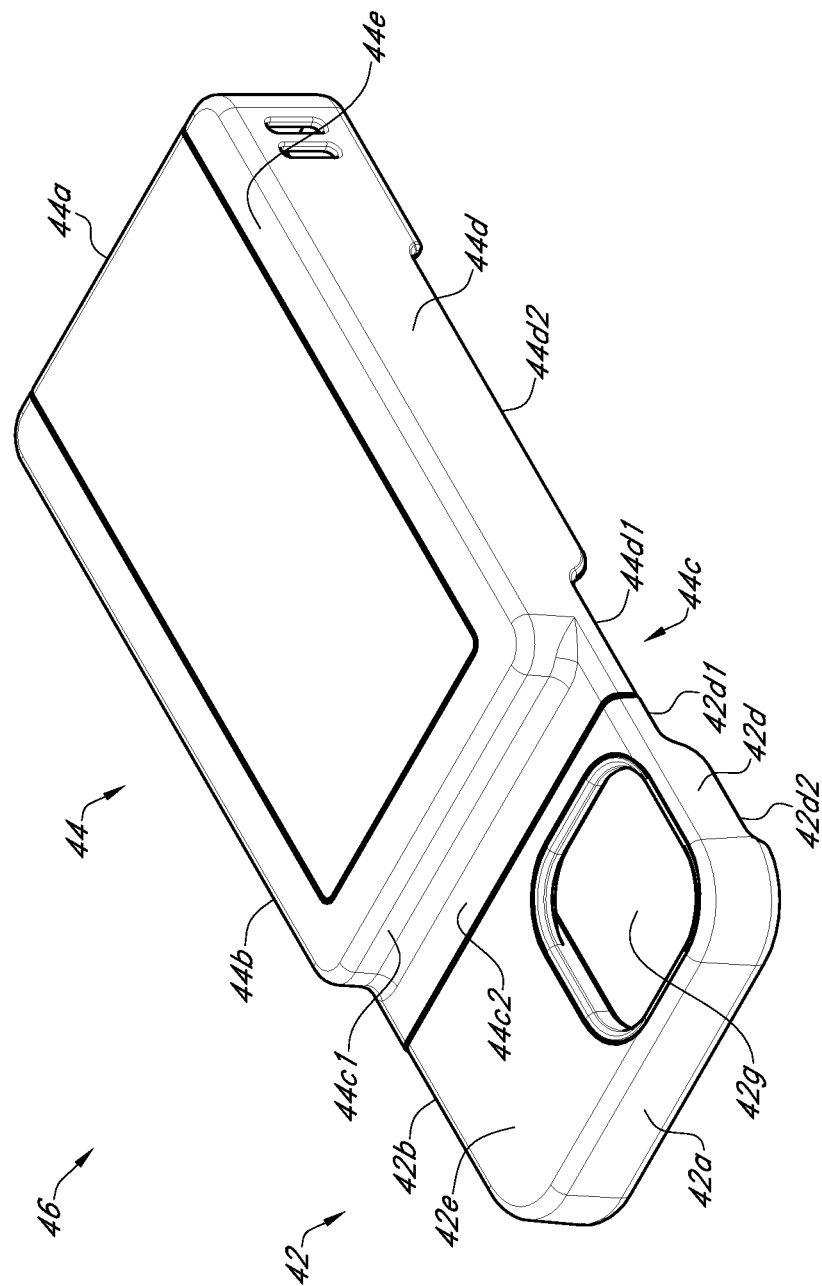
FIG. 59 is a front-bottom-perspective view of the case assembly of FIG. 58.

Turning to FIG. 59, depicted therein is a front-bottom-perspective view of case assembly 40.

Figure 60:
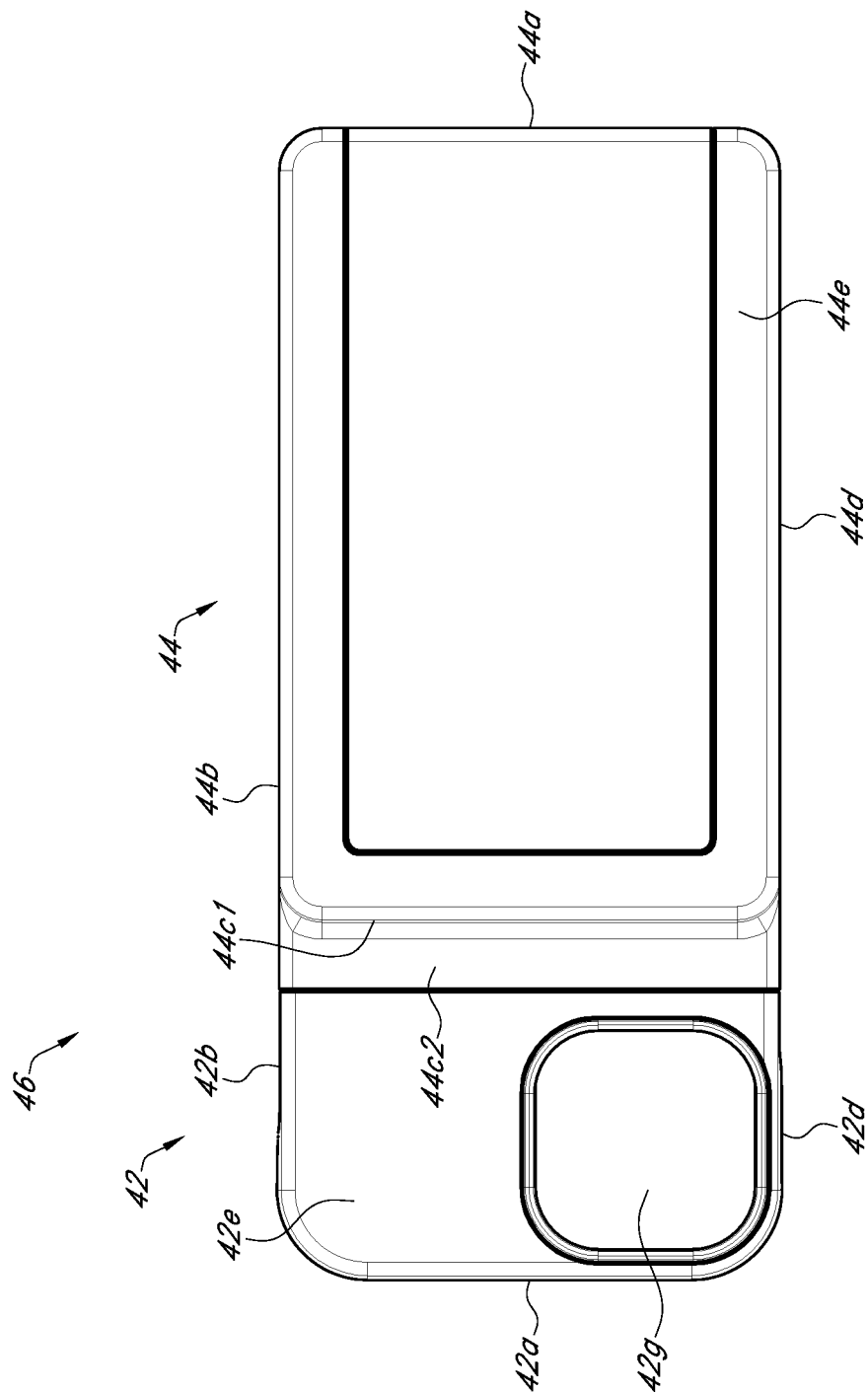
FIG. 60 is a bottom-plan view of the case assembly of FIG. 58.

Turning to FIG. 60, depicted therein is a bottom-plan view of case assembly 40.

Figure 61:
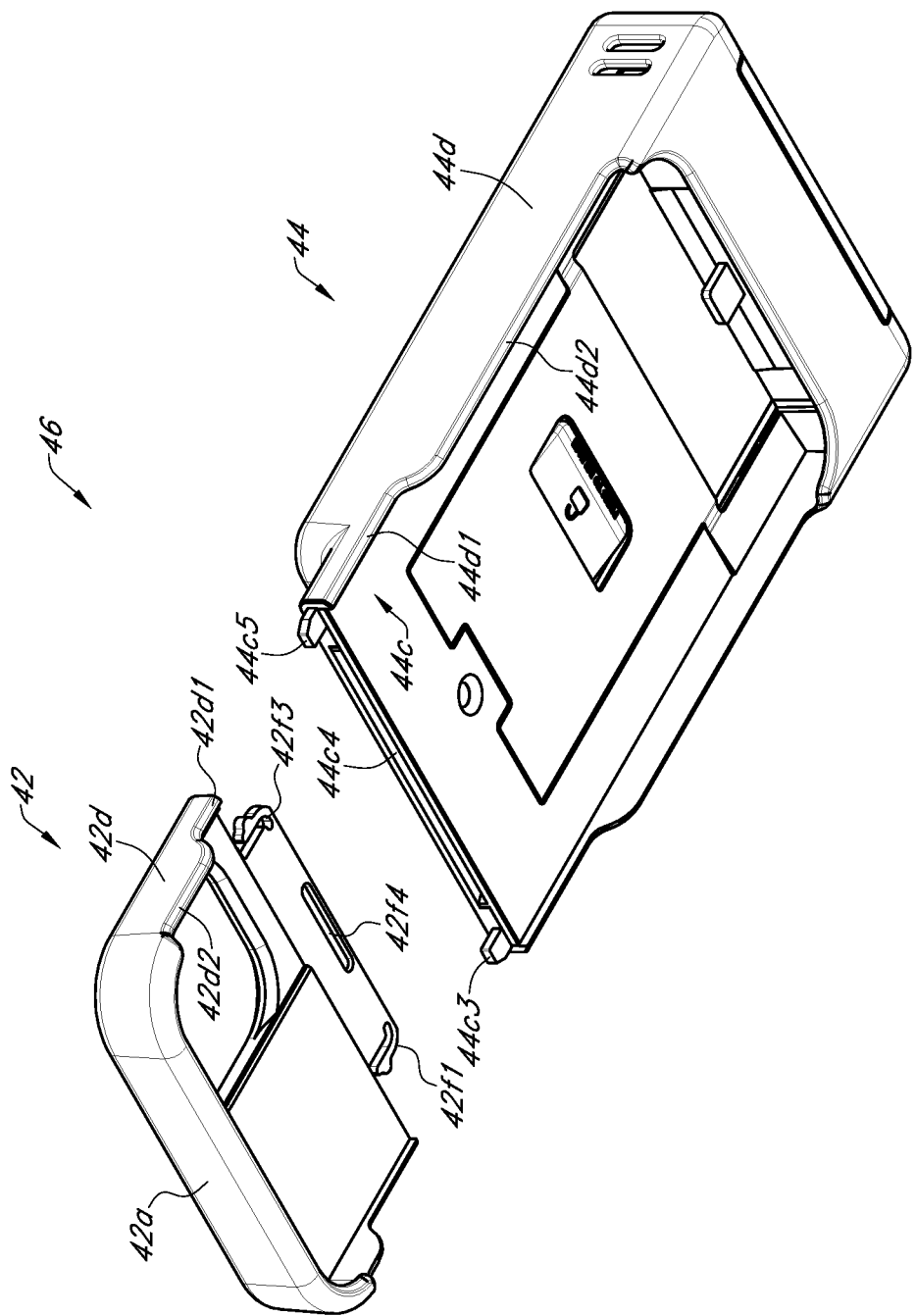
FIG. 61 is a partial-exploded-front-top-perspective view of the case assembly of FIG. 58.

Turning to FIG. 61, depicted therein is a partial-exploded-front-top-perspective view of case assembly 40. Depicted implementation of tab member 42*f* is shown to include recess 42*f*4.

Figure 62:
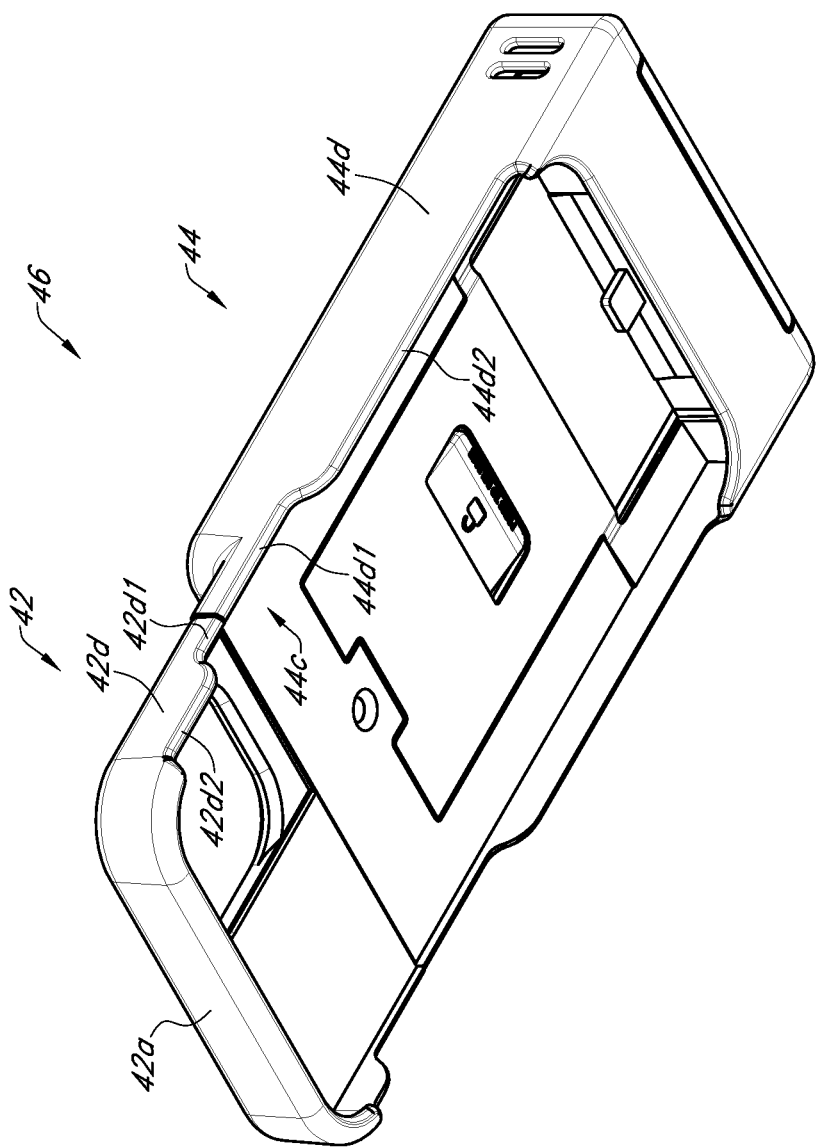
FIG. 62 is a front-top-perspective view of the case assembly of FIG. 58.

Turning to FIG. 62, depicted therein is a front-top-perspective view of case assembly 40.

Figure 63:
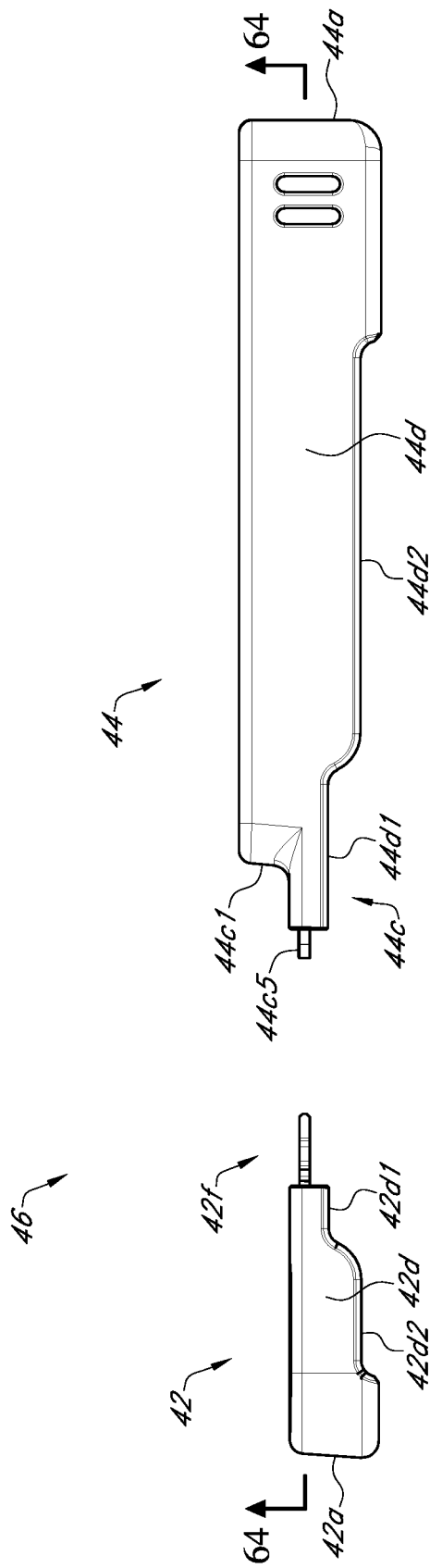
FIG. 63 is a partial-exploded-side-elevational view of the case assembly of FIG. 58.

Turning to FIG. 63, depicted therein is a partial-exploded-side-elevational view of case assembly 40.

Figure 64:
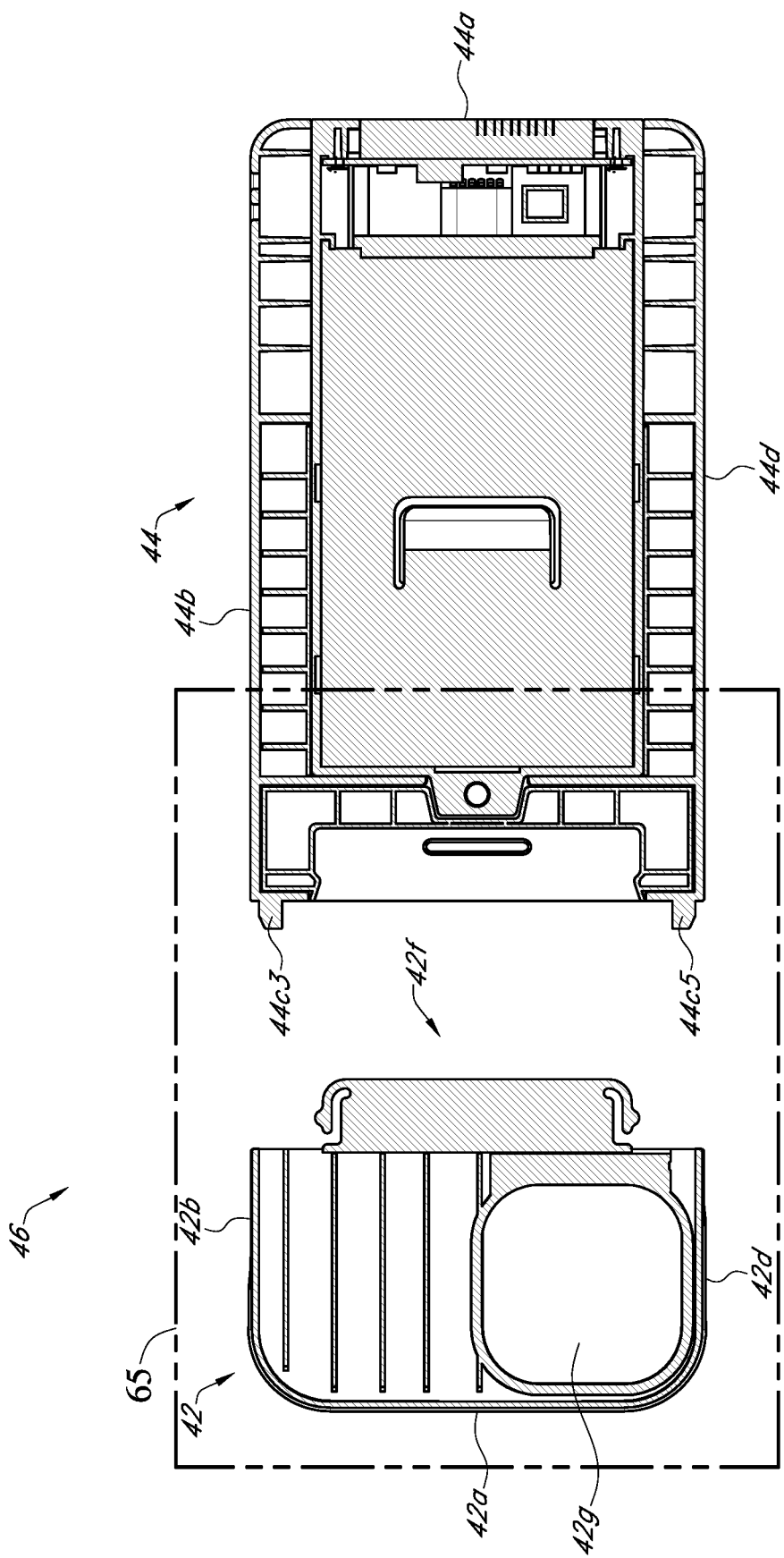
FIG. 64 is a partial-exploded-cross-sectional-bottom-plan view of the case assembly of FIG. 58 taken along the 64-64 cutline of FIG. 63.

Turning to FIG. 64, depicted therein is a partial-exploded-cross-sectional-bottom-plan view of case assembly 40 taken along the 64-64 cutline of FIG. 63.

Figure 65:
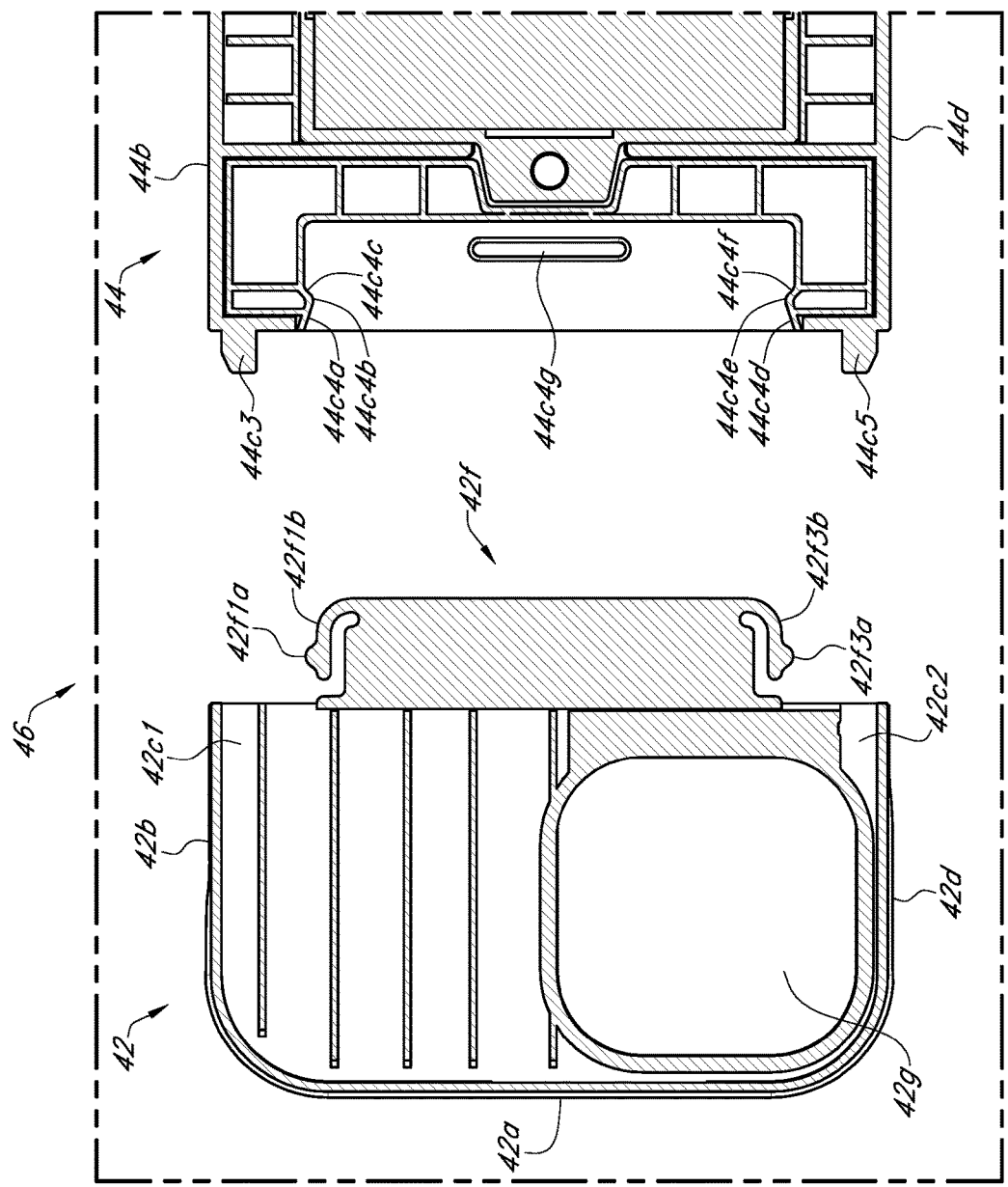
FIG. 65 is a portion of the partial-exploded-cross-sectional-bottom-plan view of the case assembly of FIG. 58 taken along the 65 dashed-line area of FIG. 64.

Turning to FIG. 65, depicted therein is a portion of the partial-exploded-cross-sectional-bottom-plan view of case assembly 40 taken along the 65 dashed-line area of FIG. 64. Depicted implementation of edge 42*c* is shown to include aperture 42*c*1, and aperture 42*c*2. Depicted implementation of tab member 42*f* is shown to include barb 42*f*1*a*, curvilinear member 42*f*1*b*, barb 42*f*3*a*, and curvilinear member 42*f*3*b*.

Depicted implementation of aperture 44*c*4 is shown to include front slope 44*c*4*a*, peak 44*c*4*b*, rear slope 44*c*4*c*, front slope 44*c*4*d*, peak 44*c*4*e*, rear slope 44*c*4*f*, and protrusion 44*c*4*g*. As depicted, aperture 44*c*4 is configured to receive semi-flexible protrusion 42*f*1, tab body 42*f*2, and semi-flexible protrusion 42*f*3 of tab member 42*f* when cap assembly 42 and main assembly 44 are coupled together.

Figure 66:
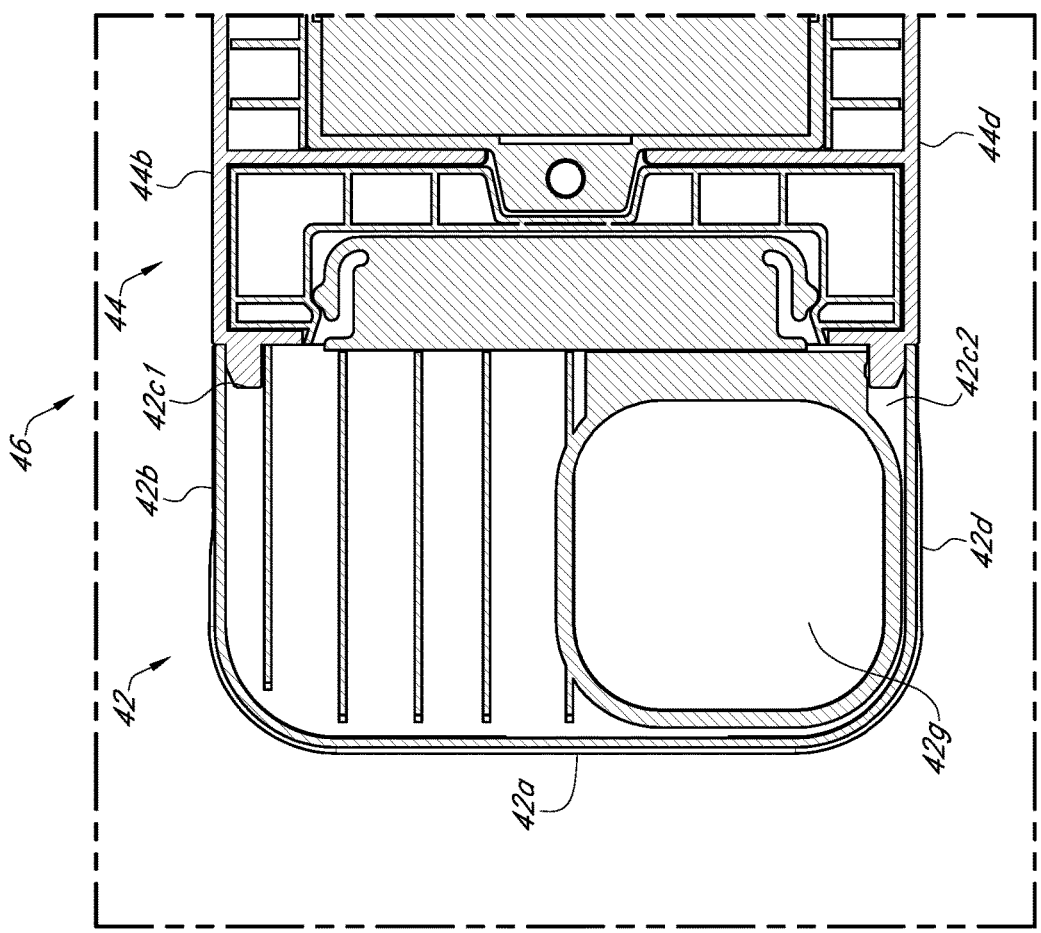
FIG. 66 is a cross-sectional-bottom-plan view of a portion of the case assembly of FIG. 58.

Turning to FIG. 66, depicted therein is a cross-sectional-bottom-plan view of a portion of case assembly 40.

Figure 67:
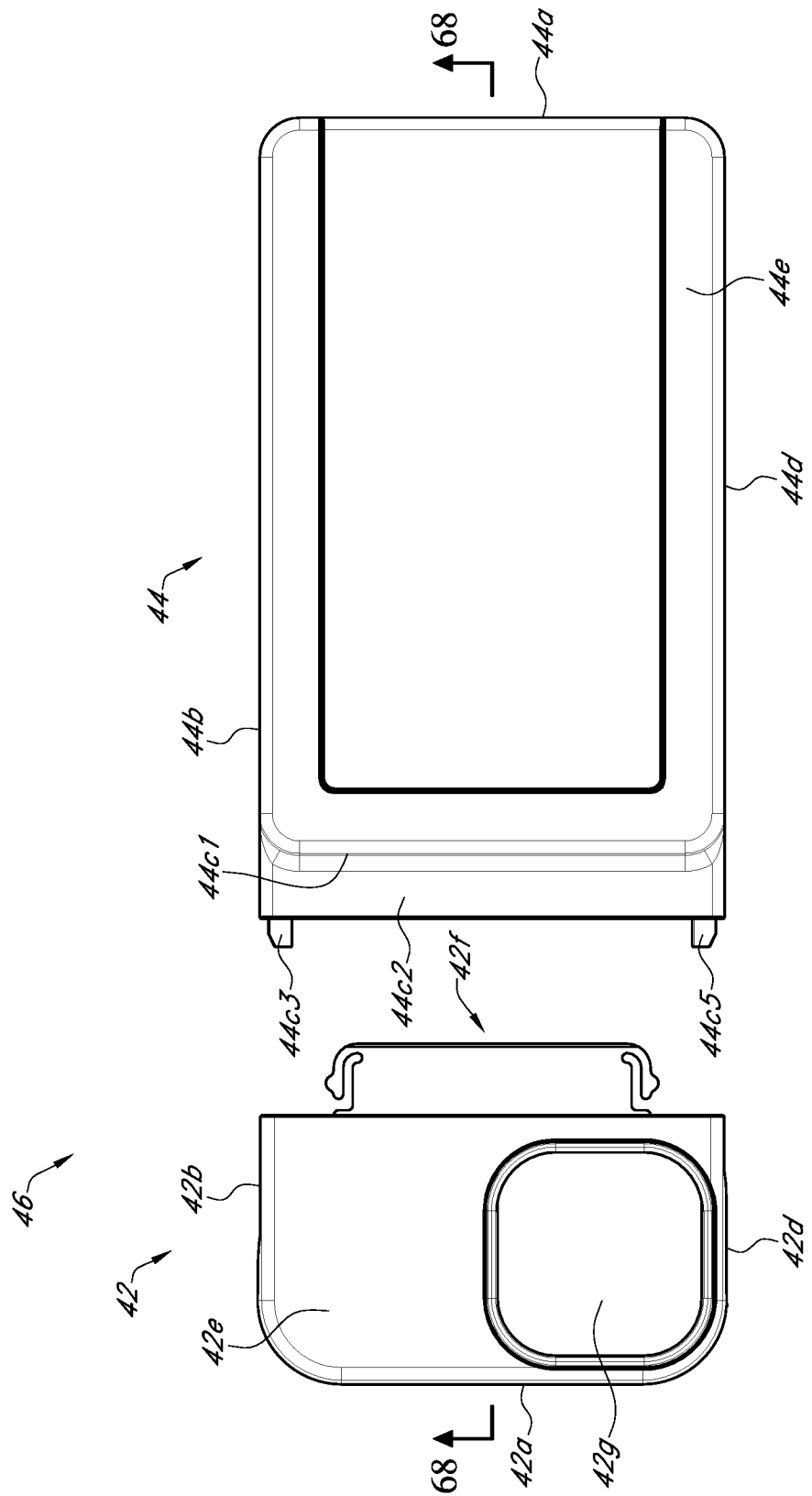
FIG. 67 is a portion of a bottom-plan view of the case assembly of FIG. 58 of FIG. 64.

Turning to FIG. 67, depicted therein is a portion of a bottom-plan view of case assembly 40.

Figure 68:
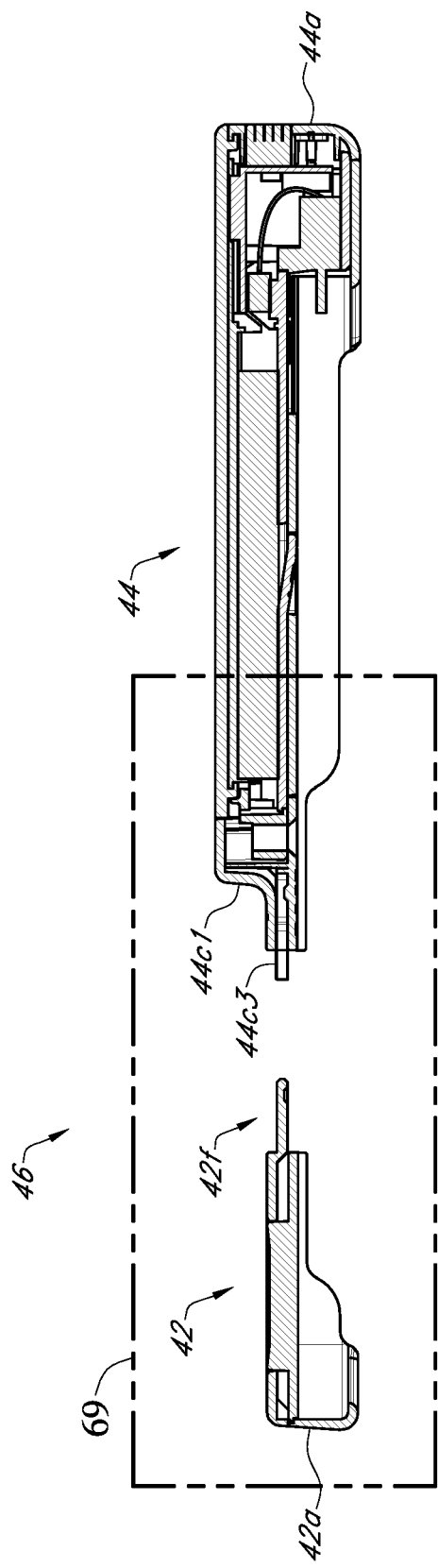
FIG. 68 is a partial-exploded-cross-sectional-side-elevational view of the case assembly of FIG. 58 taken along the 68-68 cutline of FIG. 67.

Turning to FIG. 68, depicted therein is a partial-exploded-cross-sectional-side-elevational view of case assembly 40 taken along the 68-68 cutline of FIG. 67.

Figure 69:
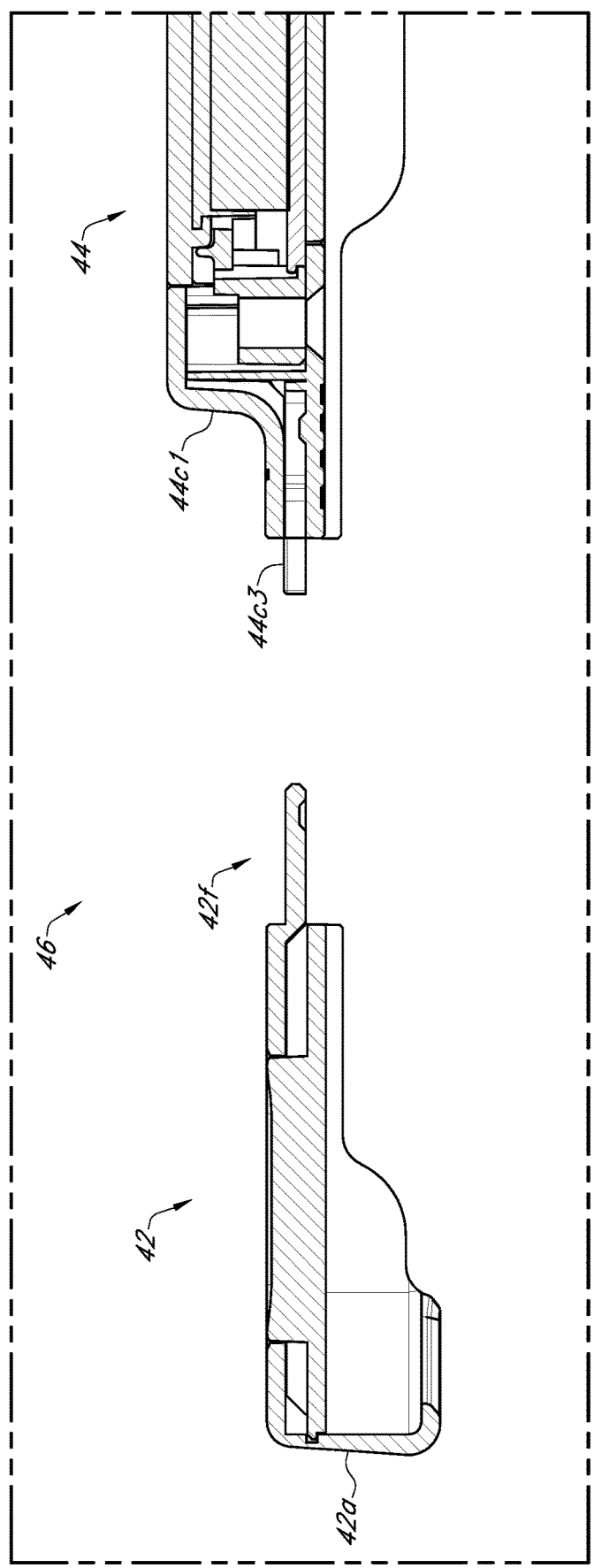
FIG. 69 is a portion of the partial-exploded-cross-sectional-side-elevational view of the case assembly of FIG. 58 taken along the 69 dashed-line area of FIG. 68.

Turning to FIG. 69, depicted therein is a portion of the partial-exploded-cross-sectional-side-elevational view of case assembly 40 taken along the 69 dashed-line area of FIG. 68.

Figure 70:
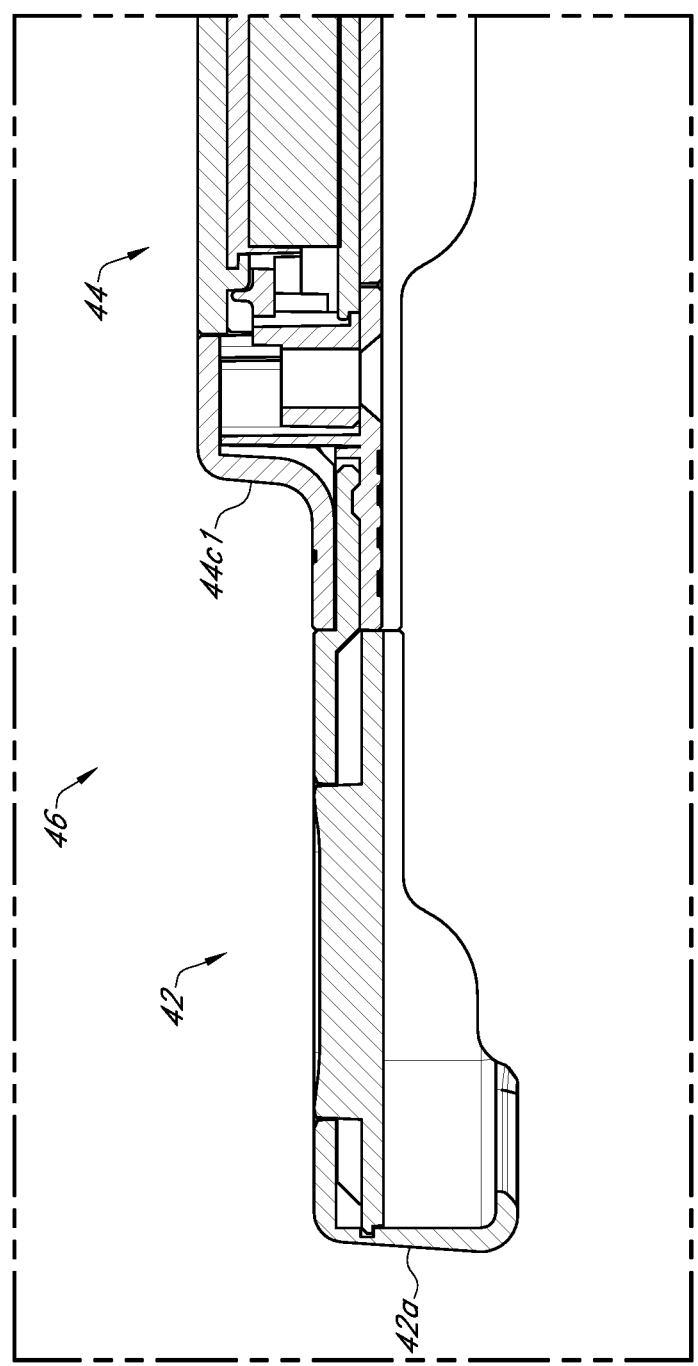
FIG. 70 is a portion of a cross-sectional-side-elevational view of the case assembly of FIG. 58.

Turning to FIG. 70, depicted therein is a portion of a cross-sectional-side-elevational view of case assembly 40.

Figure 71:
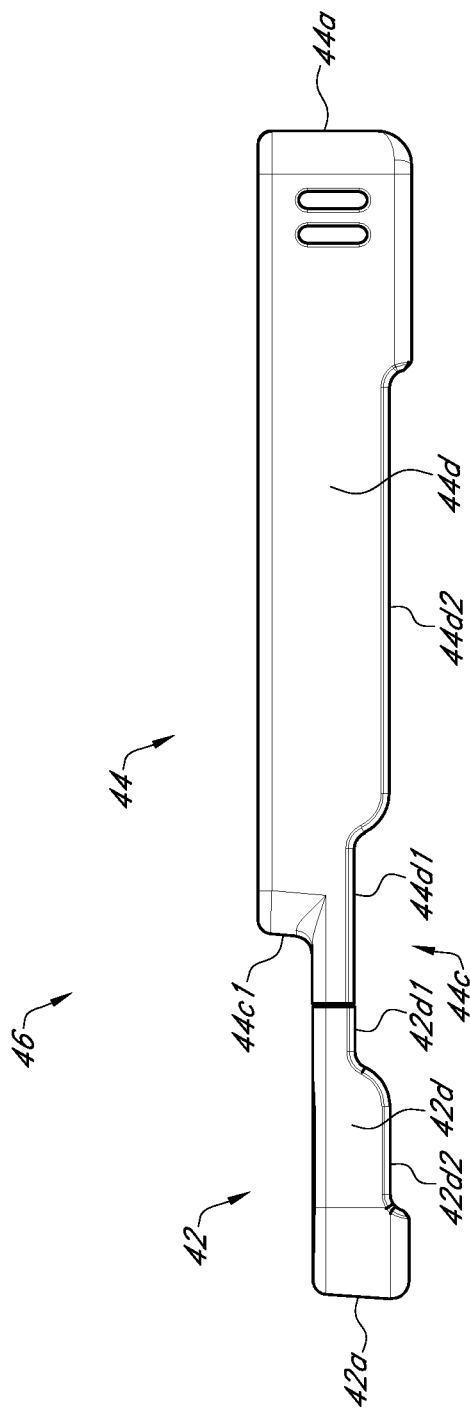
FIG. 71 is a side-elevational view of the case assembly of FIG. 58.

Turning to FIG. 71, depicted therein is a side-elevational view of case assembly 40.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A case system for a portable electronic device, the case system comprising:
   (I) a first assembly including
      (A) a first side wall,
      (B) a second side wall extending perpendicular with respect to the first side wall,
      (C) a third side wall extending perpendicular with respect to the first side wall, and
      (D) a base perpendicularly extending from the first side wall, the base perpendicularly extending a first width between the second side wall and the third side wall,
      wherein the base includes a side edge extending the first width between the second side wall and the third side wall and extending parallel with respect to the first side wall,
      wherein the side edge includes a first portion having a first end and a second end with a dimension therebetween at least one-quarter of the first width,
      wherein the side edge includes a second portion having a first end and a second end with a dimension therebetween at least one-quarter of the first width,
      wherein the side edge includes a third portion located between the first portion and the second portion, the third portion having a first end and a second end with a dimension therebetween at least one-quarter of the first width,
      wherein the first portion of the side edge includes a protrusion running along the first portion of the side edge from the first end of the first portion to the second end of the first portion,
      wherein the second portion of the side edge includes a protrusion running along the second portion of the side edge from the first end of the second portion to the second end of the second portion,
      (E) a tab member extending from the third portion of the side edge of the base,
         wherein the tab member extends from the first end of the third portion of the side edge of the base to the second end of the third portion of the side edge of the base,
         wherein the tab member includes a raised portion, wherein the raised portion of the tab member has an exterior surface, wherein the tab member includes a recessed portion located between the exterior surface of the raised portion and the third portion of the side edge of the base; and (II) a second assembly including
(A) a first side wall,
(B) a second side wall extending perpendicular with respect to the first side wall,
(C) a third side wall extending perpendicular with respect to the first side wall,
(D) a base perpendicularly extending from the first side wall, the base perpendicularly extending a first width between the second side wall and the third side wall, the base having an interior surface bounded in part by the first side wall, the second side wall, and the third side wall, the base having an exterior surface, and
(E) an aperture extending from the interior surface of the base to the exterior surface of the base, wherein the base includes a side edge extending the first width between the second side wall and the third side wall and extending parallel with respect to the first side wall, wherein the side edge of the base includes a first portion having a first end and a second end with a dimension therebetween at least one-quarter of the first width, wherein the side edge of the base includes a second portion having a first end and a second end with a dimension therebetween at least one-quarter of the first width, wherein the side edge of the base includes a third portion located between the first portion and the second portion, the third portion having a first end and a second end with a dimension therebetween at least one-quarter of the first width, wherein the first portion of the side edge includes a groove running along the first portion of the side edge from the first end of the first portion to the second end of the first portion to couple with the protrusion of the first portion of the side edge of the base of the first assembly when the second assembly is coupled with the first assembly, wherein the second portion of the side edge includes a groove running along the second portion of the side edge from the first end of the second portion to the second end of the second portion to couple with the protrusion of the second portion of the side edge of the base of the first assembly when the second assembly is coupled with the first assembly, wherein the interior surface of the base includes a first portion having a first level and a second portion having a second level with a sunken elevation with respect to the first level of the first portion, wherein the second portion of the interior surface of the base extends from the first end of the third portion of the side edge of the base to the second end of the third portion of the side edge of the base to couple with the recessed portion of the tab member of the first assembly when the second assembly is coupled with the first assembly, wherein the aperture is located between the first portion of the interior surface of the base and the second portion of the interior surface of the base to have a portion of the raised portion of the tab member extend entirely though the aperture to couple the aperture and the raised portion of the tab member of the first assembly when the second assembly is coupled with the first assembly.

2. The system of claim 1
wherein the first side wall of the second assembly has a length,
wherein the first side wall of the first assembly has a length equal to the length of the second assembly,
wherein the second side wall of the second assembly has a length, and
wherein the second side wall of the first assembly has a length smaller than the length of the second side wall of the second assembly.

3. The system of claim 1,
wherein the first assembly is a cap assembly, and
wherein the second assembly is a main assembly.

4. The system of claim 1
wherein a first portion of the raised portion of the tab member of the first assembly that is closer to the recessed portion is more raised than a second portion of the raised portion farther from the recessed portion.

5. The system of claim 1
wherein the second side wall of the first assembly includes an edge,
wherein the edge of the second side wall of the first assembly includes a protrusion extending along the edge of the second side wall,
wherein the third side wall of the first assembly includes an edge,
wherein the edge of the third side wall of the first assembly includes a protrusion extending along the edge of the third side wall,
wherein the second side wall of the second assembly includes an edge,
wherein the edge of the second side wall of the second assembly includes a groove extending along the edge of the second side wall of the second assembly to couple with the protrusion of the edge of the second side wall of the first assembly when the second assembly is coupled with the first assembly,
wherein the third side wall of the second assembly includes an edge, and
wherein the edge of the third side wall of the second assembly includes a groove extending along the edge of the third side wall of the second assembly to couple with the protrusion of the edge of the third side wall of the first assembly when the second assembly is coupled with the first assembly.

6. The system of claim 1
wherein the raised portion of the tab member includes a tapered portion, and
wherein the tab member includes at least one semi-flexible portion.

7. The system of claim 1
wherein the second side wall of the first case assembly includes at least one elongated groove extending along the second side wall to couple with at least a portion of the portable electronic device,
wherein the third side wall of the first case assembly includes at least one elongated groove extending along the third side wall to couple with at least a portion of the portable electronic device,
wherein the second side wall of the second case assembly includes at least one elongated groove extending along the second side wall to couple with at least a portion of the portable electronic device, and wherein the third side wall of the second case assembly includes at least one elongated groove extending along the third side wall to couple with at least a portion of the portable electronic device.

8. A case system for a portable electronic device, the case system comprising:
   (I) a first assembly including
      (A) a first side wall,
      (B) a second side wall extending perpendicular with respect to the first side wall,
      (C) a third side wall extending perpendicular with respect to the first side wall, and
      (D) a base perpendicularly extending from the first side wall, the base perpendicularly extending a first width between the second side wall and the third side wall,
         wherein the base includes a side edge extending the first width between the second side wall and the third side wall and extending parallel with respect to the first side wall,
         wherein the side edge includes a first portion having a first end and a second end with a dimension therebetween at least one-quarter of the first width,
         wherein the side edge includes a second portion having a first end and a second end with a dimension therebetween at least one-quarter of the first width,
         wherein the side edge includes a third portion located between the first portion and the second portion, the third portion having a first end and a second end with a dimension therebetween at least one-quarter of the first width,
      (E) a tab member extending from the third portion of the side edge of the base,
         wherein the tab member extends from the first end of the third portion of the side edge of the base to the second end of the third portion of the side edge of the base,
         wherein the tab member includes a raised portion,
         wherein the raised portion of the tab member has an exterior surface,
         wherein the tab member includes a recessed portion located between the exterior surface of the raised portion and the third portion of the side edge of the base; and
   (II) a second assembly including
      (A) a first side wall,
      (B) a second side wall extending perpendicular with respect to the first side wall,
      (C) a third side wall extending perpendicular with respect to the first side wall,
      (D) a base perpendicularly extending from the first side wall, the base perpendicularly extending a first width between the second side wall and the third side wall, the base having an interior surface bounded in part by the first side wall, the second side wall, and the third side wall, the base having an exterior surface, and
      (E) an aperture extending from the interior surface of the base to the exterior surface of the base,
         wherein the base includes a side edge extending the first width between the second side wall and the third side wall and extending parallel with respect to the first side wall,
         wherein the side edge of the base includes a first portion having a first end and a second end with a dimension therebetween at least one-quarter of the first width,
         wherein the side edge of the base includes a second portion having a first end and a second end with a dimension therebetween at least one-quarter of the first width,
         wherein the side edge of the base includes a third portion located between the first portion and the second portion, the third portion having a first end and a second end with a dimension therebetween at least one-quarter of the first width,
         wherein the interior surface of the base includes a first portion having a first level and a second portion having a second level with a sunken elevation with respect to the first level of the first portion,
         wherein the second portion of the interior surface of the base extends from the first end of the third portion of the side edge of the base to the second end of the third portion of the side edge of the base to couple with the recessed portion of the tab member of the first assembly when the second assembly is coupled with the first assembly,
         wherein the aperture is located between the first portion of the interior surface of the base and the second portion of the interior surface of the base to have a portion of the raised portion of the tab member extend entirely though the aperture to couple the aperture and the raised portion of the tab member of the first assembly when the second assembly is coupled with the first assembly.

9. The system of claim 8
   wherein the first side wall of the second assembly has a length,
   wherein the first side wall of the first assembly has a length equal to the length of the second assembly,
   wherein the second side wall of the second assembly has a length, and
   wherein the second side wall of the first assembly has a length smaller than the length of the second side wall of the second assembly.

10. The system of claim 8
    wherein the first assembly is a cap assembly, and
    wherein the second assembly is a main assembly.

11. The system of claim 8
    wherein a first portion of the raised portion of the tab member of the first assembly that is closer to the recessed portion is more raised than a second portion of the raised portion farther from the recessed portion.

12. The system of claim 8
    wherein the raised portion of the tab member includes a tapered portion, and
    wherein the tab member includes at least one semi-flexible portion.

13. The system of claim 8
    wherein the second side wall of the first case assembly includes at least one elongated groove extending along the second side wall to couple with at least a portion of the portable electronic device,
    wherein the third side wall of the first case assembly includes at least one elongated groove extending along the third side wall to couple with at least a portion of the portable electronic device,
    wherein the second side wall of the second case assembly includes at least one elongated groove extending along the second side wall to couple with at least a portion of the portable electronic device, and
    wherein the third side wall of the second case assembly includes at least one elongated groove extending along the third side wall to couple with at least a portion of the portable electronic device.

14. A case system for a portable electronic device, the case system comprising:
(I) a first assembly including
  (A) a first side wall,
  (B) a second side wall extending perpendicular with respect to the first side wall,
  (C) a third side wall extending perpendicular with respect to the first side wall, and
  (D) a base perpendicularly extending from the first side wall, the base perpendicularly extending a first width between the second side wall and the third side wall,
  wherein the base includes a side edge extending the first width between the second side wall and the third side wall and extending parallel with respect to the first side wall,
  wherein the side edge includes a first portion having a first end and a second end with a dimension therebetween at least one-quarter of the first width,
  wherein the side edge includes a second portion having a first end and a second end with a dimension therebetween at least one-quarter of the first width,
  wherein the side edge includes a third portion located between the first portion and the second portion, the third portion having a first end and a second end with a dimension therebetween at least one-quarter of the first width,
  wherein the first portion of the side edge includes a protrusion running along the first portion of the side edge from the first end of the first portion to the second end of the first portion,
  wherein the second portion of the side edge includes a protrusion running along the second portion of the side edge from the first end of the second portion to the second end of the second portion; and
(II) a second assembly including
  (A) a first side wall,
  (B) a second side wall extending perpendicular with respect to the first side wall,
  (C) a third side wall extending perpendicular with respect to the first side wall, and
  (D) a base perpendicularly extending from the first side wall, the base perpendicularly extending a first width between the second side wall and the third side wall,
  wherein the base includes a side edge extending the first width between the second side wall and the third side wall and extending parallel with respect to the first side wall,
  wherein the side edge of the base includes a first portion having a first end and a second end with a dimension therebetween at least one-quarter of the first width,
  wherein the side edge of the base includes a second portion having a first end and a second end with a dimension therebetween at least one-quarter of the first width,
  wherein the side edge of the base includes a third portion located between the first portion and the second portion, the third portion having a first end and a second end with a dimension therebetween at least one-quarter of the first width,
  wherein the first portion of the side edge includes a groove running along the first portion of the side edge from the first end of the first portion to the second end of the first portion to couple with the protrusion of the first portion of the side edge of the base of the first assembly when the second assembly is coupled with the first assembly,
  wherein the second portion of the side edge includes a groove running along the second portion of the side edge from the first end of the second portion to the second end of the second portion to couple with the protrusion of the second portion of the side edge of the base of the first assembly when the second assembly is coupled with the first assembly.

15. The system of claim 14
wherein the first side wall of the second assembly has a length,
wherein the first side wall of the first assembly has a length equal to the length of the second assembly,
wherein the second side wall of the second assembly has a length, and
wherein the second side wall of the first assembly has a length smaller than the length of the second side wall of the second assembly.

16. The system of claim 14
wherein the first assembly is a cap assembly, and
wherein the second assembly is a main assembly.

17. The system of claim 14
wherein a first portion of the raised portion of the tab member of the first assembly that is closer to the recessed portion is more raised than a second portion of the raised portion farther from the recessed portion.

18. The system of claim 14
wherein the second side wall of the first assembly includes an edge,
wherein the edge of the second side wall of the first assembly includes a protrusion extending along the edge of the second side wall,
wherein the third side wall of the first assembly includes an edge,
wherein the edge of the third side wall of the first assembly includes a protrusion extending along the edge of the third side wall,
wherein the second side wall of the second assembly includes an edge,
wherein the edge of the second side wall of the second assembly includes a groove extending along the edge of the second side wall of the second assembly to couple with the protrusion of the edge of the second side wall of the first assembly when the second assembly is coupled with the first assembly,
wherein the third side wall of the second assembly includes an edge, and
wherein the edge of the third side wall of the second assembly includes a groove extending along the edge of the third side wall of the second assembly to couple with the protrusion of the edge of the third side wall of the first assembly when the second assembly is coupled with the first assembly.

19. The system of claim 14
wherein the raised portion of the tab member includes a tapered portion, and
wherein the tab member includes at least one semi-flexible portion.

20. The system of claim 14
wherein the second side wall of the first case assembly includes at least one elongated groove extending along the second side wall to couple with at least a portion of the portable electronic device,
wherein the third side wall of the first case assembly includes at least one elongated groove extending along the third side wall to couple with at least a portion of the portable electronic device, wherein the second side wall of the second case assembly includes at least one elongated groove extending along the second side wall to couple with at least a portion of the portable electronic device, and wherein the third side wall of the second case assembly includes at least one elongated groove extending along the third side wall to couple with at least a portion of the portable electronic device.

* * * * *